United States Patent
Tischler

(10) Patent No.: US 9,472,732 B2
(45) Date of Patent: *Oct. 18, 2016

(54) LIGHT-EMITTING DIES INCORPORATING WAVELENGTH-CONVERSION MATERIALS AND RELATED METHODS

(71) Applicant: Michael A. Tischler, Vancouver (CA)

(72) Inventor: Michael A. Tischler, Vancouver (CA)

(73) Assignee: Cooledge Lighting, Inc., Richmond (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/879,503

(22) Filed: Oct. 9, 2015

(65) Prior Publication Data

US 2016/0099389 A1     Apr. 7, 2016

Related U.S. Application Data

(63) Continuation of application No. 14/495,313, filed on Sep. 24, 2014, now Pat. No. 9,190,581, which is a continuation of application No. 13/949,543, filed on Jul. 24, 2013, now Pat. No. 8,907,362, which is a continuation-in-part of application No. 13/748,864, filed on Jan. 24, 2013, now Pat. No. 8,759,125.

(60) Provisional application No. 61/589,909, filed on Jan. 24, 2012, provisional application No. 61/589,908, filed on Jan. 24, 2012.

(51) Int. Cl.
*H01L 33/00*     (2010.01)
*H01L 33/50*     (2010.01)
(Continued)

(52) U.S. Cl.
CPC ............ *H01L 33/502* (2013.01); *H01L 24/96* (2013.01); *H01L 24/97* (2013.01); *H01L 25/0753* (2013.01); *H01L 29/00* (2013.01); *H01L 31/055* (2013.01); *H01L 33/486* (2013.01); *H01L 33/505* (2013.01); *H01L 33/54* (2013.01); *H01L 33/56* (2013.01); *H01L 33/58* (2013.01); *H01L 33/60* (2013.01); *H01L 33/62* (2013.01); *H01L 25/00* (2013.01); *H01L 2224/1403* (2013.01); *H01L 2224/73204* (2013.01); *H01L 2924/07802* (2013.01); *H01L 2924/07811* (2013.01); *H01L 2924/12032* (2013.01); *H01L 2924/12041* (2013.01); *H01L 2924/12042* (2013.01);
(Continued)

(58) Field of Classification Search
USPC ...... 257/88; 438/25, 27, 28, 29, 31; 313/501
See application file for complete search history.

(56) References Cited

U.S. PATENT DOCUMENTS 4,335,501 A    6/1982    Wickenden et al.
5,631,191 A    5/1997    Durand et al.
(Continued)

FOREIGN PATENT DOCUMENTS

CN    2788361 Y    6/2006
EP    1326289 A2    7/2003
(Continued)

OTHER PUBLICATIONS

International Search Report mailed Jul. 4, 2013 for International Application No. PCT/US2013/022468 (9 pages).
(Continued)

*Primary Examiner* — Telly Green
(74) *Attorney, Agent, or Firm* — Morgan, Lewis & Bockius LLP

(57) ABSTRACT

In accordance with certain embodiments, semiconductor dies are embedded within polymeric binder to form, e.g., freestanding white light-emitting dies and/or composite wafers containing multiple light-emitting dies embedded in a single volume of binder.

43 Claims, 34 Drawing Sheets

(51) Int. Cl.
  *H01L 29/00* (2006.01)
  *H01L 23/00* (2006.01)
  *H01L 25/075* (2006.01)
  *H01L 33/48* (2010.01)
  *H01L 33/54* (2010.01)
  *H01L 33/56* (2010.01)
  *H01L 33/58* (2010.01)
  *H01L 33/62* (2010.01)
  *H01L 31/055* (2014.01)
  *H01L 33/60* (2010.01)
  *H01L 25/00* (2006.01)

(52) U.S. Cl.
  CPC .......... *H01L2924/12043* (2013.01); *H01L 2924/181* (2013.01); *H01L 2924/1815* (2013.01); *H01L 2924/18161* (2013.01); *H01L 2933/0033* (2013.01); *H01L 2933/0083* (2013.01); *Y02E 10/52* (2013.01)

(56) References Cited

U.S. PATENT DOCUMENTS

| | | | |
|---|---|---|---|
| 6,066,861 A | 5/2000 | Hohn et al. |
| 6,087,680 A | 7/2000 | Gramann et al. |
| 6,274,399 B1 | 8/2001 | Kern et al. |
| 6,498,051 B1 | 12/2002 | Watanabe |
| 6,635,987 B1 | 10/2003 | Wojnarowski et al. |
| 6,649,440 B1 | 11/2003 | Krames et al. |
| 6,733,711 B2 | 5/2004 | Durocher et al. |
| 6,751,898 B2 | 6/2004 | Heropoulos et al. |
| 6,949,772 B2 | 9/2005 | Shimizu et al. |
| 7,083,993 B2 | 8/2006 | Erchak et al. |
| 7,084,434 B2 | 8/2006 | Erchak et al. |
| 7,163,327 B2 | 1/2007 | Henson et al. |
| 7,166,870 B2 | 1/2007 | Erchak et al. |
| 7,208,769 B2 | 4/2007 | Guenther et al. |
| 7,225,538 B2 | 6/2007 | Eldridge et al. |
| 7,235,817 B2 | 6/2007 | Yano et al. |
| 7,250,611 B2 | 7/2007 | Aguirre et al. |
| 7,252,408 B2 | 8/2007 | Mazzochette et al. |
| 7,256,483 B2 | 8/2007 | Epler et al. |
| 7,322,718 B2 | 1/2008 | Setomoto et al. |
| 7,329,887 B2 | 2/2008 | Henson et al. |
| 7,344,296 B2 | 3/2008 | Matsui et al. |
| 7,344,902 B2 | 3/2008 | Basin et al. |
| 7,352,011 B2 | 4/2008 | Smits et al. |
| 7,375,381 B2 | 5/2008 | Shimizu et al. |
| 7,397,177 B2 | 7/2008 | Takahashi et al. |
| 7,400,439 B2 | 7/2008 | Holman |
| 7,456,805 B2 | 11/2008 | Ouderkirk et al. |
| 7,488,621 B2 | 2/2009 | Epler et al. |
| 7,524,206 B2 | 4/2009 | Gutierrez et al. |
| 7,658,526 B2 | 2/2010 | Henson et al. |
| 7,666,715 B2 | 2/2010 | Brunner et al. |
| 7,710,045 B2 | 5/2010 | Schultz et al. |
| 7,766,518 B2 | 8/2010 | Piepgras et al. |
| 7,798,678 B2 | 9/2010 | Destain |
| 7,868,341 B2 | 1/2011 | Diana et al. |
| 7,952,107 B2 | 5/2011 | Daniels et al. |
| 7,967,652 B2 | 6/2011 | Emerson |
| 7,972,875 B2 | 7/2011 | Rogers et al. |
| 7,994,529 B2 | 8/2011 | Bierhuizen et al. |
| 8,004,172 B2 | 8/2011 | Hussell et al. |
| 8,035,125 B2 | 10/2011 | Abe |
| 8,049,236 B2 | 11/2011 | Shi et al. |
| 8,058,088 B2 | 11/2011 | Cannon et al. |
| 8,058,659 B2 | 11/2011 | Bisberg |
| 8,064,743 B2 | 11/2011 | Meir et al. |
| 8,067,884 B2 | 11/2011 | Li |
| 8,072,134 B2 | 12/2011 | Erchak et al. |
| 8,076,680 B2 | 12/2011 | Lee et al. |
| 8,089,089 B2 | 1/2012 | Kuo et al. |
| 8,100,552 B2 | 1/2012 | Spero |
| 8,115,217 B2 | 2/2012 | Duong et al. |
| 8,128,272 B2 | 3/2012 | Fine et al. |
| 8,247,248 B2 | 8/2012 | Ling |
| 8,384,121 B2 | 2/2013 | Tischler et al. |
| 8,466,488 B2 | 6/2013 | Tischler et al. |
| 8,759,125 B2 * | 6/2014 | Tischler .......... H01L 33/50 257/89 |
| 9,190,581 B2 * | 11/2015 | Tischler .......... H01L 29/00 |
| 2004/0070014 A1 | 4/2004 | Lin et al. |
| 2004/0105264 A1 | 6/2004 | Spero |
| 2005/0022697 A1 | 2/2005 | Benrashid et al. |
| 2005/0051782 A1 | 3/2005 | Negley et al. |
| 2005/0265404 A1 | 12/2005 | Ashdown |
| 2005/0269582 A1 | 12/2005 | Mueller et al. |
| 2006/0124955 A1 | 6/2006 | Sakakibara |
| 2006/0186425 A1 | 8/2006 | Yano et al. |
| 2006/0202359 A1 | 9/2006 | Chen |
| 2007/0013057 A1 | 1/2007 | Mazzochette |
| 2007/0023769 A1 | 2/2007 | Nishimoto et al. |
| 2007/0164293 A1 | 7/2007 | Hamano et al. |
| 2007/0272932 A1 | 11/2007 | Janet et al. |
| 2008/0023687 A1 | 1/2008 | Choi et al. |
| 2008/0121911 A1 | 5/2008 | Andrews et al. |
| 2008/0137106 A1 | 6/2008 | Ono |
| 2008/0144333 A1 | 6/2008 | Gourlay |
| 2008/0179611 A1 | 7/2008 | Chitnis et al. |
| 2008/0217601 A1 | 9/2008 | Erchak et al. |
| 2008/0225549 A1 | 9/2008 | Dassanayake et al. |
| 2009/0085464 A1 | 4/2009 | Oguma et al. |
| 2009/0095963 A1 | 4/2009 | Daniels |
| 2009/0121250 A1 | 5/2009 | DenBaars et al. |
| 2009/0129115 A1 | 5/2009 | Fine et al. |
| 2009/0140272 A1 | 6/2009 | Beeson et al. |
| 2009/0160043 A1 | 6/2009 | Shen et al. |
| 2009/0179213 A1 | 7/2009 | Cannon et al. |
| 2009/0194776 A1 | 8/2009 | Pachler |
| 2009/0242921 A1 | 10/2009 | Aliyev |
| 2010/0025700 A1 | 2/2010 | Jung et al. |
| 2010/0032697 A1 | 2/2010 | Nagai |
| 2010/0096977 A1 | 4/2010 | Lee et al. |
| 2010/0109023 A1 | 5/2010 | Yonehara |
| 2010/0109025 A1 | 5/2010 | Bhat |
| 2010/0117099 A1 | 5/2010 | Leung |
| 2010/0127290 A1 | 5/2010 | Joo et al. |
| 2010/0140655 A1 | 6/2010 | Shi |
| 2010/0155763 A1 | 6/2010 | Donofrio et al. |
| 2010/0171215 A1 | 7/2010 | Fischer et al. |
| 2010/0186883 A1 | 7/2010 | Tomoda |
| 2010/0213485 A1 | 8/2010 | McKenzie et al. |
| 2010/0225010 A1 | 9/2010 | Katayama |
| 2010/0271819 A1 | 10/2010 | Kristoffersen et al. |
| 2010/0283062 A1 | 11/2010 | Hsieh et al. |
| 2010/0308354 A1 | 12/2010 | David et al. |
| 2010/0315817 A1 | 12/2010 | Zimmermann |
| 2010/0315833 A1 | 12/2010 | Holman et al. |
| 2010/0317132 A1 | 12/2010 | Rogers et al. |
| 2010/0320904 A1 | 12/2010 | Meir |
| 2011/0006316 A1 | 1/2011 | Ing et al. |
| 2011/0018014 A1 | 1/2011 | Aanegola et al. |
| 2011/0039358 A1 | 2/2011 | Ling |
| 2011/0085112 A1 | 4/2011 | Inditsky |
| 2011/0090696 A1 | 4/2011 | Nagai et al. |
| 2011/0108874 A1 | 5/2011 | Chu et al. |
| 2011/0136271 A1 | 6/2011 | von Malm |
| 2011/0163681 A1 | 7/2011 | Dau et al. |
| 2011/0170289 A1 | 7/2011 | Allen et al. |
| 2011/0186900 A1 | 8/2011 | Watari et al. |
| 2011/0195532 A1 | 8/2011 | Lerman et al. |
| 2011/0198632 A1 | 8/2011 | Lerman et al. |
| 2011/0204790 A1 | 8/2011 | Arik et al. |
| 2011/0215701 A1 | 9/2011 | Tong et al. |
| 2011/0220920 A1 | 9/2011 | Collins et al. |
| 2011/0254042 A1 | 10/2011 | Shaikevitch |
| 2011/0256647 A1 | 10/2011 | Shaikevitch |
| 2011/0284822 A1 | 11/2011 | Jung et al. |
| 2011/0315956 A1 | 12/2011 | Tischler et al. |
| 2012/0002420 A1 | 1/2012 | Imai et al. |
| 2012/0038047 A1 | 2/2012 | Do et al. |

(56) References Cited

U.S. PATENT DOCUMENTS

| | | |
|---|---|---|
| 2013/0043782 A1 | 2/2013 | Meir et al. |
| 2013/0187174 A1 | 7/2013 | Tischler |
| 2013/0187178 A1 | 7/2013 | Tischler |

FOREIGN PATENT DOCUMENTS

| | | | |
|---|---|---|---|
| EP | 1418628 | A1 | 5/2004 |
| EP | 1693904 | A2 | 8/2006 |
| EP | 1770788 | | 4/2007 |
| EP | 2117054 | A2 | 11/2009 |
| EP | 2369642 | A1 | 9/2011 |
| EP | 2393127 | A1 | 12/2011 |
| EP | 2410357 | A2 | 1/2012 |
| EP | 2423717 | A2 | 2/2012 |
| GB | 2447091 | A | 9/2008 |
| IL | 34547 | A | 5/1983 |
| JP | 02292064 | A | 12/1990 |
| JP | 4028269 | A | 1/1992 |
| JP | 08167687 | A | 6/1996 |
| JP | 09219412 | A | 8/1997 |
| JP | 10154784 | A | 6/1998 |
| JP | 2000323756 | A | 11/2000 |
| JP | 2003277479 | A | 10/2003 |
| JP | 2009051107 | A | 3/2009 |
| KR | 20100091384 | A | 8/2010 |
| KR | 20110127318 | A | 11/2011 |
| WO | WO-03017353 | A2 | 2/2003 |
| WO | WO-2004093131 | A2 | 10/2004 |
| WO | WO-2005029599 | A2 | 3/2005 |
| WO | WO-2006127785 | A2 | 11/2006 |
| WO | WO-2007062169 | A2 | 5/2007 |
| WO | WO-2007143365 | A2 | 12/2007 |
| WO | WO-2007149362 | A2 | 12/2007 |
| WO | WO-2008051596 | A2 | 5/2008 |
| WO | WO-2008100991 | A1 | 8/2008 |
| WO | WO-2009060227 | A2 | 5/2009 |
| WO | WO-2009081090 | A1 | 7/2009 |
| WO | WO-2010030430 | A1 | 3/2010 |
| WO | WO-2010045915 | A1 | 4/2010 |
| WO | WO-2011141779 | A1 | 11/2011 |
| WO | WO-2011153298 | A1 | 12/2011 |
| WO | WO-2011163556 | A2 | 12/2011 |
| WO | WO-2012000114 | A1 | 1/2012 |
| WO | WO-2013005940 | A2 | 1/2013 |

OTHER PUBLICATIONS

International Search Report mailed Sep. 24, 2013 for International Application No. PCT/US2013/022899 (8 pages).
International Search Report mailed Jul. 11, 2013 for International Application No. PCT/US2013/037110 (5 pages).

* cited by examiner

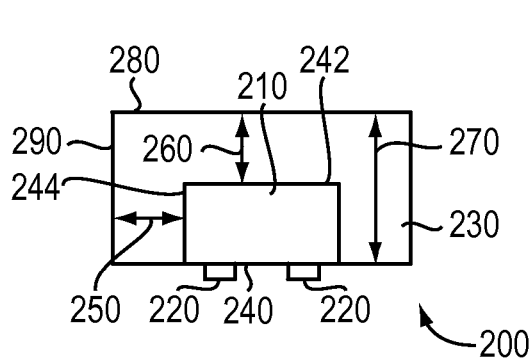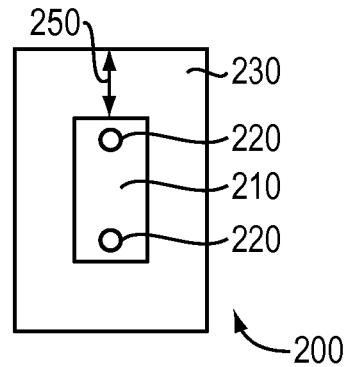
FIG. 2A  FIG. 2B
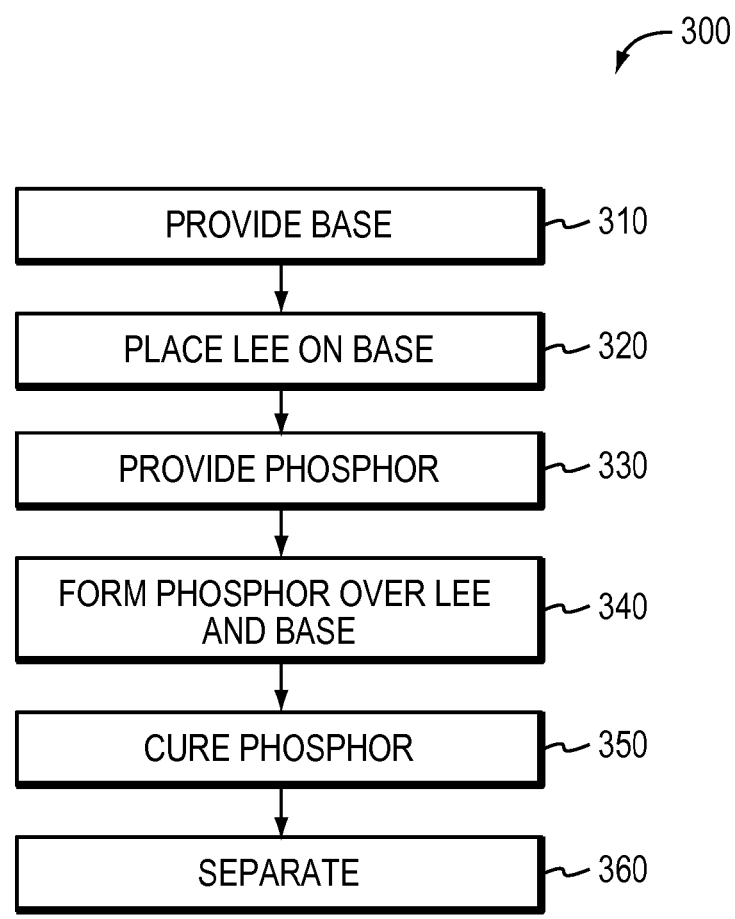
FIG. 3

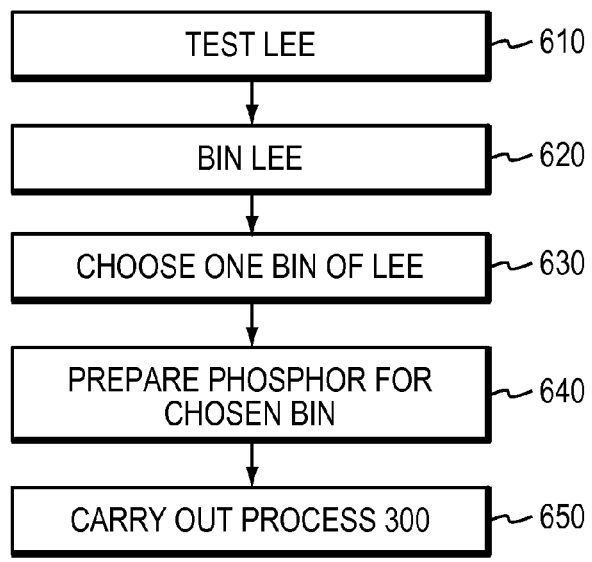
FIG. 6
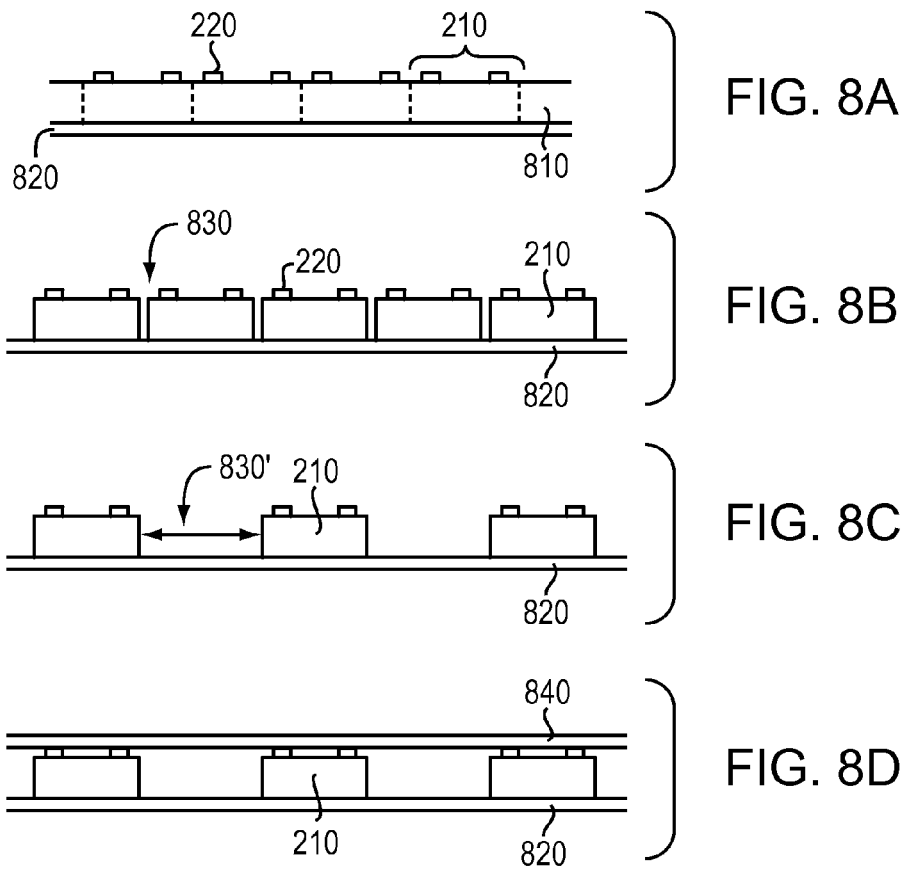
FIG. 8A
FIG. 8B
FIG. 8C
FIG. 8D

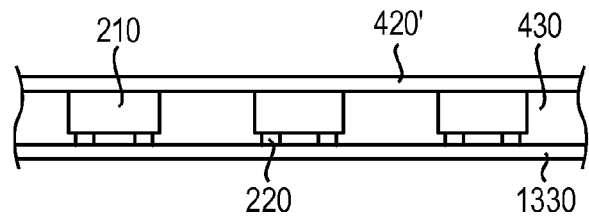
FIG. 13G
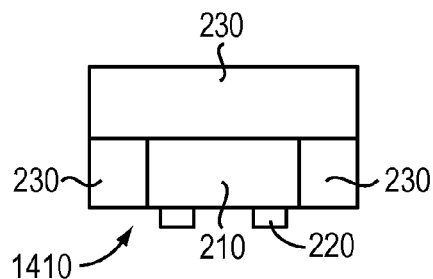 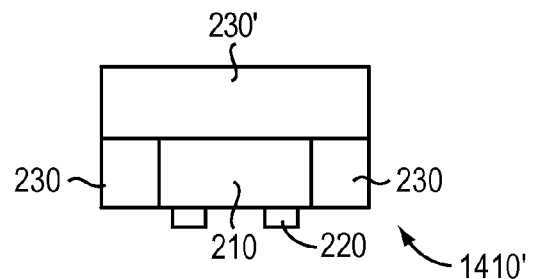
FIG. 14A  FIG. 14B
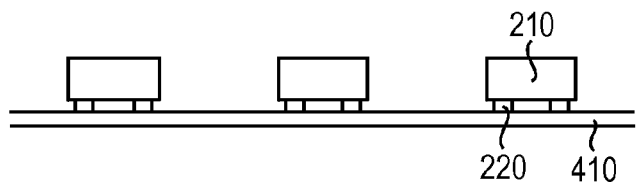
FIG. 15A
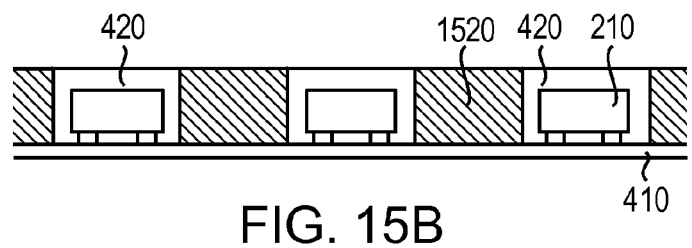
FIG. 15B
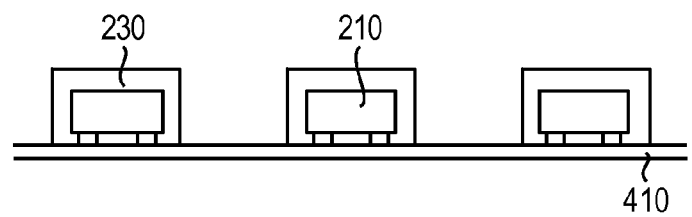
FIG. 15C

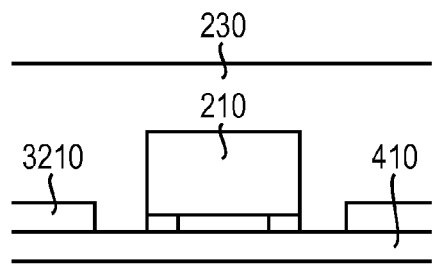
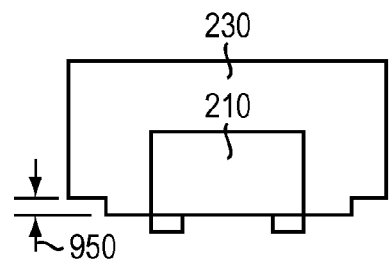
FIG. 33C  FIG. 33D
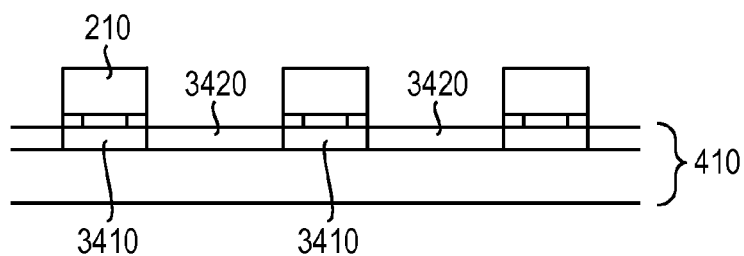
FIG. 34
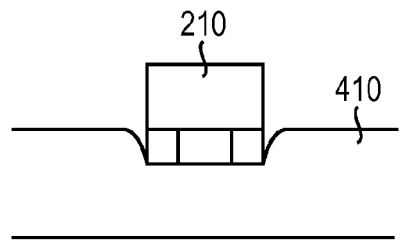
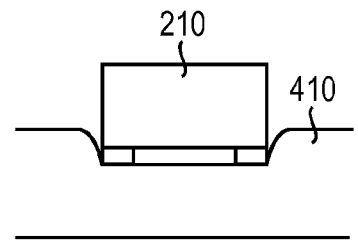
FIG. 35A  FIG. 35B
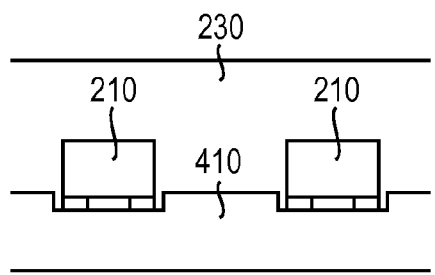
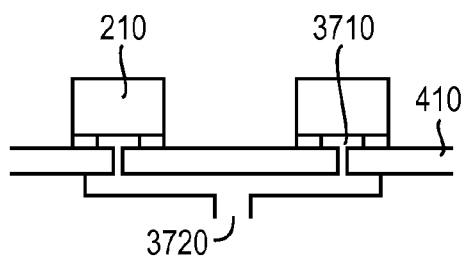
FIG. 36  FIG. 37

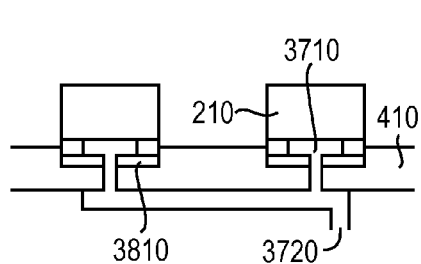
FIG. 38
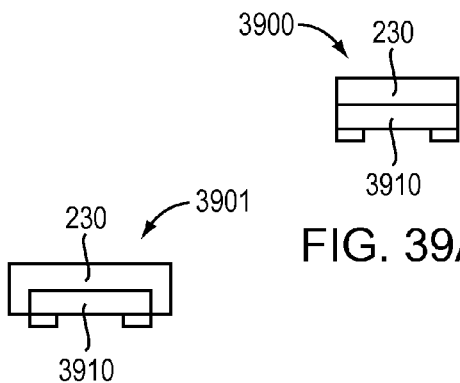
FIG. 39A
FIG. 39B
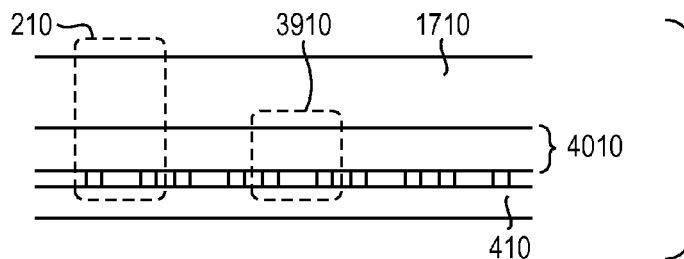
FIG. 40A
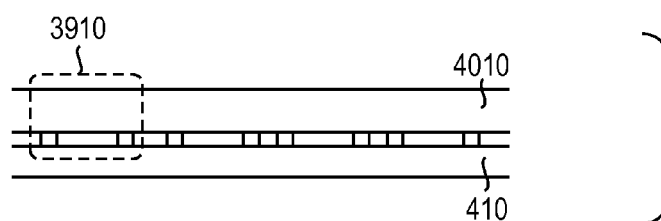
FIG. 40B
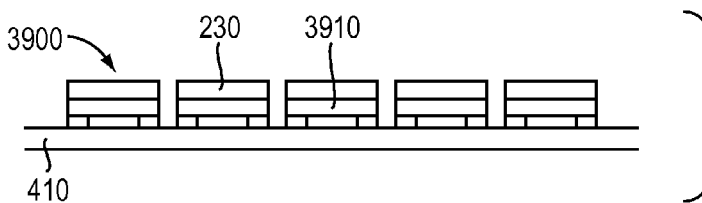
FIG. 40C
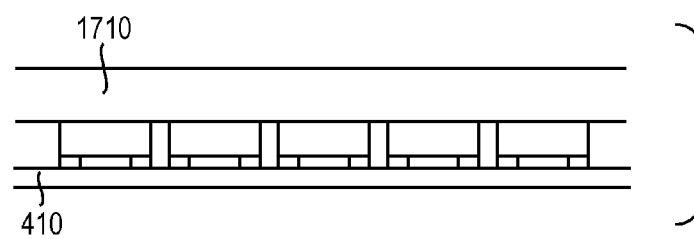
FIG. 40D

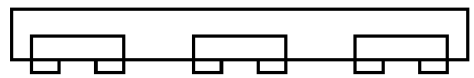
FIG. 40E
FIG. 40F
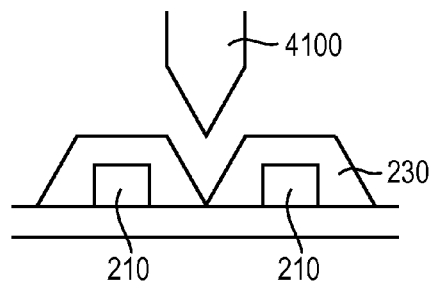
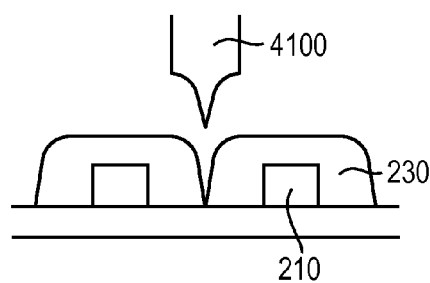
FIG. 41A
FIG. 41B
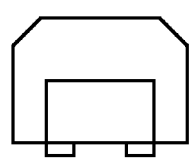 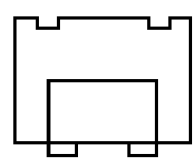 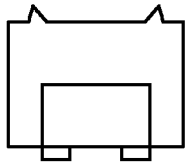 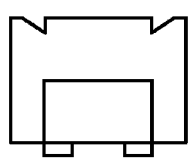
FIG. 42A   FIG. 42B   FIG. 42C   FIG. 42D
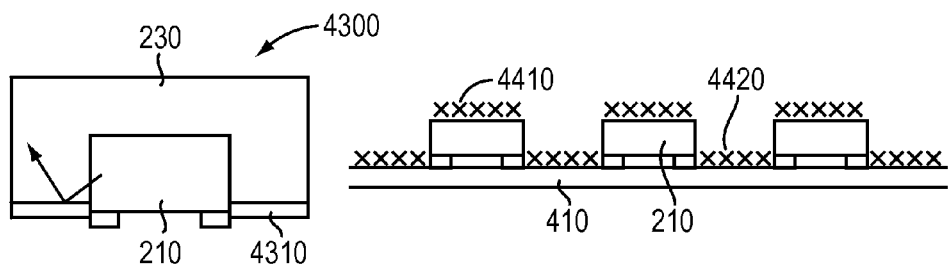
FIG. 43A
FIG. 44A
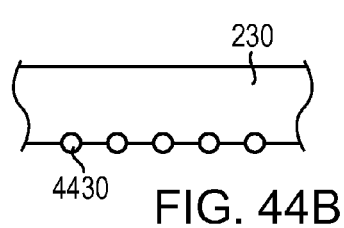
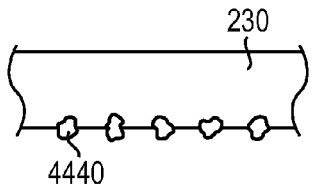
FIG. 44B
FIG. 44C

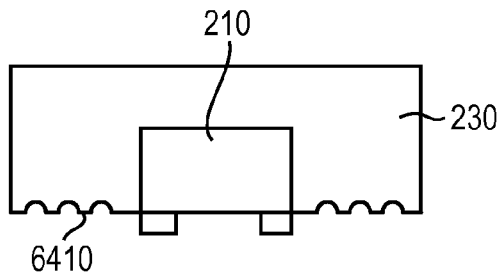
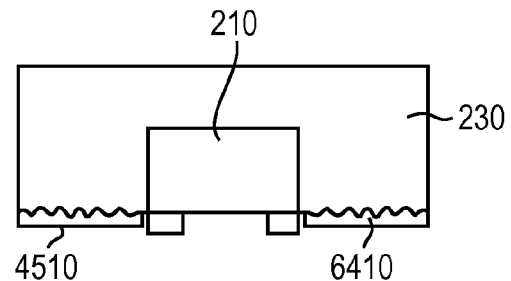
FIG. 64A          FIG. 64B
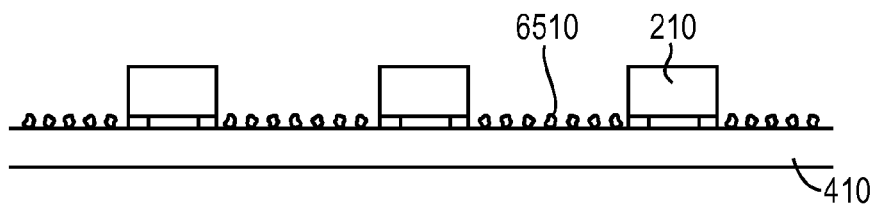
FIG. 65A
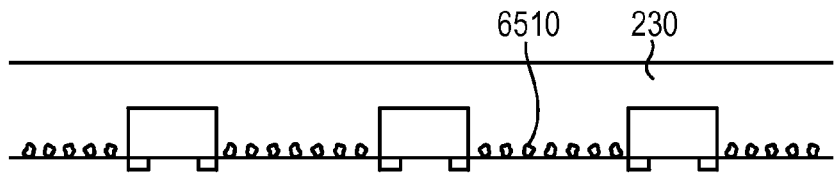
FIG. 65B
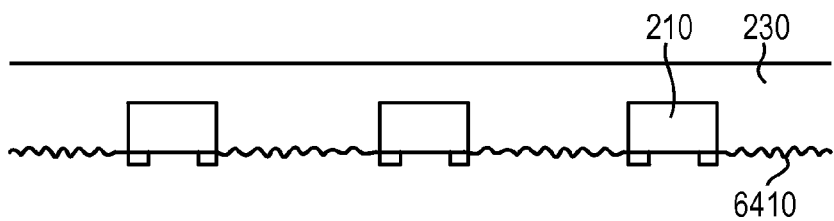
FIG. 65C
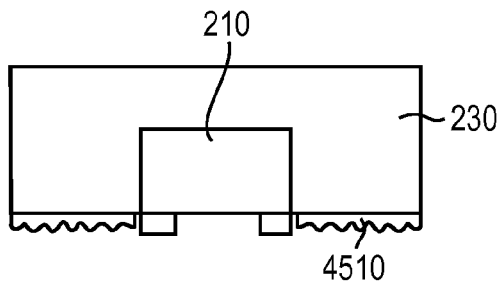
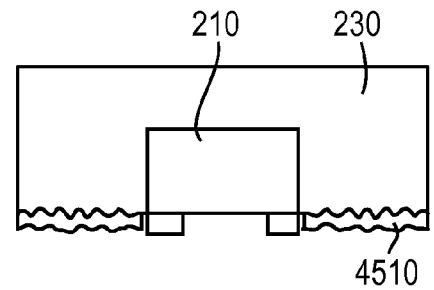
FIG. 64C          FIG. 64D

LIGHT-EMITTING DIES INCORPORATING WAVELENGTH-CONVERSION MATERIALS AND RELATED METHODS

RELATED APPLICATIONS

This application is a continuation of U.S. patent application Ser. No. 14/495,313, filed Sep. 24,2014, which is a continuation of U.S. patent application Ser. No. 13/949,543, filed Jul. 24, 2013, which is a continuation-in-part of U.S. patent application Ser. No. 13/748,864, filed Jan. 24, 2013, which claims the benefit of and priority to U.S. Provisional Patent Application No. 61/589,908, filed Jan. 24, 2012, and U.S. Provisional Patent Application No. 61/589,909, filed Jan. 24, 2012, the entire disclosure of each of which is hereby incorporated herein by reference.

FIELD OF THE INVENTION

In various embodiments, the present invention generally relates to light sources, and more specifically to phosphor-converted light sources.

BACKGROUND

Light sources such as light-emitting diodes (LEDs) are an attractive alternative to incandescent and fluorescent light bulbs in illumination devices due to their higher efficiency, smaller form factor, longer lifetime, and enhanced mechanical robustness. However, the high cost of LED-based lighting systems has limited their widespread utilization, particularly in broad-area general lighting applications.

The high cost of LED-based lighting systems has several contributors. LEDs are typically encased in a package, and multiple packaged LEDs are used in each lighting system to achieve the desired light intensity. For general illumination, which utilizes white light, such white light may be generated in a number of ways. One approach is to utilize two or more LEDs operating at different wavelengths, where the different wavelengths combine to appear white to the human eye. For example, LEDs emitting in the red, green and blue wavelength ranges may be utilized together. Such an arrangement typically requires careful control of the operating currents of each LED, such that the resulting combination of wavelengths is stable over time and different operating conditions, for example temperature. The different LEDs may also be formed of different materials, for example, AlInGaP for red LEDs and AlInGaN for blue and green LEDs. These different materials may have different operating current requirements as well as different temperature dependencies of the light output power and wavelength. Furthermore, changes in light-output power with time may be different for each type of LED. Therefore, such systems typically utilize some form of active control of the current in each LED to maintain the light output power of each LED at the desired level. In some implementations one or more sensors (for example to sense light intensity, light color, temperature or the like) may be used to provide feedback to the current-control system, while in some other implementations the current may be adjusted over time based on values in a look-up table. Such control systems add cost and complexity to lighting solutions, as well as creating additional failure points. A further disadvantage of multi-LED arrangements is that they typically require some form of light combiner, diffuser or mixing chamber, so that the eye observes white light rather than the discrete different colors of each of the different LEDs. Such light-mixing systems typically add cost and bulk to lighting systems as well as reducing their efficiency.

White light may also be produced in LED-based arrangements for general illumination by means of light-conversion materials such as phosphors. LEDs generally emit in a relatively narrow wavelength range, for example on the order of about 20-100 nm. When broader spectra (for example "white" light) or colors different from that of the LED are desired, the LED may be combined with one or more light-conversion materials. A LED combined with one or more phosphors typically generates white light by combining the short-wavelength emission from the semiconductor LED with long-wavelength emission from the phosphor(s). This occurs because a portion of the LED light passes unconverted through the phosphor to combine with the phosphor-converted light. Phosphors are typically composed of phosphorescent particles such as $Y_3Al_5O_{12}:Ce^{3+}$ (cerium-activated yttrium-aluminum-garnet, or YAG:Ce) embedded in a transparent binder such as optical epoxy or silicone and applied as a layer. However, phosphor integration is often difficult, particularly in terms of uniformity and reproducibility of the resulting light.

In some phosphor implementations, the phosphor layer absorbs a portion of the incident short-wavelength radiant flux and re-emits long-wavelength radiant flux. In an exemplary YAG:Ce phosphor, as depicted by the graph in FIG. 1, a blue LED typically has a peak wavelength of 450 nm-460 nm, corresponding to the peak of the phosphor-excitation spectrum, while the phosphor emission has a broadband spectrum with a peak at approximately 560 nm. Combining the blue LED emission with the yellow phosphor emission yields visible white light with a specific chromaticity (color) that depends on the ratio of blue to yellow light. Herein, "white light" may be white or any other color that is produced by a combination of light from one or more light emitters and one or more light-conversion materials.

The geometry of the phosphor relative to the LED generally has a very strong impact on the uniformity of the light characteristics. For example, the LED may emit from more than one surface, for example from the top and the sides of the LED, producing non-uniform color if the phosphor composition is not uniform over these LED surfaces. More complicated structures may be used to attempt to mitigate this problem, but these add cost and complexity and may be additional sources for reliability problems.

Furthermore, if the thickness of the phosphor layer, formed of a uniformly dispersed phosphor in a binder, is not uniform over the surface of the LED, relatively larger amounts of blue light will be present where the phosphor-infused binder layer is thinner and relatively smaller amounts of blue light will be present where the phosphor-infused binder is thicker. In view of the foregoing, a need exists for structures, systems and procedures enabling the uniform and low cost integration of phosphors with LEDs.

SUMMARY

In accordance with certain embodiments, semiconductor dies such as light-emitting elements (LEEs) are coated with a polymeric binder, which is subsequently cured to form a composite wafer of the solid binder material and the dies suspended therein. The composite wafer may be divided into free-standing "white dies" each composed of the die and a portion of the cured binder that at least partially surrounds the die. The binder may advantageously contain a wavelength-conversion material such as a phosphor or a collection of quantum dots. Various mold substrates and/or molds may be utilized to secure the semiconductor dies and/or to prevent coating of the contacts of the dies during the coating process.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of LEEs include solid-state, organic, polymer, phosphor-coated or high-flux LEDs, microLEDs (described below), laser diodes or other similar devices as would be readily understood. The emitted radiation of a LEE may be visible, such as red, blue or green, or invisible, such as infrared or ultraviolet. A LEE may produce radiation of a spread of wavelengths. A LEE may feature a phosphorescent or fluorescent material for converting a portion of its emissions from one set of wavelengths to another. A LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

A LEE may be of any size. In some embodiments, a LEEs has one lateral dimension less than 500 µm, while in other embodiments a LEE has one lateral dimension greater than 500 um. Exemplary sizes of a relatively small LEE may include about 175 µm by about 250 µm, about 250 µm by about 400 µm, about 250 µm by about 300 µm, or about 225 µm by about 175 µm. Exemplary sizes of a relatively large LEE may include about 1000 µm by about 1000 µm, about 500 µm by about 500 µm, about 250 µm by about 600 µm, or about 1500 µm by about 1500 µm. In some embodiments, a LEE includes or consists essentially of a small LED die, also referred to as a "microLED." A microLED generally has one lateral dimension less than about 300 µm. In some embodiments, the LEE has one lateral dimension less than about 200 µm or even less than about 100 µm. For example, a microLED may have a size of about 225 µm by about 175 µm or about 150 µm by about 100 µm or about 150 µm by about 50 µm. In some embodiments, the surface area of the top surface of a microLED is less than 50,000 µm$^2$ or less than 10,000 µm$^2$. The size of the LEE is not a limitation of the present invention, and in other embodiments the LEE may be relatively larger, e.g., the LEE may have one lateral dimension on the order of at least about 1000 µm or at least about 3000 µm.

As used herein, "phosphor" refers to any material that shifts the wavelengths of light irradiating it and/or that is fluorescent and/or phosphorescent. As used herein, a "phosphor" may refer to only the powder or particles (of one or more different types) or to the powder or particles with the binder, and in some circumstances may refer to region(s) containing only the binder (for example, in a remote-phosphor configuration in which the phosphor is spaced away from the LEE). The terms "wavelength-conversion material" and "light-conversion material" are utilized interchangeably with "phosphor" herein. The light-conversion material is incorporated to shift one or more wavelengths of at least a portion of the light emitted by LEEs to other (i.e., different) desired wavelengths (which are then emitted from the larger device alone or color-mixed with another portion of the original light emitted by the LEE). A light-conversion material may include or consist essentially of phosphor powders, quantum dots or the like within a transparent binder. Phosphors are typically available in the form of powders or particles, and in such case may be mixed in binders. An exemplary binder is silicone, i.e., polyorganosiloxane, which is most commonly polydimethylsiloxane (PDMS). Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. The specific components and/or formulation of the phosphor and/or matrix material are not limitations of the present invention.

The binder may also be referred to as an encapsulant or a matrix material. In one embodiment, the binder includes or consists essentially of a transparent material, for example silicone-based materials or epoxy, having an index of refraction greater than 1.35. In one embodiment the binder and/or phosphor includes or consists essentially of other materials, for example fumed silica or alumina, to achieve other properties, for example to scatter light, or to reduce settling of the powder in the binder. An example of the binder material includes materials from the ASP series of silicone phenyls manufactured by Shin Etsu, or the Sylgard series manufactured by Dow Corning.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other.

In an aspect, embodiments of the invention feature a method of forming a composite wafer comprising a plurality of discrete semiconductor dies suspended in a cured binder. The plurality of discrete semiconductor dies is disposed on a mold substrate, and each semiconductor die has at least two spaced-apart contacts adjacent the mold substrate. The semiconductor dies are coated with a binder, and the binder is cured to form the composite wafer. The contacts of each semiconductor die remain at least partially uncoated by the binder.

Embodiments of the invention may include one or more of the following in any of a variety of combinations. The composite wafer may be separated into a plurality of discrete portions each including or consisting essentially of at least one semiconductor die coated with cured binder. After separation the volume of binder surrounding each semiconductor die may be substantially equal. After separation the thickness of binder adjacent each semiconductor die may be in the range of about 10 µm to about 5000 µm. Separating the composite wafer may include or consist essentially of laser cutting, knife cutting, rotary knife cutting, shearing, waterjet cutting, abrasive waterjet cutting, die cutting, and/or sawing. Each discrete portion of the composite wafer may contain only one semiconductor die. Each discrete portion of the composite wafer may be a rectangular solid having approximately 90° corners between adjacent faces thereof. After formation of the composite wafer, at least some of the semiconductor dies may be electrically tested, and the separated portions may be binned based on the electrical testing. The contacts of the at least one semiconductor die in one of the discrete portions may be electrically coupled to spaced-apart conductive traces on a substrate. For example, the contacts may be adhered to the conductive traces with a conductive adhesive, wire bonding, and/or soldering. The conductive adhesive may include or consist essentially of a substantially isotropic conductive adhesive electrically connecting a first contact only to a first trace and a second contact only to a second trace, and a non-conductive adhesive material may be provided in a gap between the conductive traces. The conductive adhesive may include or consist essentially of an anisotropic conductive adhesive (ACA) electrically connecting a first contact only to a first trace and a second contact only to a second trace. A portion of the ACA may be disposed in a gap between the first and second contacts and may substantially isolate the first contact from the second contact. The conductive traces may include or consist essentially of silver, gold, aluminum, chromium, copper, and/or carbon. The substrate may include or consist essentially of polyethylene naphthalate, polyethylene terephthalate, polycarbonate, polyethersulfone, polyester, polyimide, polyethylene, and/or paper. The at least one semiconductor die may include or consist essentially of a light-emitting element. The reflectivity or the transmissivity of the substrate for a wavelength emitted by the light-emitting element and/or the cured phosphor may be greater than 80%. The at least one semiconductor die may be electrically connected to circuitry for powering the at least one semiconductor die. After separating the composite wafer, additional material may be removed from each of the discrete portions, whereby each portion has a desired shape thereafter. The desired shapes may all be substantially the same.

The composite wafer may be separated from the mold substrate. A second substrate may be disposed in contact with the plurality of semiconductor dies coated with binder, and the mold substrate may be removed from the plurality of semiconductor dies coated with binder, the plurality of semiconductor dies coated with binder remaining attached to the second substrate. The composite wafer may be separated from the second substrate. Before curing the binder, the contacts of the plurality of semiconductor dies may be at least partially embedded within the mold substrate, e.g., by at least 2 µm. After curing the binder, at least a portion of each of the contacts of the plurality of semiconductor dies may protrude from the cured binder. After curing the binder, at least a portion of each semiconductor die proximate the contacts thereof may protrude from the cured binder. After curing the binder, at least one contact of at least one semiconductor die may not protrude from the cured binder. The contacts of each semiconductor die remain substantially entirely uncoated by binder. The binder may include or consist essentially of silicone and/or epoxy.

Coating the plurality of semiconductor dies with the binder may include or consist essentially of dispensing the binder into a mold and disposing the mold substrate over the mold, whereby the plurality of semiconductor dies are suspended within the binder. Curing the binder may include or consist essentially of at least partially curing the binder and, thereafter, removing the mold substrate from the mold. The surface of the mold opposite the mold substrate may have a texture (e.g., one configured to enhance light extraction from the cured binder), and at least a portion of the cured binder have the texture after the mold substrate is removed from the mold. A texture for enhancing light extraction from the cured binder may be applied to at least a portion of a surface of the binder opposite the mold substrate after removing the mold substrate from the mold. The mold may include or consist essentially of a plurality of discrete compartments in which the binder is disposed, and one or more semiconductor dies may be suspended within or above each compartment prior to curing the binder. Each compartment may impart a complementary shape to a portion of the binder, the complementary shapes being substantially identical to each other. The mold substrate may define one or more openings therethrough. At least a portion of the binder may be dispensed into the mold through at least one said opening. A portion of the binder may flow through at least one said opening when the mold substrate is disposed over the mold.

Coating the plurality of semiconductor dies with the binder may include or consist essentially of dispensing the binder over the mold substrate, the binder being contained over the mold substrate by one or more barriers extending above a surface of the mold substrate. A texture for enhancing light extraction from the cured binder may be applied to at least a portion of a surface of the binder opposite the mold substrate, whereby the cured binder retains the texture. Curing the binder may include or consist essentially of at least partially curing the binder and, thereafter, removing the mold substrate from the plurality of semiconductor dies. A mold cover may be disposed over and in contact with at least a portion of the binder. The mold cover may include or consist essentially of a plurality of discrete compartments, and one or more semiconductor dies may be suspended within or beneath each compartment prior to curing the binder. Each compartment may impart a complementary shape to a portion of the binder, the complementary shapes being substantially identical to each other. The binder may contain a wavelength-conversion material, e.g., a phosphor and/or quantum dots. Each semiconductor die may include or consist essentially of a light-emitting semiconductor die (e.g., a bare-die light-emitting diode). The binder may be transparent to a wavelength of light emitted by the light-emitting semiconductor dies. The light-emitting semiconductor dies may each include or consist essentially of a semiconductor material including or consisting essentially of GaAs, AlAs, InAs, GaP, AlP, InP, ZnO, CdSe, CdTe, ZnTe, GaN, AlN, InN, silicon, and/or an alloy or mixture thereof. The binder may contain a wavelength-conversion material for absorption of at least a portion of light emitted from the light-emitting semiconductor dies and emission of converted light having a different wavelength, converted light and unconverted light emitted by the light-emitting semiconductor dies combining to form substantially white light. The substantially white light may have a correlated color temperature in the range of 2000 K to 10,000 K. The substantially white light may have a color temperature variation less than four, or even less than two, MacAdam ellipses across the composite wafer.

The composite wafer may have a first surface and a second surface opposite the first surface, and the first and second surface may be substantially flat and parallel. The composite wafer may have a substantially uniform thickness with a thickness variation less than 15%, less than 10%, or even less than 5%. The composite wafer may have a substantially uniform thickness between 5 µm and 4000 µm. A dimension of the composite wafer perpendicular to the thickness may be between 5 mm and 1000 mm. The spacing between neighboring semiconductor dies may be substantially constant across the composite wafer. The spacing may be in the range of about 25 µm to about 10,000 µm. The thickness of the binder above each of the semiconductor dies may be substantially the same. The thickness of the binder above each of the semiconductor dies may be in the range of about 25 µm to about 4000 µm. The thickness of the binder above each of the semiconductor dies may be the same to within 5%. The plurality of semiconductor dies may include or consist essentially of at least 100, at least 1000, or even at least 4000 semiconductor dies. The semiconductor dies may be arranged in an array having substantially equal distances between semiconductor dies in at least a first direction. The array may have substantially equal distances between semiconductor dies in at least a second direction different from the first direction. The semiconductor dies may be arranged in a regular periodic array. a release material (e.g., a mold-release film) may be disposed over at least a portion of the binder. The mold release film may be textured with a texture for enhancing light extraction from the cured binder. The mold substrate may include or consist essentially of glass, metal, silicone, fiberglass, ceramic, water-soluble tape, thermal-release tape, UV-release tape, polyethylene terephthalate, polyethylene naphthalate, plastic film, tape, adhesive, acrylic, polycarbonate, a polymer, and/or polytetrafluoroethylene. Curing the binder may include or consist essentially of exposure to heat, air, moisture, superatmospheric pressure, and/or ultraviolet radiation. Disposing the plurality of discrete semiconductor dies on the mold substrate may include or consist essentially of application of (i) an adhesive force, (ii) a magnetic force, and/or (iii) vacuum. Prior to disposing the plurality of discrete semiconductor dies on the mold substrate, a group of semiconductor dies may be tested to identify semiconductor dies having substantially equal characteristics, and the plurality of semiconductor dies may be selected from the identified semiconductor dies.

Prior to coating the plurality of semiconductor dies with the binder, a stencil defining openings corresponding to positions of the semiconductor dies may be disposed over the mold substrate. The stencil may have a thickness in the range of about 0.5 µm to about 25 µm. The stencil may include or consist essentially of a flexible foil and/or a thin plate. The plurality of semiconductor dies may be disposed within indentations in the mold substrate. The indentations may have a depth in the range of about 0.5 µm to about 25 µm. The mold substrate may include or consist essentially of a vacuum chuck and/or an electrostatic chuck, and the positions of the semiconductor dies may be maintained at least in part by vacuum or electrostatic force. After the composite wafer is formed, the vacuum or electrostatic force may be removed, and, thereafter, the composite wafer may be removed from the mold substrate. Coating the plurality of semiconductor dies with the binder may include or consist essentially of controlling the amount of binder dispensed over the semiconductor dies in response to a feedback signal. The composite wafer may be removed from the mold substrate by exposure to heat and/or ultraviolet radiation. The binder may contain fumed silica, fumed alumina, and/or $TiO_2$. The binder may contain at least one additive for controlling particle settling and/or controlling binder viscosity. The binder may comprise a plurality of discrete regions, at least one of which includes or consists essentially of the binder and at least one wavelength-conversion material. At least one of the regions may consist essentially of only the binder. At least one semiconductor die may include or consist essentially of one or more active layers over a substrate, and the substrate may be partially or completely removed before coating with the binder. The substrate of the at least one semiconductor die may be partially or completely removed after disposing the at least one semiconductor die on the mold substrate. Each of the semiconductor dies may include or consist essentially of a light-detecting semiconductor die (e.g., a die in which charge is formed in response to incipient light such as a photovoltaic die). The binder may be transparent to a wavelength of light detected by (i.e., resulting in charge formation in) the light-detecting semiconductor dies. The light-detecting semiconductor dies may include or consist essentially of a semiconductor material including or consisting essentially of GaAs, AlAs, InAs, GaP, AlP, InP, ZnO, CdSe, CdTe, ZnTe, GaN, AlN, InN, silicon, and/or an alloy or mixture thereof. The binder may contain a wavelength-conversion material for absorption of at least a portion of light incident thereon and emission of converted light (i) having a different wavelength and (ii) for detection by the light-detecting semiconductor die.

An optical element may be associated with (e.g., aligned to) one or more of the semiconductor dies. An array of optical elements may be disposed on the binder prior to curing. Curing the binder may adhere the array of optical elements to the cured binder. The composite wafer may include the array of optical elements, and the composite wafer may be separated into discrete portions each including at least one optical element. The plurality of semiconductor dies may include a light-emitting semiconductor die and/or a light-detecting semiconductor die. A reflecting layer (e.g., a reflecting film) may be formed over or within at least a portion of the composite wafer (e.g., over or within the binder). The reflecting film may include or consist essentially of aluminum, copper, gold, silver, and/or titanium. The reflecting layer may include or consist essentially of a plurality of particles (e.g., fumed silica particles, fumed alumina particles, and/or $TiO_2$ particles). Forming the reflecting layer may include or consist essentially of disposing the plurality of particles over the mold substrate and plurality of semiconductor dies before coating the plurality of semiconductor dies with the binder. Prior to coating the plurality of semiconductor dies with the binder, a reflecting film defining openings corresponding to positions of the semiconductor dies may be disposed over the mold substrate. The semiconductor die may include or consist essentially of a light-emitting or a light-detecting semiconductor die, and a reflecting layer may be formed over at least a portion of the surface of the composite wafer, the reflecting layer having a reflectivity of at least 25% to a wavelength of light emitted or absorbed by (i) the semiconductor die and/or (ii) the binder.

In another aspect, embodiments of the invention feature a method of forming a composite wafer comprising a plurality of discrete semiconductor dies suspended in a cured binder. The plurality of discrete semiconductor dies are disposed on a mold substrate, and each semiconductor die has at least two spaced-apart contacts opposite the mold substrate. The plurality of semiconductor dies are coated with a first binder, the contacts of each semiconductor die remaining at least partially uncoated. The first binder is at least partially cured. A second substrate is disposed in contact with the plurality of semiconductor dies coated with at least partially cured first binder. Thereafter, the mold substrate is removed from the plurality of semiconductor dies, thereby exposing a portion of each semiconductor die uncoated by the first binder, the plurality of semiconductor dies remaining attached to the second substrate. At least the uncoated portion of each of the plurality of semiconductor dies is coated with a second binder, and the contacts of each semiconductor die remain at least partially uncoated. The second binder is cured to form the composite wafer.

Embodiments of the invention may include one or more of the following in any of a variety of combinations. The first binder and the second binder may include or consist essentially of the same material. The composite wafer may be separated into a plurality of discrete portions each including at least one semiconductor die coated with cured first binder and cured second binder. The composite wafer may be separated from the second substrate. At least a portion of each of the contacts of the plurality of semiconductor dies of the composite wafer may protrude from cured first binder and/or cured second binder. At least a portion of each semiconductor die proximate the contacts thereof may protrude from cured first binder and/or cured second binder. The first binder and/or the second binder may include or consist essentially of silicone and/or epoxy. Coating at least the uncoated portion of each of the plurality of semiconductor dies with the second binder may include or consist essentially of dispensing the second binder into a mold and disposing the mold substrate over the mold, whereby the plurality of semiconductor dies are disposed in contact with the second binder. Curing the second binder may include or consist essentially of at least partially curing the second binder and, thereafter, removing the mold substrate from the mold. A surface of the mold opposite the mold substrate may have a texture (e.g., a texture configured to enhance light extraction from the cured second binder), and at least a portion of the cured second binder may have the texture after the mold substrate is removed from the mold. A texture for enhancing light extraction from the cured second binder may be applied to at least a portion of a surface of the second binder opposite the mold substrate after removing the mold substrate from the mold. The mold may include or consist essentially of (i) a plurality of discrete compartments in which the second binder is disposed, and (ii) one or more semiconductor dies may be suspended within or above each compartment prior to curing the second binder. Each compartment may impart a complementary shape to a portion of the second binder, the complementary shapes being substantially identical to each other.

Coating at least the uncoated portion of each of the plurality of semiconductor dies with the second binder may include or consist essentially of dispensing the second binder over the mold substrate, and the second binder may be contained over the mold substrate by one or more barriers extending above a surface of the mold substrate. A texture for enhancing light extraction from the cured second binder may be applied to at least a portion of a surface of the second binder opposite the mold substrate, whereby the cured second binder retains the texture. Curing the second binder may include or consist essentially of at least partially curing the second binder and, thereafter, removing the mold substrate from the plurality of semiconductor dies. A mold cover may be disposed over and in contact with at least a portion of the second binder. The mold cover may include or consist essentially of a plurality of discrete compartments, and one or more semiconductor dies may be suspended within or beneath each compartment prior to curing the second binder. Each compartment may impart a complementary shape to a portion of the second binder, the complementary shapes being substantially identical to each other. The first binder and/or the second binder may contain a wavelength-conversion material (e.g., a phosphor and/or quantum dots). Each semiconductor die may include or consist essentially of a light-emitting semiconductor die (e.g., a bare-die light-emitting diode). The first binder and/or the second binder may be transparent to a wavelength of light emitted by the light-emitting semiconductor dies. Each light-emitting semiconductor die may include or consist essentially of a semiconductor material including or consisting essentially of GaAs, AlAs, InAs, GaP, AlP, InP, ZnO, CdSe, CdTe, ZnTe, GaN, AlN, InN, silicon, and/or an alloy or mixture thereof. The first binder and/or the second binder may contain a wavelength-conversion material for absorption of at least a portion of light emitted from the light-emitting semiconductor dies and emission of converted light having a different wavelength, converted light and unconverted light emitted by the light-emitting semiconductor dies combining to form substantially white light. The substantially white light may have a correlated color temperature in the range of 2000 K to 10,000 K. The substantially white light may have a color temperature variation less than four, or even less than two, MacAdam ellipses across the composite wafer.

In yet another aspect, embodiments of the invention feature a method of forming electronic devices. A plurality of discrete semiconductor dies is disposed on a mold substrate, each semiconductor die having at least two spaced-apart contacts adjacent the mold substrate. The plurality of semiconductor dies is coated with a binder. The binder is cured to form a composite wafer including or consisting essentially of the plurality of semiconductor dies suspended in the cured binder, the contacts of each semiconductor die remaining at least partially uncoated with binder. The composite wafer is separated into a plurality of discrete portions each including or consisting essentially of at least one semiconductor die suspended in cured binder. Thereafter, the discrete portions of the composite wafer are removed from the mold substrate.

Embodiments of the invention may include one or more of the following in any of a variety of combinations. The binder may include or consist essentially of (i) silicone and/or epoxy and (ii) a wavelength-conversion material, and each of the semiconductor dies may include or consist essentially of a light-emitting diode. The wavelength-conversion material may absorb at least a portion of light emitted from a light-emitting semiconductor die and emit converted light having a different wavelength, converted light and unconverted light emitted by the light-emitting semiconductor die combining to form substantially white light. After curing the binder, at least a portion of each of the contacts of the plurality of semiconductor dies may protrude from the cured binder. After curing the binder, at least a portion of each semiconductor die proximate the contacts thereof may protrude from the cured binder.

In an additional aspect, embodiments of the invention feature a method of forming electronic devices. A plurality of discrete semiconductor dies is disposed on a mold substrate, each semiconductor die having at least two spaced-apart contacts opposite the mold substrate. The plurality of semiconductor dies is coated with a first binder, the contacts of each semiconductor die remaining at least partially uncoated. The first binder is at least partially cured. A second substrate is disposed in contact with the plurality of semiconductor dies coated with at least partially cured first binder. Thereafter, the mold substrate is removed from the plurality of semiconductor dies, thereby exposing a portion of each semiconductor die uncoated by the first binder, the plurality of semiconductor dies remaining attached to the second substrate. At least the uncoated portion of each of the plurality of semiconductor dies is coated with a second binder. The second binder is cured to form a composite wafer including or consisting essentially of the plurality of semiconductor dies and cured first and second binders. The composite wafer is separated into a plurality of discrete portions each including or consisting essentially of at least one semiconductor die and cured first and second binders. Thereafter, the discrete portions of the composite wafer are removed from the mold substrate.

Embodiments of the invention may include one or more of the following in any of a variety of combinations. The first binder and the second binder may include or consist essentially of the same material. The first binder and/or the second may include or consist essentially of (i) silicone and/or epoxy and (ii) a wavelength-conversion material, and each of the semiconductor dies may include or consist essentially of a light-emitting diode. The wavelength-conversion material may absorb at least a portion of light emitted from a light-emitting semiconductor die and emit converted light having a different wavelength, converted light and unconverted light emitted by the light-emitting semiconductor die combining to form substantially white light. After curing the second binder, at least a portion of each of the contacts of the plurality of semiconductor dies may protrude from the cured first binder and/or the cured second binder (i.e., from the composite wafer). After curing the second binder, at least a portion of each semiconductor die proximate the contacts thereof may protrude from the cured first binder and/or the cured second binder.

In yet an additional aspect, embodiments of the invention feature a method of forming a composite wafer including or consisting essentially of a plurality of discrete semiconductor dies suspended in a cured binder. The plurality of discrete semiconductor dies is disposed on a mold substrate, each semiconductor die having at least two spaced-apart contacts. The plurality of semiconductor dies is coated with a binder. The binder is cured to form the composite wafer. At least a portion of the binder proximate the at least two contacts is removed to expose at least portions of each of the at least two contacts. The composite wafer may be separated into a plurality of discrete portions each including or consisting essentially of at least one semiconductor die suspended in cured binder. Thereafter, the discrete portions of the composite wafer may be removed from the mold substrate.

In an aspect, embodiments of the invention feature an electronic device including or consisting essentially of a solid shaped volume of a polymeric binder and, suspended within the binder, a semiconductor die having a first face, a second face opposite the first face, at least one sidewall spanning the first and second faces. At least two spaced-apart contacts are disposed on the first face of the semiconductor die. The contacts each have a free terminal end (i) not covered by the binder and (ii) available for electrical connection.

Embodiments of the invention may include one or more of the following in any of a variety of combinations. At least portions of the contacts may protrude from the binder. At least a portion of each said sidewall may protrude from the binder. The binder may define a rectangular solid having approximately 90° corners between adjacent faces thereof. The binder may include or consist essentially of silicone and/or epoxy. One or more additional semiconductor dies may be suspended within the binder. The binder may contain a wavelength-conversion material (e.g., a phosphor and/or quantum dots) therein. The semiconductor die may include or consist essentially of a light-emitting element (e.g., a bare-die light-emitting diode). The binder may be transparent to a wavelength of light emitted by the light-emitting element. The light-emitting element may include or consist essentially of a semiconductor material including or consisting essentially of GaAs, AlAs, InAs, GaP, AlP, InP, ZnO, CdSe, CdTe, ZnTe, GaN, AlN, InN, silicon, and/or an alloy or mixture thereof. The binder may contain a wavelength-conversion material for absorption of at least a portion of light emitted from the light-emitting element and emission of converted light having a different wavelength, converted light and unconverted light emitted by the light-emitting element combining to form substantially white light. The substantially white light may have a correlated color temperature in the range of 2000 K to 10,000 K. The binder may have a thickness between 5 µm and 4000 µm. A dimension of the binder perpendicular to the thickness may be between 25 µm and 50 mm. At least a portion of the surface of the binder may have a texture for enhancing extraction of light from the binder.

The semiconductor die may include or consist essentially of a light-detecting element. The binder may be transparent to a wavelength of light detected by the light-detecting element. An optical element may be positioned to receive light from or transmit light to the semiconductor die. A reflecting layer may be disposed over or within at least a portion of the binder. The reflecting layer may include or consist essentially of (i) a reflecting film and/or (ii) a plurality of particles. The semiconductor die may include or consist essentially of a light-emitting element or a light-detecting element, and the reflecting layer may have a reflectivity of at least 25% to a wavelength of light (i) emitted or detected by the semiconductor die or (ii) emitted by the binder. The binder may include or consist essentially of a plurality of discrete regions, at least one of which includes or consists essentially of the binder and at least one wavelength-conversion material. Another of the regions may consist essentially of only the binder. The semiconductor die may include or consist essentially of one or more active semiconductor layers not disposed on a semiconductor substrate. One or more alignment marks may be disposed on the surface of the binder for alignment and/or orientation of the semiconductor die.

In another aspect, embodiments of the invention feature a composite wafer including or consisting essentially of a solid volume of a polymeric binder having a first surface and a second surface opposite the first surface and, suspended within the binder, a plurality of semiconductor dies each having a first face, a second face opposite the first face, and at least one sidewall spanning the first and second faces. At least two spaced-apart contacts are disposed on the first face of each semiconductor die. The contacts each have a free terminal end (i) not covered by the binder and (ii) available for electrical connection.

Embodiments of the invention may include one or more of the following in any of a variety of combinations. At least portions of the contacts of the semiconductor dies may protrude from the binder. At least a portion of each said sidewall of each of the semiconductor dies may protrude from the first surface of the binder. The binder may include or consist essentially of silicone and/or epoxy. The binder may contain a wavelength-conversion material (e.g., a phosphor and/or quantum dots) therein. Each semiconductor die may include or consist essentially of a light-emitting element (e.g., a bare-die light-emitting diode). The binder may be transparent to a wavelength of light emitted by the semiconductor dies. Each semiconductor die may include or consist essentially of a semiconductor material that includes or consists essentially of GaAs, AlAs, InAs, GaP, AlP, InP, ZnO, CdSe, CdTe, ZnTe, GaN, AlN, InN, silicon, and/or an alloy or mixture thereof. The binder may contain a wavelength-conversion material for absorption of at least a portion of light emitted from the light-emitting elements and emission of converted light having a different wavelength, converted light and unconverted light emitted by the light-emitting elements combining to form substantially white light. The substantially white light may have a correlated color temperature in the range of 2000 K to 10,000 K. The substantially white light may have a variation in color temperature of less than four, or even less than two, MacAdam ellipses across the composite wafer. The first and second surfaces of the binder may be substantially flat and parallel. The binder may have a substantially uniform thickness with a thickness variation less than 10%, or even less than 5%. The binder may have a thickness between 15 µm and 4000 µm. A dimension of the binder perpendicular to the thickness (e.g., a side length or a diameter) may be between 100 µm and 1000 mm. The spacing between each pair of the plurality of semiconductor dies may be substantially the same. The spacing between each pair of the plurality of semiconductor dies may be in the range of about 25 µm to about 10,000 µm. The thickness of the binder above each of the plurality of semiconductor dies may be substantially the same. The thickness of the binder above each of the plurality of semiconductor dies may be the same to within 5%.

The plurality of semiconductor dies may include or consist essentially of at least 500 semiconductor dies, or even at least 2000 semiconductor dies. The semiconductor dies may be arranged in an array having substantially equal distances between semiconductor dies in at least a first direction. The array of semiconductor dies may have substantially equal distances between semiconductor dies in a second direction different from the first direction. The semiconductor dies may be arranged in a regular periodic (e.g., two-dimensional) array. At least a portion of the surface of the binder may be textured with a texture for enhancing light extraction from the binder. Each semiconductor die may include or consist essentially of a light-detecting element (e.g., a photovoltaic die). The binder may be transparent to a wavelength of light detected by the semiconductor dies. At least one optical element may be positioned to receive light from or transmit light to at least one of the semiconductor dies. The at least one optical element may include or consist essentially of a plurality of discrete optical elements each associated with at least one semiconductor die. A reflecting layer (e.g., a reflecting film and/or a plurality of particles) may be disposed over or within at least a portion of the binder. Each semiconductor die may include or consist essentially of a light-emitting element or a light-detecting element, and the reflecting layer may have a reflectivity of at least 25% to a wavelength of light (i) emitted or detected by the semiconductor dies or (ii) emitted by the binder. The binder may include or consist essentially of a plurality of discrete regions, at least one of which comprises the binder and at least one wavelength-conversion material. At least one other region may consist essentially of the binder. Each semiconductor die may include or consist essentially of one or more active semiconductor layers not disposed on a semiconductor substrate. One or more alignment marks may be disposed on the first surface or the second surface of the binder. The binder may include or consist essentially of a plurality of shaped regions, each shaped region (i) associated with at least one semiconductor die and (ii) having a shape substantially identical to shapes of the other shaped regions.

In yet another aspect, embodiments of the invention feature an electronic device including or consisting essentially of (i) a substrate having first and second conductive traces thereon, the first and second conductive traces being separated on the substrate by a gap therebetween, (ii) disposed over the gap, a semiconductor die having a first face, a second face opposite the first face, at least one sidewall spanning the first and second faces, and two spaced-apart contacts on the first face, the contacts each being electrically coupled to a different conductive trace, and (iii) encasing the second face and at least a portion of each said sidewall of the semiconductor die, a solid polymeric binder defining a rectangular solid having approximately 90° corners between adjacent faces thereof. At least a portion of each of the contacts is not covered by the binder.

Embodiments of the invention may include one or more of the following in any of a variety of combinations. At least a portion of each of the contacts may protrude from the binder. At least a portion of each said sidewall may protrude from the binder. The binder may include or consist essentially of silicone and/or epoxy. The binder may contain a wavelength-conversion material (e.g., a phosphor and/or quantum dots) therein. The top surface of the binder opposite the substrate may have a texture for promoting light extraction from the top surface. The semiconductor die may include or consist essentially of a light-emitting element (e.g., a bare-die light-emitting diode). The binder may be transparent to a wavelength of light emitted by the semiconductor die. The semiconductor die may include or consist essentially of a semiconductor material including or consisting essentially of GaAs, AlAs, InAs, GaP, AlP, InP, ZnO, CdSe, CdTe, ZnTe, GaN, AlN, InN, silicon, and/or an alloy or mixture thereof. The binder may contain a wavelength-conversion material for absorption of at least a portion of light emitted from the semiconductor die and emission of converted light having a different wavelength, converted light and unconverted light emitted by the semiconductor die combining to form substantially white light. The substantially white light may have a correlated color temperature in the range of 2000 K to 10,000 K.

The semiconductor die may include or consist essentially of a light-detecting element. The binder may be transparent to a wavelength of light detected by the semiconductor die. An optical element may be associated with (e.g., aligned to) the semiconductor die. A reflecting layer may be disposed over or within at least a portion of the binder. The binder may include or consist essentially of a plurality of discrete regions, at least one of which includes or consists essentially of the binder and at least one wavelength-conversion material. Another region may consist essentially of the binder. The semiconductor die may include or consist essentially of one or more active semiconductor layers not disposed on a semiconductor substrate (i.e., no semiconductor substrate is present within the die). The contacts may be electrically coupled to the conductive traces with a conductive adhesive. The conductive adhesive may include or consist essentially of a substantially isotropic conductive adhesive electrically connecting a first contact only to the first trace and a second contact only to the second trace, and a non-conductive adhesive material may be disposed in the gap. The conductive adhesive comprises an anisotropic conductive adhesive (ACA) electrically connecting a first contact only to the first trace and a second contact only to the second trace. A portion of the ACA may be disposed in the gap and may substantially isolate the first contact from the second contact. The contacts may be electrically coupled to the conductive traces by wire bonds and/or solder. The conductive traces may include or consist essentially of silver, gold, aluminum, chromium, copper, and/or carbon. The substrate may include or consist essentially of polyethylene naphthalate, polyethylene terephthalate, polycarbonate, polyethersulfone, polyester, polyimide, polyethylene, and/or paper. The semiconductor die may include or consist essentially of a light-emitting element. The reflectivity of the substrate for a wavelength emitted by at least one of the light-emitting element or the binder may be greater than 80%. The transmissivity of the substrate for a wavelength emitted by at least one of the light-emitting element or the binder may be greater than 80%. Circuitry for powering the semiconductor die may be electrically connected to the semiconductor die.

In an aspect, embodiments of the invention feature a method for forming a composite wafer comprising a plurality of discrete bare-die light-emitting diodes suspended in a cured binder. The plurality of discrete bare-die light-emitting diodes is provided. Each bare-die light-emitting diode has a first face, a second face opposite the first face, at least one sidewall spanning the first and second faces, and at least two spaced-apart contacts on the first face. The bare-die light-emitting diodes are disposed on a mold substrate such that each contact is in contact with the mold substrate. The bare-die light-emitting diodes are coated with a binder such that at least a portion of each contact is not covered by the binder. The binder includes silicone and/or epoxy transparent to a wavelength of light emitted by the bare-die light-emitting diodes, and the binder contains therein a wavelength-conversion material including or consisting essentially of a phosphor and/or quantum dots. The binder is cured to form the composite wafer. The mold substrate is removed such that the contacts of each bare-die light-emitting diode remain at least partially uncoated by the binder and protrude from the binder after removal of the mold substrate. The composite wafer is singulated into a plurality of discrete portions each including or consisting essentially of at least one bare-die light-emitting diode suspended in cured binder.

Embodiments of the invention may include one or more of the following in any of a variety of combinations. The composite wafer may be singulated prior to the mold substrate being removed. The mold substrate may be singulated with the composite wafer into discrete portions that may be removed from the portions of the composite wafer. The composite wafer may be singulated after the mold substrate is removed from the composite wafer. Before curing the binder, the contacts of the bare-die light-emitting diodes may be at least partially embedded within the mold substrate, for example, by at least 2 µm. After curing the binder, at least a portion of each of the contacts of the bare-die light-emitting diodes may protrude from the cured binder by at least 1 µm. After curing the binder, at least a portion of each said sidewall of each bare-die light-emitting diode proximate the contacts thereof may protrude from the cured binder by at least 1 µm. The contacts of each bare-die light-emitting diodes may remain substantially entirely uncoated by binder during coating of the bare-die light-emitting diodes and curing of the binder. Removing the mold substrate may include or consist essentially of disposing a second substrate in contact with the composite wafer on a surface thereof opposite the contacts of the bare-die light-emitting diodes, and removing the mold substrate from the composite wafer, the composite wafer remaining attached to the second substrate. The composite wafer may be separated from the second substrate.

Coating the bare-die light-emitting diodes with the binder may include or consist essentially of (i) providing a mold comprising a plurality of discrete compartments, (ii) dispensing the binder into the mold, (iii) disposing the mold substrate over the mold, whereby one or more bare-die light-emitting diodes are suspended within or above each compartment within the binder, (iv) curing or partially curing the binder, and (v) removing the mold substrate from the mold. Each compartment of the mold may impart a complementary shape (i.e., complementary to the shape of the compartment) to a portion of the binder after curing. The complementary shapes of the portions of the binder may be substantially identical to each other. A surface of the mold may include a texture. At least a portion of the cured binder may include the texture after curing the binder. The texture may include heights above the surface of the binder selected from the range of about 0.25 µm to about 15 µm.

Coating the bare die light-emitting diodes with the binder may include or consist essentially of dispensing the binder over the mold substrate, the binder being contained over the mold substrate by one or more barriers extending above a surface of the mold substrate. The bare-die light-emitting diodes may each include or consist essentially of a semiconductor material including or consisting essentially of GaAs, AlAs, InAs, GaP, AlP, InP, ZnO, CdSe, CdTe, ZnTe, GaN, AlN, InN, silicon, and/or an alloy or mixture thereof. The wavelength-conversion material may absorb at least a portion of light emitted from at least one bare-die light-emitting diode and emit converted light having a different wavelength, converted light and unconverted light emitted by the at least one bare-die light-emitting diode combining to form substantially white light. The substantially white light may have a correlated color temperature in the range of 2000 K to 10,000 K. The substantially white light may have a color temperature variation less than four MacAdam ellipses across the composite wafer, or even less than two MacAdam ellipses across the composite wafer.

The composite wafer may have a first surface and a second surface opposite the first surface, and the first and second surface may be substantially flat and parallel. The composite wafer may have a substantially uniform thickness with a thickness variation less than 10%, or even less than 5%. A dimension of the composite wafer perpendicular to the thickness may be between 5 mm and 1000 mm. The thickness of the binder above each of the bare-die light-emitting diodes may be the same to within 5%. At least one bare-die light-emitting diode may include or consist essentially of one or more active layers over a substrate. The substrate may be partially or completely removed before coating with the binder. The substrate of the at least one bare-die light-emitting diode may be partially or completely removed after disposing the at least one bare-die light-emitting diode on the mold substrate. A reflecting layer may be formed over or within at least a portion of the composite wafer. The reflecting layer may include or consist essentially of a reflecting film and/or a plurality of particles (e.g., reflective particles). A surface of the mold substrate may include a texture. At least a portion of the cured binder may include the texture after curing the binder. The texture may include heights above the surface of the binder selected from the range of about 0.25 µm to about 15 µm.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The term "light" broadly connotes any wavelength or wavelength band in the electromagnetic spectrum, including, without limitation, visible light, ultraviolet radiation, and infrared radiation. Similarly, photometric terms such as "illuminance," "luminous flux," and "luminous intensity" extend to and include their radiometric equivalents, such as "irradiance," "radiant flux," and "radiant intensity." As used herein, the terms "substantially," "approximately," and "about" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2A and 2B are, respectively, cross-sectional and bottom schematics of a white die in accordance with various embodiments of the invention;

FIG. 3 is a flow chart of a technique for forming a white die in accordance with various embodiments of the invention;

FIG. 6 is a flow chart of a technique for fabricating binned white dies having similar characteristics in accordance with various embodiments of the invention;

FIGS. 8A-8D are cross-sectional schematics of process steps utilized to fabricate white dies in accordance with various embodiments of the invention;

FIGS. 13A-13G are cross-sectional schematics of process steps utilized to fabricate white dies in accordance with various embodiments of the invention;

FIGS. 14A-14C are cross-sectional schematics of white dies in accordance with various embodiments of the invention;

FIGS. 15A-15E are cross-sectional schematics of process steps utilized to fabricate white dies in accordance with various embodiments of the invention;

FIGS. 33A and 33C are cross-sectional schematics of structures formed during fabrication of white dies utilizing release materials in accordance with various embodiments of the invention;

FIGS. 33B and 33D are cross-sectional schematics of white dies fabricated from the structures of FIGS. 33A and 33C, respectively;

FIG. 34 is a cross-sectional schematic of light-emitting elements on a substrate composed of materials having different levels of adhesion in accordance with various embodiments of the invention;

FIGS. 35A and 35B are cross-sectional schematics of light-emitting elements disposed on compressible substrates in accordance with various embodiments of the invention;

FIG. 36 is a cross-sectional schematic of light-emitting elements on a substrate patterned to control die relief of white dies incorporating the light-emitting elements in accordance with various embodiments of the invention;

FIGS. 37 and 38 are cross-sectional schematics of light-emitting elements on substrates with through-holes for application of vacuum in accordance with various embodiments of the invention;

FIGS. 39A and 39B are cross-sectional schematics of white dies in accordance with various embodiments of the invention;

FIGS. 40A-40D are cross-sectional schematics of process steps utilized to fabricate white dies in accordance with various embodiments of the invention;

FIGS. 40E and 40F are cross-sectional schematics of white dies each incorporating multiple light-emitting elements in accordance with various embodiments of the invention;

FIGS. 41A and 41B are cross-sectional schematics of white dies fabricated with a shaped blade in accordance with various embodiments of the invention;

FIGS. 42A-42D are cross-sectional schematics of white dies in accordance with various embodiments of the invention;

FIG. 43A is a cross-sectional schematic of a white die incorporating a reflecting layer in accordance with various embodiments of the invention;

FIG. 44A is a cross-sectional schematic of a processing step utilized to fabricate the white die of FIG. 43A in accordance with various embodiments of the invention;

FIGS. 44B and 44C are cross-sectional schematics of a portion of a white die in accordance with various embodiments of the invention;

FIGS. 64A-64D are cross-sectional schematics of white dies in accordance with various embodiments of the invention, and FIG. 65A-65C are cross-sectional schematics of a process for fabricating white dies in accordance with embodiments of the invention.

DETAILED DESCRIPTION

Figure 1:
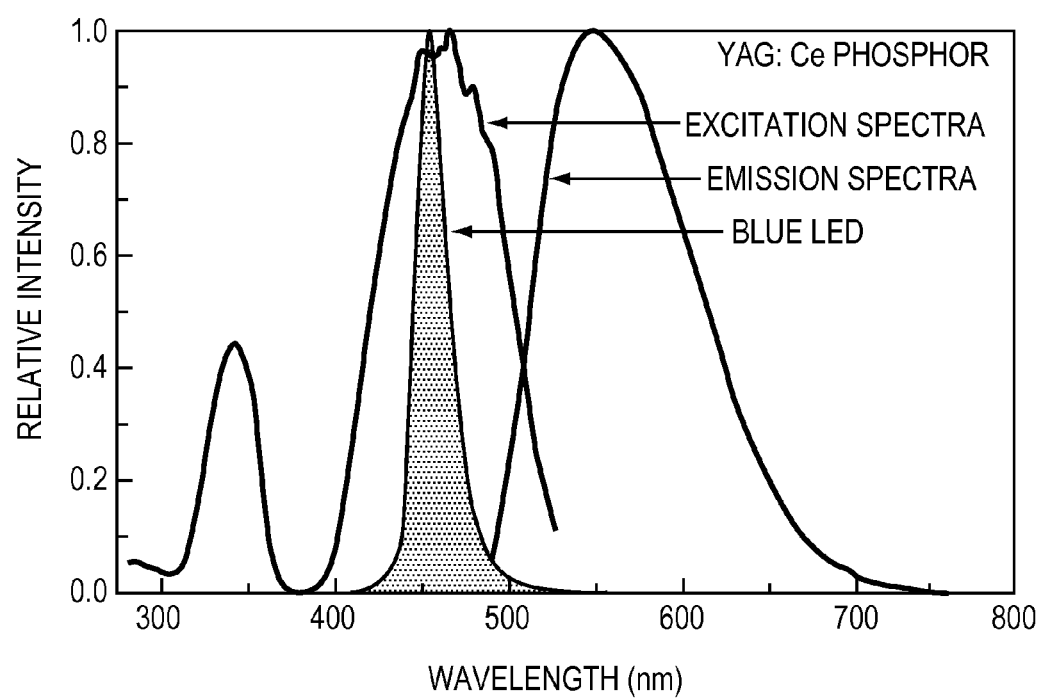
FIG. 1 is a graph of emission and excitation spectra of an exemplary LED and phosphor.

Embodiments of the present invention provide a new approach to integration of phosphor and light-emitting elements, such as LED dies, that addresses a number of the deficiencies and difficulties present in the current manufacture of white packaged LEDs. Advantageously, the phosphor may be integrated with a die before it is placed in a package (or instead of being conventionally packaged), thereby producing a package-free white die. An example is depicted as white die 200 in FIG. 2A. White die 200 includes one or more LEEs 210, each of which features at least one contact 220. As shown, the LEE 210 is partially surrounded by a phosphor 230. At least a portion of contact(s) 220 is typically not covered by phosphor 230. In the configuration shown in FIG. 2A, LEE 210 features two contacts 220 that are situated on the same face or side 240 of LEE 210. As shown, each of the contacts 220 preferably has a free terminal end that is not covered by the phosphor 230 and that is available for electrical connection. Herein, "available for electrical connection" means the contact has sufficient free area to permit attachment to, e.g., a conductive trace, a circuit board, etc, and "free" means lacking any electrical connection (and in preferred embodiments, any mechanical connection) thereto.

While face 240 of LEE 210 is shown as being a single planar surface, this is not a limitation of the present invention, and in other embodiments face 240 is composed of multiple non-coplanar surfaces or may have other configurations. In some embodiments LEE 210 has more than two contacts 220. White die 200 is shown in FIG. 2A as having no phosphor 230 covering face 240; however, this is not a limitation of the present invention, and in other embodiments phosphor 230 covers all or a portion of face 240. As discussed above, here phosphor may refer to a binder or matrix material alone or a mixture of the binder and wavelength-conversion material. In FIG. 2A, the width of phosphor 230 around the sides of LEE 210 is identified as a width 250, while the thickness of phosphor 230 over LEE 210 is identified as a thickness 260 and the thickness of phosphor 230 adjacent to LEE 210 is identified as a thickness 270.

FIGS. 2A and 2B show white die 200 including one LEE 210; however, this is not a limitation of the present invention, and in other embodiments white die 200 includes more than one LEE 210. In some embodiments, multiple LEEs 210 of a single white die 200 are all the same, while in other embodiments they are made up of at least two different types of LEE 210. In one embodiment, different types of LEE 210 emit at different wavelengths. For example, white die 200 may include one or more of each of three different types of LEE 210, where at least one type emits in the blue wavelength range, at least one in the green wavelength range and at least one in the red wavelength range. In one embodiment white die 200 may include one or more of each of two different types of LEE 210, where at least one type emits in the blue wavelength range and at least one in the red wavelength range. The specific configuration of the LEE 210 in white die 200 as well as their operating characteristics and properties are not a limitation of the present invention. In one embodiment, different types of LEE 210 have different light output powers. In one embodiment, phosphor 230 may be composed of a plurality of portions or volumes, where each portion or volume includes or consists essentially of one or more phosphors different from one or more phosphors in another portion. In one embodiment of this example, one or more portions include or consist essentially of only a transparent binder material, while one or more other portions include or consist essentially of a binder and one or more phosphors.

In some embodiments, a surface 280 of phosphor 230 is parallel or substantially parallel to a surface 242 of LEE 210. In some embodiments, a surface 290 of phosphor 230 is parallel or substantially parallel to a surface 244 of LEE 210. In some embodiments phosphor 230 forms a substantially cubic or rectangular-solid shape (the contour of which may be broken by portions of the LEE 210 and/or the contacts of the LEE 210). The thickness 260 of phosphor 230 over LEE 210 is shown as the same or substantially the same over the entirety of LEE 210; however, this is not a limitation of the present invention and in other embodiments thickness 260 of phosphor 230 over LEE 210 varies. The thickness 270 of phosphor 230 adjacent to LEE 210 is shown as the same or substantially the same for white die 200; however, this is not a limitation of the present invention and in other embodiments thickness 270 of phosphor 230 adjacent to LEE 210 varies. FIG. 2A shows surface 280 and side surfaces 290 of phosphor 230 as flat or substantially flat; however, this is not a limitation of the present invention and in other embodiments surface 280 and/or surface 290 are curved, roughened, patterned, or textured in a regular, periodic, or random pattern. In some embodiments phosphor 230 has, at least in part, a smooth, substantially continuous shape. In some embodiments, shaping and/or patterning or texturing of the surface is achieved during the formation or molding process, while in other embodiments shaping and/or patterning or texturing is performed after the phosphor is molded or after it is cured or partially cured.

FIG. 2B shows a view of the white die 200 facing the contact side of LEE 210. LEE 210 in FIG. 2B is shown as rectangular in cross-section; however, this is not a limitation of the present invention, and in other embodiments LEE 210 is square, hexagonal, circular, triangular or any arbitrary shape and/or may have sidewalls forming any angle with respect to the surface 280 of white die 200. In FIG. 2B width 250 of phosphor 230 on the sides of LEE 210 is shown as the same or substantially the same on all sides of LEE 210; however, this is not a limitation of the present invention and in other embodiments width 250 of phosphor 230 is different on one or more or all sides of LEE 210. FIG. 2B shows width 250 of phosphor 230 as the same or substantially the same across each side of LEE 210; however, this is not a limitation of the present invention, and in other embodiments width 250 of phosphor 230 varies along one or more sides of LEE 210.

As discussed above, embodiments of the present invention form phosphor 230 on LEE 210 prior to attachment (electrical and/or mechanical) to a package or to a substrate. White die 200 may then be integrated in a variety of packages, as discussed below. FIG. 3 shows a flow chart of a process 300 for forming white die 200. Process 300 is shown having six steps; however, this is not a limitation of the present invention and in other embodiments the invention has more or fewer steps and/or the steps may be performed in different order. In step 310, a first surface or base is provided. In step 320, one or more LEEs are placed or formed on the base. In step 330, the phosphor is provided. In step 340, the phosphor is formed over the LEE and base. In step 350, the phosphor is cured. In step 360, the phosphor-coated LEEs are separated or singulated into white dies 200. A step to remove the base (not shown in FIG. 3) may be implemented at different points in the process, as discussed herein. Various approaches to manufacturing and using white dies 200 are discussed below.

Figure 4A:
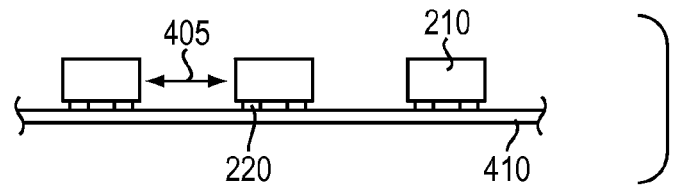
FIGS. 4A-4E are cross-sectional schematics of process steps utilized to fabricate white dies in accordance with various embodiments of the invention.

FIGS. 4A-4E depict one embodiment of process 300. In this embodiment, a base 410 is provided (step 310) and LEEs 210 are placed on or adhered to base 410 (step 320) with contacts 220 adjacent to base 410 (FIG. 4A). Base 410 may also be referred to as a "mold substrate." In one embodiment, base 410 includes or consists essentially of an adhesive film or tape. In some embodiments, base 410 includes or consists essentially of a material to which has a relatively low adhesion to phosphor 230, that is, it permits removal of cured phosphor 230 from base 410. In some embodiments, base 410 is the same as or similar to dicing or transfer tapes used in the semiconductor industry for singulation and/or transfer of dies, for example Revalpha from Nitto Denko Corporation or tapes from Semiconductor Equipment Corporation. In some embodiments, base 410 includes or consists essentially of a water-soluble material or adhesive, or may be covered or be partially covered with a water-soluble material. For example, the adhesive of base 410 or the liner or both may be water soluble. In some embodiments, the water-soluble material includes or consists essentially of a water-soluble tape, for example 3M type 5414. In some embodiments base 410 includes or consists essentially of a silicone or a silicone-based material, for example PDMS or GelPak material from the Gel-Pak Corporation.

In some embodiments, base 410 includes or consists essentially of a material with variable adhesive force. In this embodiment the adhesive force may be changed after formation and curing of the phosphor, to make it easier to remove the white die or white die wafer from base 410. (A white die wafer, also referred to as a composite wafer, is herein defined as a plurality of semiconductor dies suspended in a binder.) In one embodiment such a variable adhesive force material may be a thermal release tape or a UV release tape. In one embodiment the variable adhesive force material may be a water-soluble tape. In one embodiment the variable adhesive force material may be an electrostatic chuck (LEEs 210 are formed or placed on the electrostatic chuck, similar to the structure shown in FIG. 4A). In this embodiment LEE 210 are held in place on the electrostatic chuck by electrostatic forces that may be activated or deactivated electrically.

In some embodiments, it is desirable for all or a portion of the face of contact 220 to be exposed after formation of white die 200, that is, to not be covered by phosphor 230. In some embodiments, placing or adhering all or a portion of the face of contact 220 adjacent to base 410 prevents coverage or formation of phosphor 230 over all or a portion of contact 220 or over all or a portion of the face of contact 220. In some embodiments, the thickness, hardness and/or other properties of a coating on base 410, or the properties of base 410, for example an adhesive thickness, chemical composition, surface energy, hardness, elasticity, etc., may be varied to ensure the desired level of exposure of contacts 220, for example by proximity to base 410 or partial or full embedding of contacts 220 into base 410.

Figure 4B:
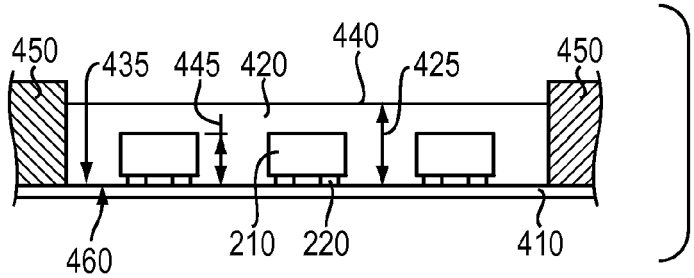

In some embodiments, base 410 includes or consists essentially of a surface or a mold (e.g., a non-flat surface). In one embodiment, barriers 450 are formed by a recess in base 410. In FIG. 4B barriers 450 are shown as perpendicular or substantially perpendicular to a surface 435; however, this is not a limitation of the present invention, and in other embodiments barriers 450 form any angle with surface 435. Base 410 may include or consist essentially of one or more of a variety of materials, for example glass, PET, PEN, plastic film, tape, adhesive on plastic film, metal, acrylic, polycarbonate, polymers, silicone, polytetrafluoroethylene (Teflon), or the like. In some embodiments, base 410 is rigid or substantially rigid, while in others base 410 is flexible. In some embodiments, it is advantageous for base 410 to include or consist essentially of a "non-stick" material such as Teflon, or a fluorinated material such as Fluon ETFE produced by Asahi Glass or to include a non-stick coating over the surface or portion of the surface that may come in contact with phosphor 230 (for example the binder in phosphor 230) so that phosphor 230 does not stick to base 410. In some embodiments, base 410 includes or consists essentially of a layer of material on surface 435 and/or barriers 450 that does not adhere well to the binder material. In some embodiments, base 410 includes or consists essentially of a water-soluble material or adhesive, or base 410 is partially or completely lined with a water-soluble material to aid in the release of base 410 from the material formed in base 410. In one embodiment, base 410 includes or consists essentially of or is partially or fully lined with a water-soluble tape, for example 3M type 5414. In some embodiments, base 410 is transparent to light, for example to visible or UV radiation. In some embodiments, the height of barrier 450 ranges from about 10 µm to about 1000 µm; however, the height of barrier 450 is not a limitation of the present invention, and in other embodiments barrier 450 has any height. In some embodiments, the area of base 410 is in the range of about 0.25 mm² to about 900 cm²; however, the area of base 410 is not a limitation of the present invention, and in other embodiments the area of base 410 is smaller or larger. When barrier 450 is not a part of base 410, barrier 450 may include or consist essentially of a material similar to that or different from that of base 410. In some embodiments, barrier 450 may be a ring or stencil surrounding LEE 210.

The spacing between adjacent LEEs 210 identified as a spacing 405 in FIG. 4A may be adjusted to control the width of phosphor 230 around the sides of LEEs 210. In one embodiment, spacing 405 between LEEs 210 is approximately determined by the sum of twice the desired sidewall thickness 250 of the phosphor and the kerf (where the kerf is the width of the region removed during the singulation process of white dies 200, for example identified as kerf 470 in FIG. 4D). In other embodiments, as discussed herein, the spacing 405 is independent of the amount of phosphor 230 surrounding LEEs 210. The thickness of phosphor 230 over the LEEs 210 may be controlled by controlling a thickness 425 of phosphor 420 that is formed or dispensed. In one embodiment, thickness 260 of phosphor 230 over LEE 210 is given approximately by the thickness 425 less the thickness 445.

In some embodiments, the spacing 405 between LEEs 210 is in the range of about 0.10 mm to about 5 mm, or preferably in the range of about 0.2 mm to about 1.5 mm. In some embodiments, it is advantageous, in order to reduce cost, to reduce the spacing 405 between LEEs 210. In some embodiments, reducing spacing 405 between LEEs 210 permits the manufacture of more LEEs 210 per unit area, thus reducing the manufacturing cost. In some embodiments, it is advantageous, in order to reduce cost, to reduce the amount of phosphor 230 formed around each LEE 210. In some embodiments, this reduces the volume and thus the cost of the binder associated with each LEE 210.

The next step (step 330) in process 300 provides a phosphor (uncured or partially cured phosphor 420). In one embodiment, phosphor 420 includes or consists essentially of a phosphor and a binder. In some embodiments, the phosphor and binder are mixed prior to application, for example in a centrifugal mixer, with or without a partial vacuum over the mixture.

In the next step (step 340) in process 300, phosphor 420 is formed over base 410 and LEEs 210 as shown in FIG. 4B. In some embodiments, phosphor 420 is contained or bounded by surface 435 of base 410 and optional sides or barriers 450 as shown in FIG. 4B. In this example phosphor 420 has a bottom surface or face 460 and a top surface or face 440. In some embodiments surfaces 460 and 440 are substantially parallel to each other. In some embodiments surfaces 460 and 440 are substantially flat and parallel.

Phosphor 420 may be formed by a variety of techniques, for example casting, dispensing, pouring, injecting, injection, compression, transfer or other forms of molding, Mayer bar or draw-down bar, doctor blade, etc. The method of formation of phosphor 420 is not a limitation of the present invention. In some embodiments, base 410 is positioned such that surface 435 is level, such that when phosphor 420 is formed on base 410, surface 435, bottom surface 460 of phosphor 420 and top surface 440 of phosphor 420 are parallel or substantially parallel, forming a thin layer of phosphor 420 that has a uniform or substantially uniform thickness across all or most of the area of phosphor 420. In some embodiments, one or more barriers 450 are used to prevent or partially prevent the spread of phosphor 420. In some embodiments, surface 435 and barriers 450 form a mold for phosphor 420. In some embodiments, barriers 450 are portions of a separate component placed over base 410 surrounding LEEs 210. In some embodiments, barriers 450 are not used. Some embodiments of the present invention utilize a level base 410 and gravity to automatically produce phosphor layer 420 with a uniform or substantially uniform thickness. In one embodiment, the thickness uniformity of phosphor 420 is within about ±15%, within about ±10%, within about ±5% or within about ±1% or less. In one embodiment, phosphor 420 has a thickness in the range of about 5 µm to about 2000 µm, while in other embodiments the phosphor has a thickness in the range of about 50 µm to about 500 µm. In some embodiments, phosphor 420 includes or consists essentially of a phosphor and a binder and it may be desirable to adjust the concentration of the phosphor to permit the binder thickness to be relatively low, for example less than about 500 µm, or less than about 300 µm, or less than about 200 µm, in order to reduce the total volume of binder used and thus reduce the cost of the binder.

In one embodiment, the time between mixing phosphor 420 including or consisting essentially of binder and phosphor powder and forming phosphor 420 over base 410 is relatively short compared to the time required for settling of the powder in the binder, such that the phosphor and binder form a uniform and homogeneously distributed or substantially uniform and homogeneously distributed combination of phosphor powder in the binder. In one embodiment, the compositional uniformity of phosphor 420, that is the distribution of phosphor powder in the binder, is uniform to within about ±15%, within about ±10%, within about ±5% or within about ±1%. In some embodiments of mixtures of phosphor and powder, settling starts to occur within about 10 to about 30 minutes, while formation of phosphor 420 in over base 410 occurs within about 0.25 minute to about 5 minutes. In some embodiments, the structure shown in FIG. 4B is exposed to a partial vacuum to degas or remove all or a portion of any dissolved gases in phosphor 420, to reduce or eliminate the number of bubbles in phosphor 420. In some embodiments, phosphor 420 is exposed to a partial vacuum before formation on base 410. In some embodiments, phosphor 420 is formed over base 410 in a partial vacuum. In some embodiments of the present invention, base 410 is not level, resulting in phosphor 420 having a non-uniform thickness over base 410 and LEE 210, as discussed herein in more detail.

Figure 4C:
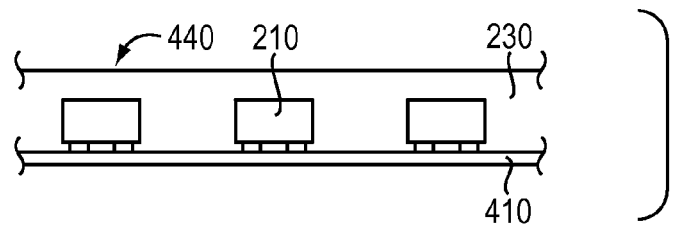

Phosphor 420 is then cured, producing cured phosphor 230 (step 350) as shown in FIG. 4C. Curing may include or consist essentially of heating, exposure to radiation of various sources, for example visible, UV and/or IR light, or chemical curing (i.e., introduction of a chemical agent that promotes cross-linking of the phosphor binder). In one embodiment, phosphor 420 is cured by UV or other radiation. In one embodiment, base 410 is held within the curing equipment prior to or just after step 350 of FIG. 3. In some embodiments of mixtures of binder and powder, settling starts to occur within about 10 to about 30 minutes, while curing of phosphor 420 over base 410 occurs within about 0.10 minute to about 5 minutes. In one embodiment, steps 340 and 350 may take less than about 30 minutes, less than about 10 minutes, less than about 5 minutes or less than about 1 minute. In some embodiments the curing step 350 includes or consists essentially of multiple sub-curing steps. For example, a first sub-curing step may be performed to "freeze" the phosphor particles in the matrix and this may be followed by a second sub-curing step to fully cure the binder. In some embodiments both the formation and curing process may occur within about 0.25 minute to about 7 minutes. In some embodiments both the formation and curing process may take less than about 4 minutes.

Figure 4D:
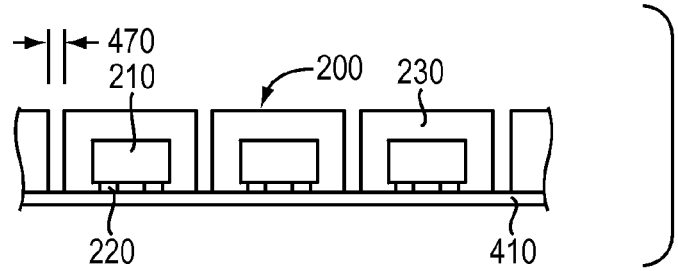

In step 360 from FIG. 3, white dies 200 are separated or singulated from the structure shown in FIG. 4C (i.e., a white wafer, white die wafer, or composite wafer), resulting in the structure shown in FIG. 4D. While FIG. 4D shows each white die 200 including one LEE 210, this is not a limitation of the present invention, and in other embodiments white die 200 includes more than one LEE 210. The singulation process results in separation into individual white dies 200, where each white die 200 features a portion of phosphor 230 and at least one LEE 210, as shown in FIG. 2A. Singulation takes place between LEEs 210; thus, in some embodiments, it is necessary to be able to align the singulation tool with the spaces, also called streets, between LEE 210. In some embodiments, the white wafer is mounted on a temporary substrate 430 with the contacts up, to permit relatively straightforward alignment of the singulation tool with LEE 210, to permit accurate singulation.

In some embodiments, white dies 200 may have a size ranging from about 0.15 mm to about 5 mm; however, the size of white dies 200 is not a limitation of the present invention. In some embodiments, the thickness of phosphor 230 surrounding LEE 210 may be substantially the same, for different size LEEs 210. In some embodiments, the size of white die 200 may increase by the incorporation of multiple LEEs 210. In some embodiments, the size of white die 200 including or consisting essentially of multiple LEEs 210 is determined by the size and number of LEEs 210 and the thickness of phosphor 230 surrounding each LEE 210, and in some embodiments the thickness of phosphor 230 surrounding each LEE 210 in a multiple-LEE white die 200 may be substantially the same as the thickness of phosphor 230 surrounding a single-LEE white die 200. For example, a white die including a large array of LEEs 210 may have a lateral dimension of at least 3 mm or at least 7 mm or at least 25 mm. For some white dies 200, separation may be optional, for example in the case of large arrays of LEEs 210. Separation of phosphor 230 may be performed by a variety of techniques, for example laser cutting, cutting with a knife, die cutting, dicing, saw cutting, water jet cutting, ablation, or the like. In some embodiments, the kerf may be below about 200 μm or below about 100 μm or below about 50 μm or even below 25 μm. In some embodiments, the smaller the kerf, the larger number of white dies 200 that can be manufactured in a unit area—thus decreasing the kerf results in a reduction in cost. This permits very large arrays of white dies 200 to be formed in a relatively small area with relatively high throughput and relatively low cost. In preferred embodiments, the process to form the phosphor over and around the LEEs is controlled to produce a relatively repeatable and uniform phosphor thickness, resulting in uniform optical characteristics. The ability to form a very large number of white dies 200 from a relatively small area of phosphor, in a relatively short time, to avoid or minimize settling of the phosphor powder in the binder, coupled with the relatively high thickness uniformity, leads to very large arrays of white dies 200 having relatively narrow distribution of optical characteristics, such as chromaticity, color temperature, color rendering index (CRI), luminous flux, etc. and very low manufacture cost. In one embodiment, an entire wafer of LEEs 210 may be batch processed simultaneously using this approach. For example in some embodiments LEEs 210 may be produced in wafer form, for example on a 2" or 4" or 6" or 8" diameter wafer. After LEEs 210 are fabricated and singulated (here singulation refers to singulation of the wafer on which LEEs 210 are formed), they may be transferred to mold substrate 410 for further processing detailed herein (e.g., to form white dies). In some embodiments, the entire wafer amount of LEEs 210 may be transferred in batch mode (i.e., together) to mold substrate 410. In other embodiments, LEE 210 may be transferred to mold substrate 410 die-by-die or in groups of dies.

In some embodiments, separation (i.e., of the white dies) takes place before removal from base 410 while in other embodiments base 410 is removed before separation, as discussed in more detail herein. In some embodiments, phosphor 230 includes or consists essentially of only a transparent binder that is transparent to a wavelength of light emitted by LEE 210.

Figure 4E:
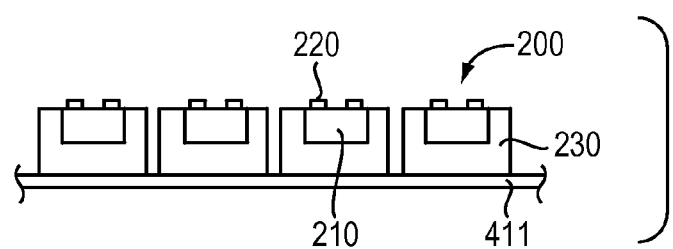

In some embodiments, the structure shown in FIG. 4D may be transferred to another substrate 411 such that contacts 220 are accessible, as shown in FIG. 4E. Such a transfer may be performed using transfer tape, a pick-and-place tool with a die flipper or any other technique. In some embodiments this transfer may be done in batch mode, while in other embodiments it may be done die-by-die or in groups of dies. In some embodiments the transfer may be performed before singulation of the white die wafer. The result of this process is a white die 200, as shown in FIGS. 2A and 2B. The process provides a batch method to produce dies integrated with phosphor, with uniform phosphor over each die, in a cost-effective way, before the dies are placed or integrated into any kind of package or onto a circuit board.

White dies 200 may then be removed from base 410 for placement in a package. In some embodiments, white dies 200 may be used as is, without a package, for example by mounting on a flexible or rigid circuit or wiring board or in other lighting of illumination systems. White dies 200 may be placed in different orientations, for example those shown in FIG. 4D or FIG. 4E.

Figure 5:
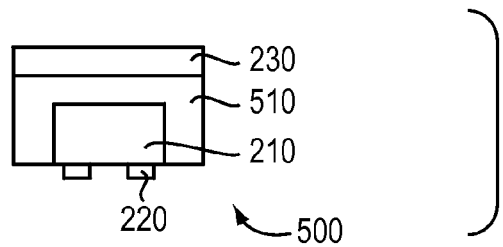
FIG. 5 is a cross-sectional schematic of a white die in accordance with various embodiments of the invention.

In one embodiment, only one phosphor 420 is used; however, this is not a limitation of the present invention, and in other embodiments a plurality of phosphors are used. In one embodiment, phosphor 420 may include or consist essentially of a plurality of different phosphor powders. In one embodiment, a first phosphor 420 is deposited and cured or partially cured, followed by the deposition and curing of one or more successive phosphors. In one embodiment, a binder is deposited and cured or partially cured, and the binder is transparent to a wavelength of light emitted by LEE 210 and/or phosphor 420 or 230, followed by the deposition and curing of one or more phosphor 420, to form a layered structure in which one or more layers have a phosphor composition, type and/or thickness different from each other. In this way, a remote-phosphor white die 400 may be fabricated, as shown in FIG. 5. FIG. 5 shows one embodiment of a remote phosphor white die 500, in which phosphor 230 is spatially separated from LEE 210 by a transparent binder or matrix material 510. In such a structure the extent of the overhang of the phosphor containing layer(s) 230 past the edges of LEE 210 may be varied to optimize the amount of light from LEE 210 that is absorbed by phosphor 230. Such an approach may also be used to form multiple layers of phosphor and/or transparent binder of LEE 210.

The following examples present some embodiments of the present invention. However these are not limiting to the method of manufacture or structure of the white die.

Example 1

In this example LEEs 210 are fabricated in wafer form (i.e., as portions of a semiconductor wafer). A wafer may include about 5000 or more LEEs 210. In some embodiments, a wafer includes over about 20,000, over 100,000, or over 500,000 LEEs 210. After fabrication of LEEs 210, LEEs 210 are tested and sorted into bins, as shown in steps 610, 620 of FIG. 6. Bins may include, for example emission wavelength, forward voltage, light output power or the like. The particular choice of one or more bins or range of values within the one or more bins is not a limitation of the present invention. In one embodiment, LEEs 210 are binned by emission wavelength. The process shown in FIG. 3 may then carried out on each bin of LEEs 210. The composition and amount of phosphor applied over base 410 and LEE 210 is determined in advance to achieve the desired color point, chromaticity, color temperature, CRI or other optical properties, based on the emission wavelength of each bin. In this embodiment, each bin may have a different composition and/or thickness of phosphor to achieve the desired optical properties. In one embodiment, the phosphor composition and thickness are adjusted based on the bin information to achieve a relatively more narrow distribution in optical properties (for example color temperature) than would be achievable without binning.

Figure 7:
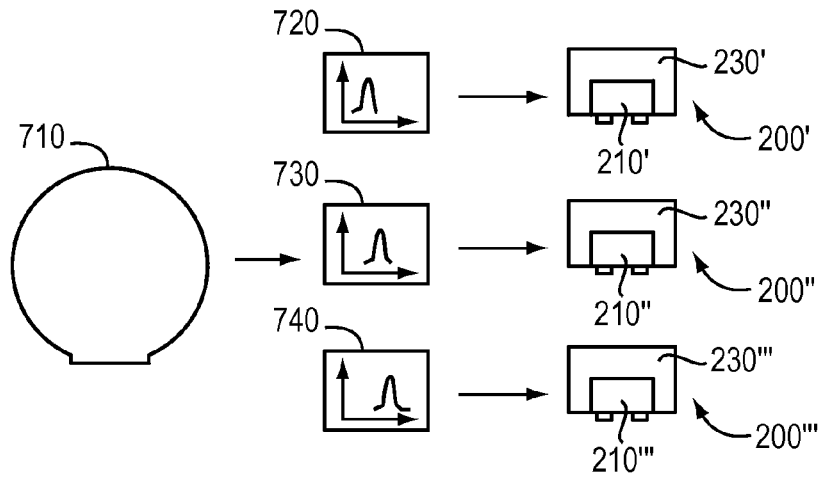
FIG. 7 is a schematic illustration of binned white dies having similar characteristics in accordance with various embodiments of the invention.

For example, in FIG. 7, wafer 710 represents a wafer containing the total distribution of characteristics from fabricated LEEs 210 from a wafer or growth run or series of growth runs as well as one or more process runs. During the growth or deposition process for the epitaxial structure, and subsequent fabrication steps to form LEEs 210, variation in optical and electrical properties may be introduced. LEEs 210 are tested and sorted into bins, where each bin has a relatively narrow distribution of one or more characteristics. For example, wavelength bins may have about 5 nm or about 2.5 nm distributions. Other examples of bins include forward voltage and light output power. Bins 720, 730 and 740 represent different bins, for example three different wavelength bins. In FIG. 7, the boxes representing bins 720, 730 and 740 have a small graph representing the distribution of dies with a particular characteristic in that bin. While three bins are shown in FIG. 7, this is not a limitation of the present invention, and in other embodiments fewer or more than three bins are utilized. LEEs 210 from each bin, designated 210', 210'' and 210''' are used to determine the characteristics of phosphor 230 (i.e., to achieve a final optical characteristic of the LEE and phosphor combination), resulting in a corresponding number of different phosphor mixes, identified as 230', 230'' and 230'''. This results in a corresponding number of bins of white die 200, designated 200', 200'' and 200'''. In this way a relatively larger percentage of the distribution of LEEs 210 from the entire manufacturing process may be fabricated into white dies 200 having a relatively narrow distribution of optical characteristics, for example color temperature.

A flow chart of this process is shown in FIG. 6. The LEEs 210 are first tested (step 610) and then sorted and separated into bins (step 620). One bin of LEEs 210 is chosen (step 630) and a phosphor is prepared to achieve the desired optical properties for that particular bin of LEEs 210 (step 640). This phosphor may include or consist essentially of one or more phosphor powders or light-conversion materials. Finally, in step 650, process 300 shown in FIG. 3 is carried out using the selected bin of LEEs 210 and phosphor prepared for that bin of LEEs 210. This may be repeated for the other bins.

Example 2

In this example LEEs 210 are fabricated in wafer form. A wafer may include over about 5000 or more LEEs 210. In some embodiments, a wafer may include over about 20,000 or over 100,000 LEEs 210. After fabrication of LEEs 210, LEEs 210 are tested, or some of LEEs 210 on each wafer are tested. In one embodiment, the process shown in FIG. 3 is then carried out on all LEEs 210 from the wafer. The composition and amount of phosphor applied over base 410 and LEE 210 is determined in advance to achieve the desired color point, color temperature, CRI or other optical properties, based on the test results of all or some LEEs 210 on that wafer. This phosphor may include or consist essentially of one or more phosphor powders or light-conversion materials.

In one embodiment of this example, there is no testing done on LEEs 210 prior to formation of the phosphor over LEEs 210. In one embodiment of this example, the starting wafer is applied to dicing tape, after which the wafer is singulated into LEEs 210. The tape has the ability to expand and is expanded to provide the required spacing between LEE 210 to achieve the desired size phosphor over LEEs 210. In one embodiment the spacing between LEEs 210 is approximately given by the sum of twice the sidewall thickness of the phosphor (thickness of the phosphor on the side of LEE 210) and the kerf. An example of such an expansion tape is SWT20+ manufactured by Nitto Denko.

If the singulation is performed with the contacts down on the tape, the tape may be used as base 410. If the singulation is performed with the contacts up (not adjacent to the tape), LEEs 210 may be transferred using transfer tape or other transfer methods. In the tape-transfer operation a second substrate or tape is applied to the exposed side (here contact side) of LEEs 210 and the first tape is removed. A variety of techniques may be used for such transfer, for example using tapes of different tack levels, thermal release tape and/or UV release tape. An advantage of this approach is that LEEs 210 are then positioned correctly on base 410 without any need for a serial pick-and-place process, saving time and money. In another embodiment, LEEs 210 may be placed on base 410 at the correct spacing, using semi-batch or serial techniques, for example pick-and-place.

FIGS. 8A-8D depict a schematic of one embodiment of this process. In FIG. 8A, tape 820 is applied to the back of wafer 810 (in this example the contacts are face up). FIG. 8B shows the structure of FIG. 8A at a later stage of manufacture. In FIG. 8B wafer 810 has been singulated, resulting in LEEs 210 on tape 820. The spacing 830 between LEE 210 is determined by the singulation process. In some embodiments, spacing 830 is in the range of about 15 µm to about 100 µm. FIG. 8C shows the structure of FIG. 8B at a later stage of manufacture. In FIG. 8C, tape 820 has been optionally expanded or stretched. Space 830, identified as space 830' after expansion, is set to the correct value for making white dies, as described above, by the expansion process. That is, tape 820 is expanded until the spacing between adjacent LEEs 210 is appropriate to make white dies 200 having a desired thickness of phosphor thereon. FIG. 8D shows the structure of FIG. 8C at a later stage of manufacture. In FIG. 8D a second tape 840 is applied to the contact side of LEE 210. Finally, first tape 820 is removed, leaving the structure shown in FIG. 4A, whereupon the process described above in FIG. 3 and shown in FIGS. 4A-4D may be carried out. In some embodiments, tape 840 is the base or mold substrate 410 shown in FIG. 4A.

Example 3

In this embodiment, the process starts with the structure shown in FIG. 4C or FIG. 4D. In some embodiments of this example, LEEs 210 have been binned, while in other embodiments LEEs 210 have not been binned or may have not been tested. In some embodiments of this example some of LEEs 210 have been tested. The process by which LEEs 210 are selected for the structure shown in FIG. 4C is not a limitation of the present invention. The structure shown in FIG. 4C may be called a white wafer or a white die wafer, featuring a plurality of LEEs 210 and phosphors 230 before singulation. The structure in FIG. 4D includes a plurality of white dies 200 on mold substrate 410.

White dies 200 are tested either in white wafer form (shown, for example, in FIG. 4C) or in singulated form (shown, for example, in FIG. 4D). As used herein, "white wafer" or "composite wafer" is a structure including or consisting essentially of phosphor 230 and LEEs 210 (e.g., as shown in FIG. 4C, not including base 410). Testing may be performed by applying a current and voltage to contacts 220 and measuring the emitted light. In one embodiment, contacts 220 are accessed for testing by probes or needles that poke or penetrate through tape 410. In other embodiments, testing is performed by first transferring the structure in FIG. 4C or white dies 200 in FIG. 4D to another carrier such that contacts 220 are face up and directly accessible. Such a transfer may be performed in a batch process, similar to that using transfer tape described in conjunction with FIGS. 8A-8D, or may be performed in a semi-batch process or a serial process, such as pick-and-place. Once the structure from FIG. 4C or white dies 200 are oriented with the contacts accessible, they may be tested using conventional test equipment, for example manual, semi-automatic or fully automatic test equipment that applies a current and voltage to LEEs 210, and measuring the light properties of white dies 200. In one embodiment, the white wafer of FIG. 4C or white die 200 of FIG. 4D may be processed in wafer form, similar to what is done with conventional semiconductor wafers. In some embodiments the white wafer may be sufficiently rigid for such processing, while in other embodiments an additional backing material or plate or carrier may be used provide additional rigidity so that the white wafer may be handled and tested in a fashion and using equipment similar to that used for semiconductor wafers.

In one embodiment, after testing, white dies 200 are physically sorted and binned. This results in multiple bins having different optical properties that may then be used for different products. In one embodiment, the bins correspond to different values of color temperature.

In one embodiment, after testing, white dies 200 are virtually sorted and binned. In accordance with preferred embodiments, virtual sorting and binning means that a map of the characteristics of each white die 200 is produced, and white dies 200 are put into, or assigned, to virtual bins based on their optical and/or electrical properties, for example color temperature or forward voltage. When using these virtually binned white dies 200 for products that require different characteristics, the bin map is used to select white dies 200 from the appropriate one or more bins for that particular product. The remaining white dies 200 from other bins may then be used in a different product at a different time. In one embodiment, white dies 200 are used without testing or binning.

In any approach, if the starting point of the process is the structure shown in FIG. 4C, the structure may be singulated to form white dies 200 before or after testing. Furthermore, before either physical or virtual white die 200 binning, the white wafers (FIG. 4C or 4D) may also be binned, either physically or virtually.

Example 4

Figure 9A:
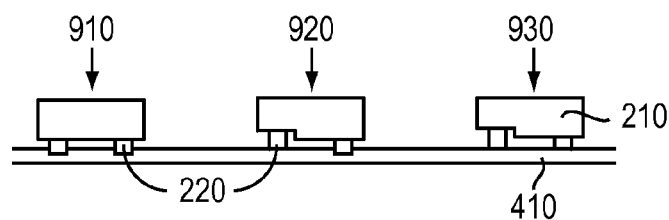
FIGS. 9A-9F are cross-sectional schematics of white dies in various stages of manufacture in accordance with various embodiments of the invention.
Figure 9B:
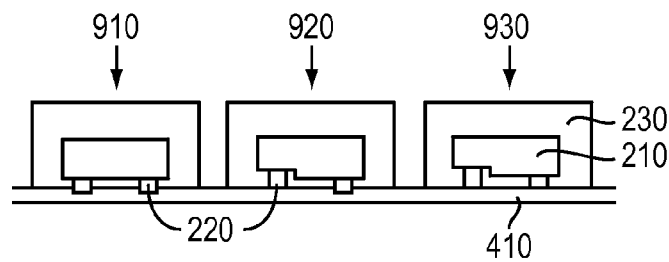
Figure 9C:
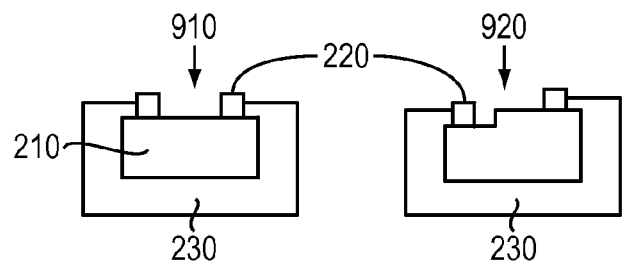

In one embodiment the body of LEE 210 stands above base or tape 410, as shown in FIG. 9A. After formation of the phosphor, the white die structure may include a portion of the phosphor around and covering all or a portion of the edges of the white die, as shown in FIG. 9B. An enlarged view of such a white die is shown in FIG. 9C. In some embodiments, base 410 is deformable or flexible such that portions of one or more contacts 220 are embedded into tape 410, as shown for structure 910. Structure 910 has coplanar contacts, but this is not a limitation of the present invention, and in other embodiments LEE 210 has non-coplanar contacts, as shown in structures 920 and 930. In some embodiments LEEs 210 may be tilted, as shown for structure 930 in FIG. 9A, resulting in a similar structure shown in FIG. 9C, but without the need for one or more contacts 220 to be partially or substantially embedded into base or tape 410.

Such a structure may result in enhanced yield. The reason for this is that the die-singulation process, i.e., where the semiconductor wafer is separated into individual dies, may result in chipping or other damage to the passivation at the edge of the dies. If the chipping or damage to the passivation at the edge permits exposure of underlying conductive semiconductor material, undesirable electrical coupling to this conductive semiconductor material may occur in the attachment process of a white die 210, resulting in poor device performance and/or shorting of the device.

Figures 9D, 9E:
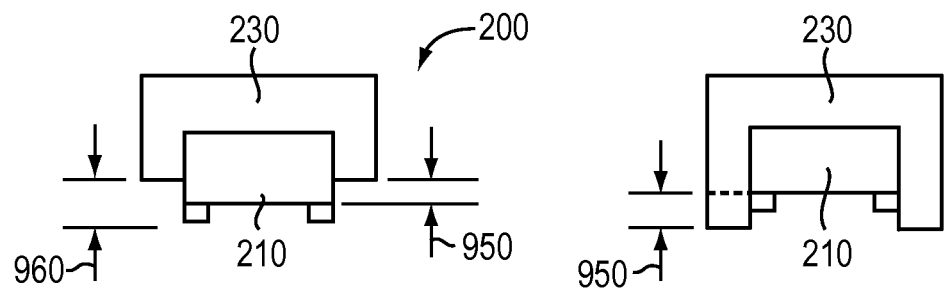

In some embodiments a portion of the body of LEE 210 is not covered with phosphor, as shown in FIG. 9D. FIG. 9D shows a white die 200, similar to that shown in FIG. 2A, but with a portion of the sidewall of the body of LEE 210 not covered in phosphor. The extent that LEE 210 extends beyond the edge of phosphor 230 may be identified as the die relief 950. In some embodiments the die relief is positive, as shown in FIG. 9D, but in other embodiments the die relief may be substantially zero, as shown in FIG. 2A or even negative, as shown in FIG. 9E. In some embodiments, the die relief may be in the range of about 0 to about 30 µm. Another dimension that may be advantageously controlled is the contact relief 960. The contact relief 960 is the amount that the contact protrudes from the adjacent surface of the phosphor. In some embodiments, the die relief may be substantially zero and the contact relief is positive. In preferable embodiments, the contact relief is positive. In some embodiments, both the die and contact relief are positive. In some embodiments, the contact relief is positive and in the range of about 1 µm to about 15 µm.

In some embodiments, phosphor 230 absorbs a portion of light emitted by LEE 210 and re-emits it at one or more different wavelengths and the combination of light emitted by LEE 210 and phosphor 230 define one or more optical characteristics of structure 200, for example color temperature, color rendering index (CRI) or the like. In some embodiments, it is advantageous to control the die relief and/or contact relief such that multiple white dies 200 have the same or substantially the same optical characteristics. For example, in some embodiments, if the die relief is relatively large, then a relatively larger proportion of light emitted by LEE 210 may be observed directly, without passing through phosphor 230; thus, in some embodiments a relatively small positive die relief is advantageous because it reduces the amount of light emitted directly from LEE 210 that does not pass through phosphor 230. In some embodiments, the die relief may be in the range of about 0 to about 30 µm, while in other embodiments the die relief may be in the range of about 0 to about 10 µm or 0 to about 5 µm. In some embodiments the die relief is less than about 20% of the height of LEE 210, while in other embodiments the die relief is less than about 10% or even less than about 5% or less than about 1% of the height of LEE 210. In some embodiments, it may be advantageous to reduce the variation in die relief within a white wafer and/or between white wafers because it reduces the variation in one or more optical characteristics of the white dies. In some embodiments, the variation in die relief is less than about 25%, or less than about 10% or less than about 5%, or even less than about 1%.

A positive contact relief is advantageous from the perspective of making electrical contact to contacts 220. If the contact relief is negative, it may be difficult to make electrical contact to contacts 220, for example between contacts 220 and conductive traces or pads on an underlying substrate. In some embodiments, the contact relief is positive and in the range of about 0 to about 30 µm. In some embodiments, the contact relief is positive and in the range of about 1 µm to about 8 µm. In some embodiments, the contact relief is at least the height of contacts 220; that is, the height that contacts 220 extend above the surrounding surface of LEE 210.

In some embodiments, the die relief and contact relief values are related. For example, in the embodiment shown in FIG. 9D, the contact relief is approximately given by the sum of the die relief and the height of the contact, where the contact height is the amount that the contacts extend above the surface of LEE 210. In some embodiments, the contact relief and/or die relief may be determined or optimized and controlled to minimize the amount of light emitted by LEE 210 that does not pass through phosphor 230 while providing sufficient contact and/or die relief to produce a reliable and robust electrical contact to LEE contacts 220, as well as to produce a reliable and robust mechanical attachment of the structure 200, for example to an underlying substrate or circuit board.

Figure 9F:
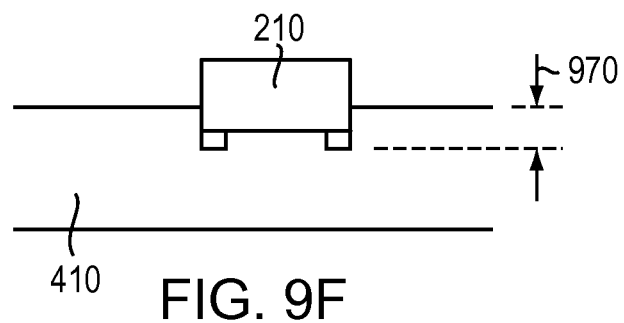

In some embodiments, it is advantageous to control the variation in die relief and/or contact relief on a white wafer or from white wafer to white wafer, for example in some embodiments the variation in die and/or contact relief is less than about 30%, or less than about 15% or less than about 10%. Die and/or contact relief may be controlled by a number of different techniques. In some embodiments LEEs 210 are partially embedded in mold substrate 410, as shown in FIG. 9F. The amount of relief 970 (here relief may refer to either die or contact relief or the combination) may be determined by the value of dimension 970 that LEE 210 is embedded in mold substrate 410, as shown in FIG. 9F.

Example 5

Figure 10A:
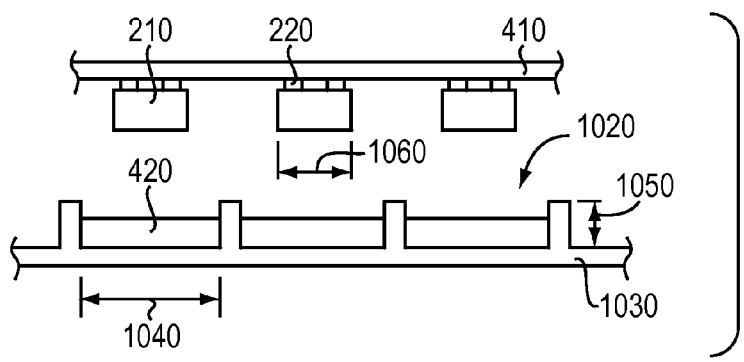
FIGS. 10A-10D and 11 are cross-sectional schematics of process steps utilized to fabricate white dies in accordance with various embodiments of the invention.
Figure 10B:
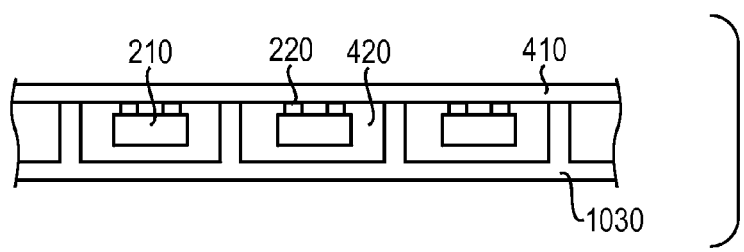
Figure 10C:
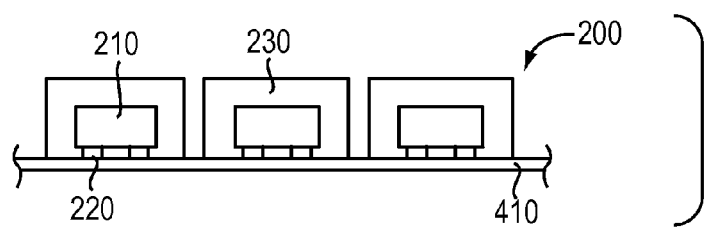
Figure 10D:
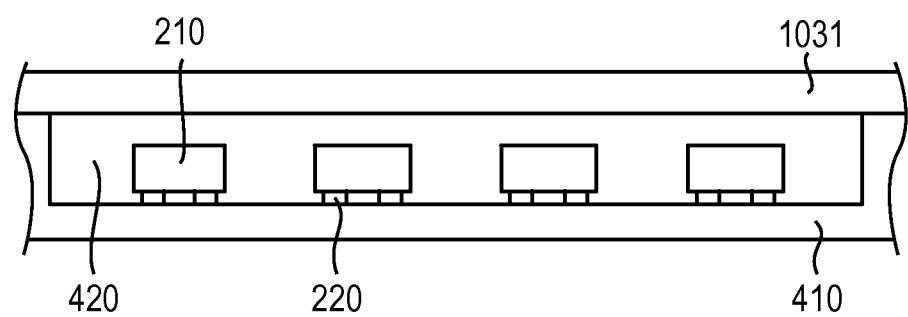

FIGS. 10A-10C depict another technique for fabricating white dies 200 in accordance with various embodiments of the present invention. In such embodiments LEEs 210 are attached to a mold substrate or temporary carrier 410 with the contacts adjacent to temporary carrier 410. A mold 1030 includes or consists essentially of one or more compartments, depressions, or wells 1020 into which LEEs 210 will be inserted or partially inserted or over or under which LEEs 210 will be suspended (for example, if barriers separating the compartments do not extend sufficiently far to form fully closed compartments). In another embodiment wells 1020 are formed by insertion of a template into an open mold (such as that shown in FIG. 4B). Wells 1020 are filled or partially filled with phosphor 420, for example by dispensing, by the doctor blade method, stencil printing, or by other means. Following formation of phosphor 420 in wells 1020, temporary carrier or base 410 is mated with mold 1030 such that LEEs 210 are fully or partially immersed in phosphor 420, as shown in FIG. 10B. Contacts 220 are adhered to temporary carrier 410, preventing phosphor 420 from covering at least a portion of contacts 220. In one embodiment phosphor 420 is introduced or injected into wells 1020 after mold 1030 is mated with base 410. In one aspect of this embodiment, a partial vacuum may be used to enhance transport of phosphor 420 to all wells 1020 and to partially or fully degas phosphor 420 before curing. The process may include or consist essentially of injection molding, transfer molding, compression molding, casing etc. Compression molding may be carried out using equipment such as a FFT-103 manufactured by Towa Corporation. In some embodiments, mold 1030 is flat, i.e., effectively including only one depression 420 into which fits multiple LEEs 210. In one embodiment, the structure of FIG. 10B is flipped, with base 410 on the bottom and mold 1030 on top, such that phosphor 420 is formed over base 410 and LEE 210, over which a top portion 1031 of the mold 1030 is formed and in one embodiment of this example mold 1030 is a flat surface. For example, the structure of FIG. 4B may be filled or over-filled with phosphor 420, after which a mold top or cover 1031 is applied, as shown in FIG. 10D. The shape of mold 1030 is not a limitation of the present invention and in other embodiments mold 1030 has any shape. In some embodiments, both base 410 and mold 1030 have raised barriers or sidewalls. As discussed herein, a pattern, roughness or texture in all or a portion of the outer surface of phosphor 230 may be formed by introducing those features into the surface of all or portions of the surface of the mold. In some embodiments, different LEEs 210 on base 410 have differently shaped phosphors formed around them.

In some embodiments all or a portion of mold 1030 is covered by a mold release material. In some embodiments the mold release material is a mold release film. In some embodiments the mold release material or mold release film may be patterned, roughened or textured to, e.g., impart similar features on all or portions of the outer surface of phosphor 230. In some embodiments the mold release material or mold release film may be smooth or substantially smooth.

After curing of phosphor 420 and removal from mold 1030, the structure is as shown in FIG. 10C. FIG. 10C shows white dies 200 with phosphor 230 covering the sides and bottom of LEEs 210, with contacts 220 of LEEs 210 adhered to temporary carrier 410 and not covered with phosphor 230. For the purpose of clarity, the details of die and contact relief are not shown in FIGS. 10A-10C or FIG. 11. In one embodiment, temporary carrier 410 includes or consists essentially of tape or film, as discussed above, from which white dies 200 may be picked for placement in a lighting or other system. The width 250 of phosphor 230 (FIG. 2A) around the edges or sides of LEEs 210 may be controlled by controlling the width 1040 of depression 1020 relative to the size of LEE 210. In one embodiment, the thickness of phosphor 230 on the sides of LEE 210 is approximately given by one-half of the difference between width 1040 and the width 1060 of LEE 210. (The width 1060 of LEE 210 may not be constant in all dimensions.) In one embodiment the thickness 260 of phosphor 230 (FIG. 2A) over LEE 210 may be controlled by controlling the depth 1050 of depression 1020 relative to the thickness of LEE 210. In one embodiment the thickness 260 of phosphor 230 (FIG. 2A) over LEE 210 may be controlled by various operational parameters of the molding process, for example the amount of phosphor present during the phosphor formation step. In some embodiments the thickness 260 of phosphor 230 (FIG. 2A) over LEE 210 is controlled by more than one factor. In one embodiment, thickness 260 is approximately the depth 1050 of well 1020 less the height 445 of LEE 210 above base 410 (FIG. 4B). In some embodiments where a plurality of LEEs 210 are formed in each depression, or where mold 1030 has only one depression, white die 200 may include a plurality of LEEs 210 or white die 200 may be formed by singulation of phosphor 230. In other words, the structure shown in FIG. 4C may also be produced by a molding process.

Figure 11:
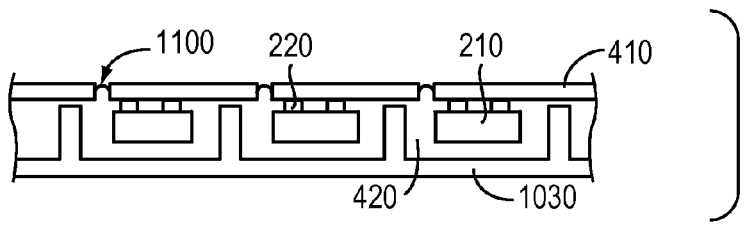

In some embodiments, excess phosphor 420 may be squeezed out into the region outside of the mold, for example outside of depression 1020, between base 410 and mold 1030. In one embodiment of this example, one or more portions of the mold have one or more openings or through-holes 1100 that provide an overflow pathway for phosphor 420 during the mating process, as shown in FIG. 11. Phosphor 420 is formed in wells 1020 as discussed above. When base 410 and mold 1030 are mated, hole 1100 provides a pathway for excess phosphor 420 to escape, thereby permitting the manufacture of white die 210 with wells 1020 completely or substantially full of phosphor, without excess phosphor squeezing out the sides of the mold. In some embodiments, this provides improved control of the thickness of phosphor 230 as well as a more reproducible manufacturing process. This approach may be applied to other embodiments, for example that shown in FIG. 10D, or in configurations where phosphor 420 is formed in the mold after mating of base 410 and mold 1030. As discussed previously, control of phosphor thickness 260 and 270 may be very important to maintaining uniform optical characteristics. In the arrangement discussed here the phosphor thickness may be controlled by the dimensions of well 1020, which is independent of the process parameters for dispensing or forming phosphor 420 in well 1020. In this embodiment a small excess of phosphor 420 is formed in well 1020, and when base 410 is brought into contact with mold 1030, excess phosphor 420 may move into hole 1100. After mating of tape 410 and mold 1030, phosphor 420 may be cured to form, and the amount of phosphor over LEE 210 is controlled by the geometry of the structure, rather than by the formation or dispense parameters. In one embodiment, base 410 and mold 1130 are held together by vacuum or pressure during all or a portion of the cure operation. In some embodiments phosphor 420 is injected into the mold through holes 1100.

Figure 12E:
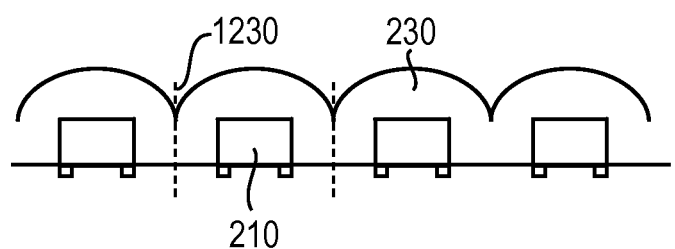
FIGS. 12A-12F are cross-sectional schematics of white dies in accordance with various embodiments of the invention.
Figure 12F:
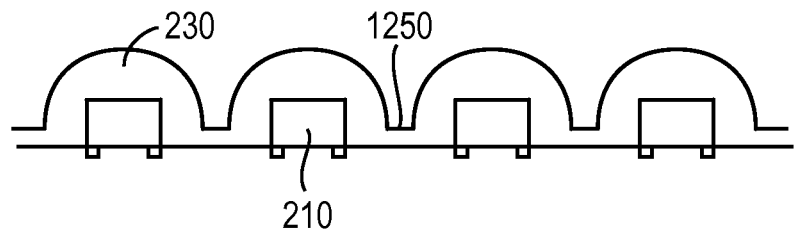

While FIG. 10C shows white dies 200 as completely separated after the mold process, without any additional singulation process, this is not a limitation of the present invention and in other embodiments white dies 200 may be connected together by a thin web of phosphor 230 as a result of the mold process as discussed herein in reference to FIG. 12F. In some embodiments the web may have a thickness in the range of about 5 µm to about 200 µm. In some embodiments white dies 200 may be shaped, as discussed below, but connected after molding, and require a subsequent singulation process.

Example 6

Figure 12A:
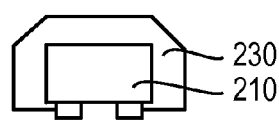
Figure 12B:
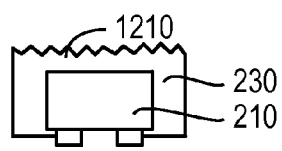
Figure 12C:
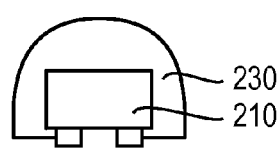
Figure 12D:
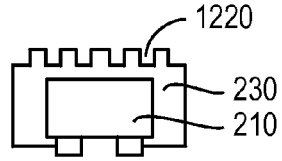

Example 6 is very similar to Example 5, with the difference that well 1020 in mold 1030 may be modified to have any arbitrary shape. Such shaping may be done, for example, to improve light extraction. FIGS. 12A-12D depict several embodiments of white dies 200 that may be fabricated with a shaped mold. The structure of FIG. 12A has a substantially flat top and a reduced amount of phosphor over the corners of LEE 210 than over the center of LEE 210. The structure of FIG. 12B has a non-smooth, for example textured, rough, or patterned, surface 1210. In one embodiment, the non-smooth surface 1210 reduces total internal reflection (TIR) within phosphor 230 and achieves improved light extraction. In one embodiment surface 1210 may have a periodic structure; however, this is not a limitation of the present invention, and in other embodiments the structure may be random. In one embodiment surface 1210 may include light extraction features (e.g., raised bumps and/or depressions) having a dimension in the range of about 0.25 µm to about 15 µm. In one embodiment the light extraction features may be hemispherical or pyramidal in shape; however, this is not a limitation of the present invention, and in other embodiments the light extraction features may have any shape. In one embodiment the light extraction feature is a random texture or roughness with an average roughness in the range of about 0.25 µm to about 15 µm. In the structure of FIG. 12C, the phosphor is shaped in a rounded shape. Such a rounded shape may be a hemisphere, a paraboloid, a Fresnel optic or any other shape. The structure of FIG. 12D has a photonic crystal 1220 formed on the top surface. In one embodiment, the photonic crystal 1220 increases the intensity of light exiting white die 200 in a specific direction, for example perpendicular to the face of white die 200. In other embodiments, a photonic crystal is formed on all or a portion of any surface of white die 200. FIG. 12E shows a portion of a white wafer having contiguous molded shapes over LEEs 210. In some embodiments the structure shown in FIG. 12E may produce relatively more white dies 200 per unit area than the structure shown in FIG. 12F, and this may be advantageous from a manufacturing cost point of view. In some embodiments the structure of FIG. 12E is singulated, for example at the joining line 1230 to form individual white dies 210. As shown in FIG. 12F, the shaped phosphors 230 may be connected by a thin region 1250. In some embodiments region 1250 may be advantageously minimized to reduce the consumption of unused phosphor, for example by minimizing the thickness and/or lateral extent of region 1250. However, this is not a limitation of the present invention, and in other embodiments region 1250 may have any shape or size or may be absent, as described herein.

In one embodiment the phosphor may be shaped by forming a white die as shown in FIG. 2A or a white die wafer as shown in FIG. 4C and then removing one or more portions of the phosphor to produce a shape different from the starting shape. Removal of one or more portions of the phosphor may be accomplished using a variety of means, for example knife cutting, dicing, laser cutting, die cutting, or the like.

Example 7

Figure 13A:
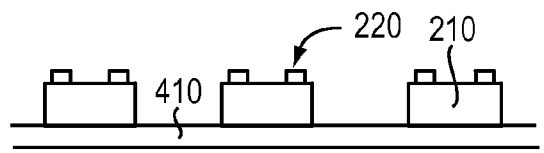

In this embodiment of the present invention, the process starts with providing base 410, as described above. In one embodiment, base 410 includes or consists essentially of a film or tape. In one embodiment, base 410 includes or consists essentially of an adhesive tape, for example an adhesive tape where the adhesive is, for example a thermal release adhesive, a UV release adhesive, a water-soluble adhesive or the like. LEEs 210 are then formed or placed on or over base 410, as shown in FIG. 13A. In this example, LEEs 210 are placed such that contacts 220 are face up, i.e., not adjacent to base 410, in contrast to previous examples in which contacts 220 were placed on base 410.

Figure 13B:
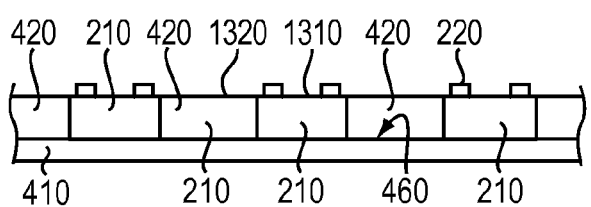

FIG. 13B shows the structure of FIG. 13A at a later stage of manufacture. After placing LEEs 210 on base 410, phosphor 420 is provided, as described above, and formed over LEEs 210 and base 410. As shown in FIG. 13B, the phosphor level is coplanar, or substantially coplanar with surface 1310 of LEE 210, leaving contacts 220 exposed. In other embodiments, the phosphor level may be controlled to achieve a desired contact and/or die relief. Phosphor 420 may be formed by a variety of techniques, for example dispensing, pouring, injecting, molding, etc. The method of formation of phosphor 420 over LEEs 210 and base 410 is not a limitation of the present invention. In some embodiments, base 410 is positioned such that a surface 1310 of the LEE 210 is level, such that when phosphor 420 is formed over base 410, surface 1310 and surface 460 are parallel or substantially parallel, forming a thin layer of phosphor 420 that has a uniform or substantially uniform thickness across all or most of the area of phosphor 420. In some embodiments, formation of phosphor 420 is accomplished using a Mayer bar or draw-down bar, to achieve a uniform layer of phosphor 420. However it is formed, in one aspect of the present invention a level mold and gravity are used to automatically produce phosphor layer 420 with a uniform or substantially uniform thickness. In other aspects of this invention, the uniform or substantially uniform thickness is achieved through a molding process, as discussed above. In one embodiment, the thickness uniformity of phosphor 420 is within about ±15%, within about ±10%, within about ±5% or within about ±1%. In one embodiment, phosphor 420 has a thickness in the range of about 1 µm to about 2000 µm; however, the thickness of phosphor 420 is not a limitation of the present invention, and in other embodiments phosphor 420 is thinner or thicker.

As shown in FIG. 13B, in one embodiment a surface 1320 of phosphor 420 is coplanar or substantially coplanar with surface 1310 of LEEs 210. In this example phosphor 420 covers all or substantially all of the sidewalls of LEE 210. In one embodiment, phosphor 420 is formed on base 410 to such a level. In another embodiment, phosphor 420 is formed over top surface 1310 of LEE 210 and a portion of phosphor 420 (or phosphor 230 after curing) is subsequently removed to provide electrical access to contacts 220. In another embodiment, phosphor 420 is formed below top surface 1310 of LEE 210, for example to achieve positive die relief. In one embodiment the amount of die relief may be controlled by varying the level of phosphor 420 relative to top surface 1310 of LEE 210.

Phosphor 420 is then cured or partially cured, where cured phosphor is identified as cured phosphor 230. Curing may include or consist essentially of heating, exposure to radiation of various sources, for example visible, UV and/or IR light, or chemical curing, as discussed previously. In one embodiment, phosphor 420 is cured by UV or other radiation and base 410 is transparent to such radiation.

Figure 13C:
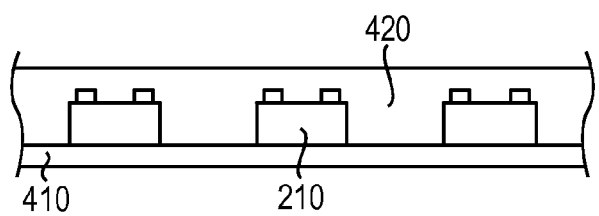
Figure 13D:
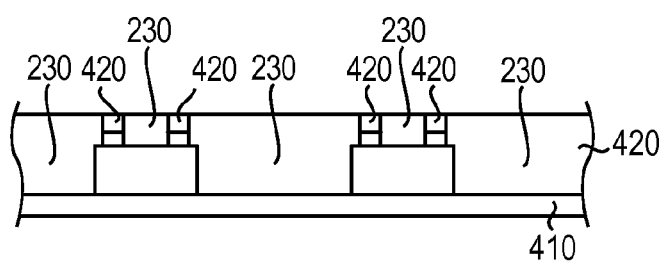
Figure 13E:
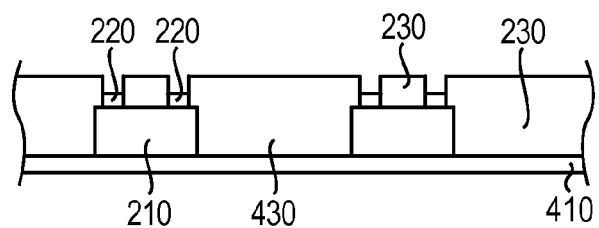

In one embodiment, phosphor 420 includes or consists essentially of a light-cured binder. In this embodiment, phosphor 420 is initially formed to a height above that of LEE 210, as shown in FIG. 13C. Exposure of phosphor 420 to light (exposure radiation) through the back side of LEE 210, which is transparent or partially transparent to such light, (that is the side opposite that to which LEE 210 are attached) will cure phosphor 420 except for portions over contacts 220, where contacts 220 are opaque or substantially opaque to such exposure radiation, as shown in FIG. 13D. The uncured phosphor 420 may then be removed, providing access to contacts 220 for electrical coupling, as shown in FIG. 13E. Cured phosphor 230 then covers all of LEE 210 except for opaque or substantially opaque contacts 220. If the surface of LEE 210 outside of contacts 220 is covered or partially covered with a material opaque or partially opaque to the exposure radiation, for example with a mirror or other reflective material, then phosphor 420 that was situated above the opaque or partially opaque region will not be exposed to light and will also be removed.

Figure 13F:
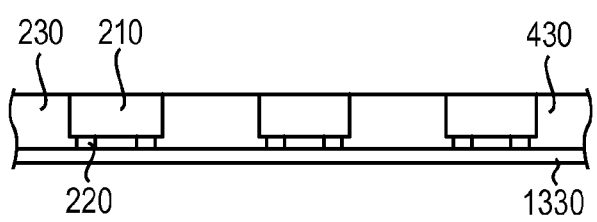

The structures shown in FIG. 13B or 13E may be used at this point or singulated and used at this point in the process. However, these structures typically do not have the face opposite the contact face covered with phosphor. This may result in undesirably high blue emission in the spectra and/or loss of total emitted light and thus a reduction in efficiency. Several methods may be used to form white dies that are more completely encased in phosphor. In a preferred embodiment, the structures shown in FIG. 13B or 13E are transferred to second base 1330, for example using transfer methods described previously, such that contacts 220 are adjacent to second base 1330, as shown in FIG. 13F.

In some embodiments, second base 1330 is similar to or the same as base 410. After this transfer process, one or more additional layers of phosphor 420' may be formed over the structure shown in FIG. 13F, as shown in FIG. 13G. Phosphor 420 is then cured and the dies may be separated, as discussed above, resulting in the white die 1410, as shown in FIG. 14A. White die 1410 is similar to white die 200 shown in FIG. 2A, with the difference that the encasing phosphor is formed in at least two steps for white die 1410, while only one step may be required for phosphor formation of white die 200. FIG. 14A shows an example of a white die 1410 in which both portions of phosphor 230 (cured phosphor) are the same while FIG. 14B shows an example of a white die 1410' in which phosphor 230 is different from phosphor 230'. White die 1410 and 1410' in FIGS. 14A and 14B show two portions of phosphor 230 (or 230'); however, this is not a limitation of the present invention, and in other embodiments phosphor 430 may be composed of more than two portions or layers.

Figure 14C:
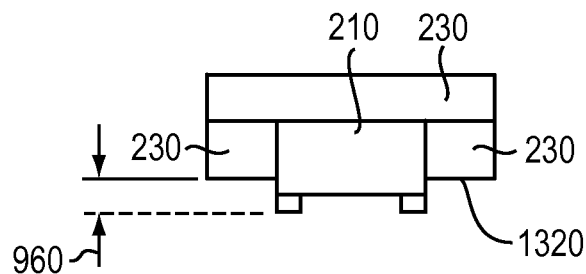

FIG. 14C shows a structure similar to those shown in FIGS. 14A and 14B, but in a preferable embodiment in which a surface 1320 of phosphor 420 is above the bottom surface of LEE 210 to generate a positive contact and/or die relief.

Example 8

Figure 15D:
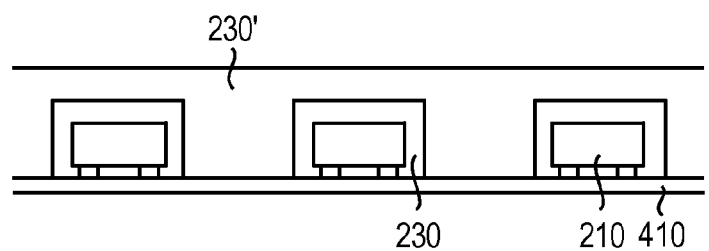
Figure 15E:
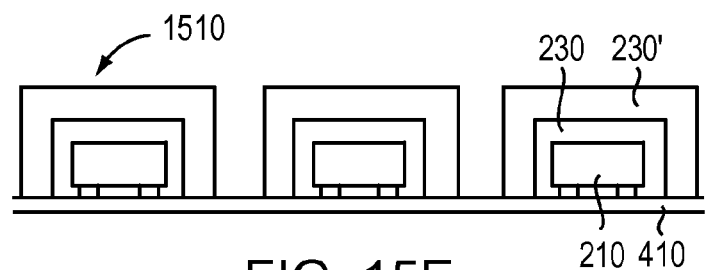

In this example, white die 1510 includes multiple conformal, substantially conformal or semi-conformal phosphor coatings, as shown in FIG. 15E. The process to make white dies 1510 starts with the structure shown in FIG. 15A, featuring base 410 and LEEs 210 mounted over base 410 with contacts 220 adjacent to base 410. A stencil, mold, template, barrier or other structure, identified as barrier 1520 in FIG. 15B, is then formed over base 410 in between LEEs 210. Phosphor 420 is then formed in the regions between barriers 1520, as shown in FIG. 15B. Phosphor 420 is then cured or partially cured and barrier 1520 removed (after partial or full curing of phosphor 420) leaving the structure shown in FIG. 15C. Each of the structures in FIG. 15C is basically white die 210, but manufactured in a different process than described above. In another embodiment, the structure of FIG. 15C is formed in other ways, for example by starting with a structure similar to that shown in FIG. 4C and removing a portion of phosphor 230 between LEEs 210. Removal of phosphor 230 may be done by a variety of techniques, for example cutting, laser ablation, laser cutting, etching, sandblasting or the like. The method of removal of phosphor 230 is not a limitation of the present invention.

FIG. 15D shows the structure of FIG. 15C at an optional later stage of manufacture. In FIG. 15D, phosphor 230' has been formed over the structure of FIG. 15C. In some embodiments phosphor 230' is the same as phosphor 420 or phosphor 220, while in other embodiments phosphor 230' is different from phosphor 420 or phosphor 220. Phosphor 230' is then cured or partially cured, forming cured phosphor 230' and resulting in the structure of FIG. 15D. FIG. 15E shows the structure of FIG. 15D at a later stage of manufacture in which white dies 1510 are formed by separation of phosphor 230'. FIG. 15E shows two layers or levels of phosphor, 230 and 230'; however, this is not a limitation of the present invention, and in other embodiment, more than two layers or levels of phosphor are utilized. In some embodiments, the layer of phosphor closest to LEE 210 includes or consists essentially of a transparent binder and no phosphor. FIG. 15E shows each layer or level of phosphor having substantially the same conformal shape around LEE 210; however, this is not a limitation of the present invention, and in other embodiments the shape of each phosphor layer or level is different, for example as shown in FIGS. 12A-12D. In some embodiments, different layers of phosphor serve different purposes, for example to improve light extraction from LEE 210 and/or phosphor 230 or to convert light from LEE 210 to a different wavelength.

Figure 15F:
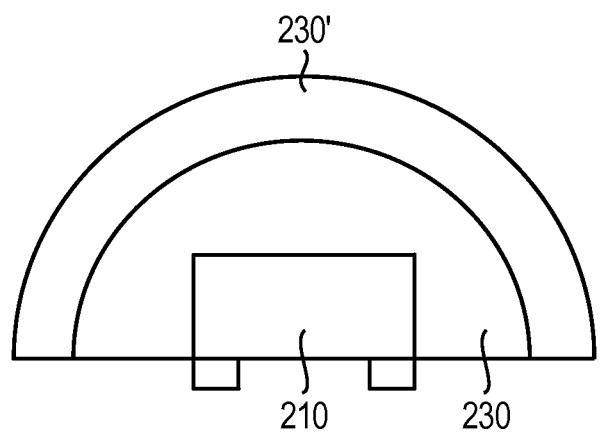
FIGS. 15F and 15G are cross-sectional schematics of white dies in accordance with various embodiments of the invention.
Figure 15G:
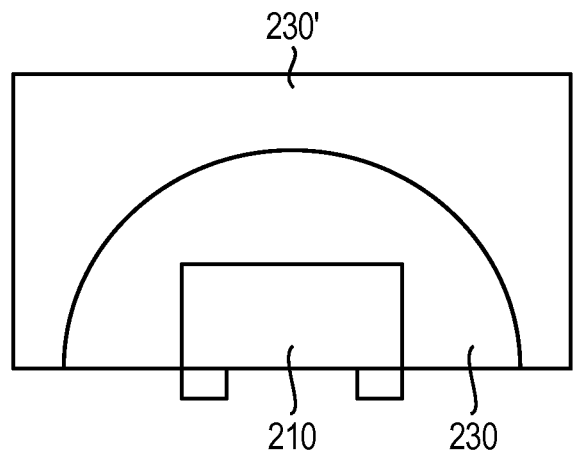

While FIGS. 15A-15E show an example of multiple phosphor coatings having a rectangular solid volume, this is not a limitation of the present invention, and in other embodiments multiple shaped coatings may be formed, as shown in FIG. 15F. While FIGS. 15A-15E show an example of multiple conformal phosphor coatings (i.e., each coating having the shape of the previous one thereunder), this is not a limitation of the present invention, and in other embodiments the various coatings are not conformal, as shown in FIG. 15G.

Example 9

Figure 16A:
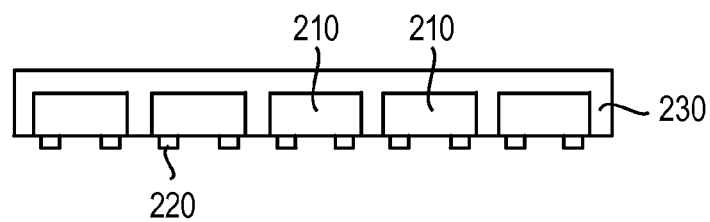
FIGS. 16A-16C are a schematic cross-sectional schematic (FIG. 16A) and schematic bottom views (FIGS. 16B and 16C) of white dies in accordance with various embodiments of the invention.
Figure 16B:
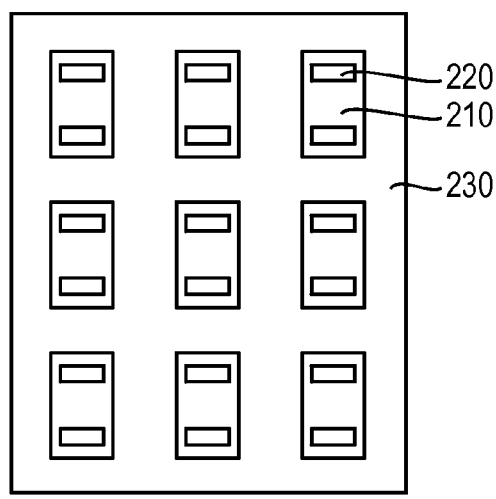
Figure 16C:
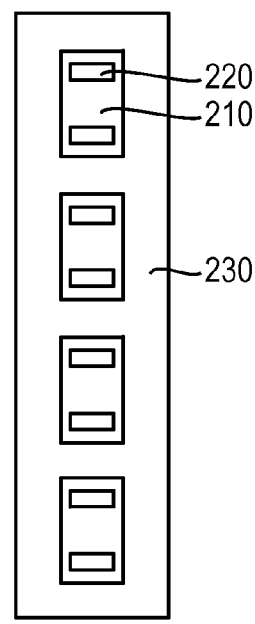

This example uses a process similar to that discussed with reference to FIG. 4D. However, in this example, instead of one LEE 210 per white die 200, this embodiment features a plurality of LEEs 210 in each white die 200. FIGS. 16A-16C show several examples of white dies 1610 each featuring a plurality of LEEs 210. FIG. 16A shows a cross-sectional view of a multi-LEE white die comprising five LEEs 210. FIG. 16B shows a plan view of a multi-LEE white die comprising nine LEEs 210 in a 3×3 array. FIG. 16C shows a plan view of a multi-LEE white die comprising four LEEs 210 in a 1×4 array. The examples in FIG. 16A-16C show rectangular white dies; however, this is not a limitation of the present invention, and in other embodiments the white die are square, triangular, hexagonal, round or any other shape. The examples in FIG. 16A-16C show LEEs 210 in a regular periodic array; however, this is not a limitation of the present invention, and in other embodiments LEEs 210 are arrayed or spaced in any fashion.

Example 10

Figure 17A:
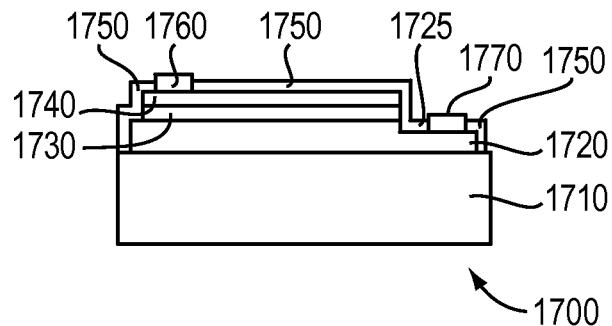
FIGS. 17A and 17B are, respectively, a cross-sectional schematic and a plan-view schematic of a light-emitting element utilized in white dies in accordance with various embodiments of the invention.
Figure 17B:
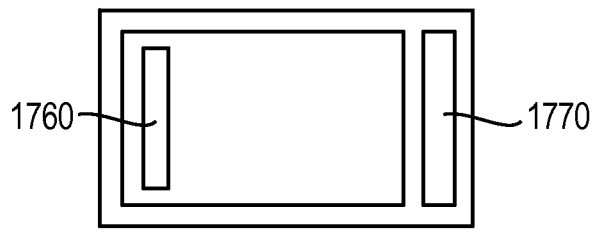
Figure 17C:
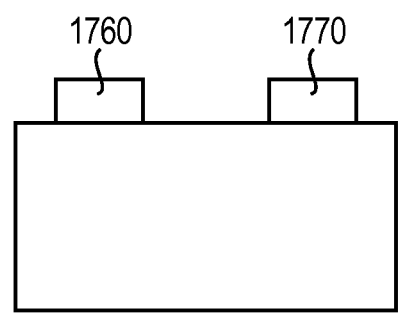
FIG. 17C is a cross-sectional schematic of a light-emitting element utilized in white dies in accordance with various embodiments of the invention.

FIGS. 17A and 17B depict an exemplary LEE 1700 for use in an embodiment of the present invention. FIG. 17A shows a cross-sectional view while FIG. 17B shows a top plan view of LEE 1700. LEE 1700 typically includes a substrate 1710 with one or more semiconductor layers disposed thereover. In this exemplary embodiments, LEE 1700 represents a light-emitting device such as a LED or a laser, but other embodiments of the invention feature one or more semiconductor dies with different or additional functionality, e.g., processors, sensors, photovoltaic solar cells, detectors, and the like. Non-LED dies may or may not be bonded as described herein, and may have contact geometries differing from those of LEDs. While FIGS. 17A and 17B show LEE 1700 having non-coplanar contacts 1760 and 1770, this is not a limitation of the present invention and in other embodiments LEE 1700 may have coplanar or substantially coplanar contacts, as shown in FIG. 17C (in FIG. 17C the internal structure for contacting the various layers is not shown for clarity).

Substrate 1710 may include or consist essentially of one or more semiconductor materials, e.g., silicon, GaAs, InP, GaN, and may be doped or substantially undoped (e.g., not intentionally doped). In some embodiments, substrate 1710 includes or consists essentially of sapphire or silicon carbide. Substrate 1710 may be substantially transparent to a wavelength of light emitted by the LEE 1700. As shown for a light-emitting device, LEE 1700 may include first and second doped layers 1720, 1740, which preferably are doped with opposite polarities (i.e., one n-type doped and the other p-type doped). One or more light-emitting layers 1730, e.g., one or more quantum wells, may be disposed between layers 1720, 1740. Each of layers 1720, 1730, 1740 may include or consist essentially of one or more semiconductor materials, e.g., silicon, InAs, AlAs, GaAs, InP, AlP, GaP, InSb, GaSb, AlSb, GaN, AlN, InN, and/or mixtures and alloys (e.g., ternary or quaternary, etc. alloys) thereof. In preferred embodiments, LEE 1700 is an inorganic, rather than a polymeric or organic, device. In some embodiments, substantially all or a portion of substrate 1710 is removed prior to formation of the phosphor, as described below. Such removal may be performed by, e.g., chemical etching, laser lift-off, exfoliation, mechanical grinding and/or chemical-mechanical polishing or the like. In some embodiments all or a portion of substrate 1710 may be removed and a second substrate—e.g., one that is transparent to or reflective of a wavelength of light emitted by LEE 1700—is attached to substrate 1710 or semiconductor layer 1720 prior to formation of the phosphor as described below. In some embodiments substrate 1710 comprises silicon and all or a portion of silicon substrate 1710 may be removed prior to phosphor formation as described below. Such removal may be performed by, e.g., chemical etching, laser lift off, mechanical grinding and/or chemical-mechanical polishing or the like. In some embodiments substrate 1710 is used as a template for growth of the active layers of the device, for example layers 1720, 1730 and 1740. In some embodiments, in use, substrate 1710 provides mechanical support but does not provide an electrical or optical function and may be removed. In some embodiments removal of substrate 1710 during the formation process for the white die includes removal of all or a portion of substrate 1710 that does not provide electrical functionality (e.g., does not contribute to the emission or detection of light).

As shown in FIGS. 17A and 17B, in some embodiments LEE 1700 is patterned and etched (e.g., via conventional photolithography and etch processes) such that a portion of layer 1720 is exposed in order to facilitate electrical contact to layer 1720 and layer 1740 on the same side of LEE 1700 (and without, for example, the need to make contact to layer 1720 through substrate 1710 or to make contact to layer 1720 with a shunt electrically connecting a contact pad over layer 1740 to layer 1720). One or more portions of layers 1730, 1740 are removed (or never formed) in order to expose a portion of layer 1720, and thus FIG. 17A depicts a surface 1725 of LEE 1700 that is non-planar, i.e., contains exposed portions non-coplanar with each other. Surface 1725 corresponds to the outer surface of LEE 1700, including any contour or topography resulting from portions of layers not being present. In order to facilitate electrical contact to LEE 1700, discrete electrical contacts 1760, 1770 are formed on layers 1740, 1720, respectively. Electrical contacts 1760, 1770 may each include or consist essentially of a suitable conductive material, e.g., one or more metals or metal alloys conductive oxides, or other suitable conductive materials and are may or may not be co-planar. In some embodiments surface 1725 is planar or substantially planar. In some embodiments the top surfaces of electrical contacts 1760 and 1770 are coplanar or substantially coplanar. The structure shown in FIGS. 17A and 17B is for illustrative purposes. There are a wide variety of designs for LEE 210 or LEE 1700, and the specific design of LEE 210 or LEE 1700 is not a limitation of the present invention. For example, in some embodiments LEE 210 or LEE 1700 may have different shaped contacts, different area contacts, different approaches to contact the semiconductor material or the like.

In some embodiments, LEE 1700 has a square shape, while in other embodiments LEE 1700 has a rectangular shape. The shape and aspect ratio are not critical to the present invention, however, and LEE 1700 may have any desired shape. In various embodiments, the extent of one or both of contacts 1760, 1770 in one dimension (e.g., a diameter or side length) is less than approximately 100 μm, less than approximately 70 μm, less than approximately 35 μm, or even less than approximately 20 μm. In one embodiment, contacts 1760, 1770 are rectangular and may have a length in the range of about 10 μm to about 250 μm and a width in the range of about 5 μm to about 250 μm. In some embodiments contacts 1460, 1480 have one dimension that is at least 200 μm or that is at least 500 μm. In other embodiments, contacts 1760, 1770 have any shape or size, and in some embodiments LEE 1700 has more than two contacts. The number, shape and aspect ratio of the contacts are not critical to the present invention; however, and contacts 1760, 1770 may have any desired number, shape and/or size. In some embodiments, the separation between contacts 1760 and 1770 1470 is at least 50 μm or at least 100 μm or at least 200 μm. In some embodiments, contacts 1460 and 1470 are separated as far as possible within the geometry of LEE 1700. For example, in one embodiment the separation between contacts 1760 and 1770 is in the range of about 75% to over 90% of the length of LEE 1700; however, the separation between contacts is not a limitation of the present invention.

In some embodiments where electrical contact to contacts 1760, 1770 is facilitated via use of a conductive adhesive rather than, e.g., wire bonding, soldering, ultrasonic bonding, thermosonic bonding or the like, contacts 1760, 1770 may have a relatively small geometric extent since adhesives may be utilized to contact even very small areas impossible to connect with wires or ball bonds (which typically require bond areas of about 80 μm on a side). The method of die attach is not a limitation of the present invention and in other embodiments any die-attach method, for example solder, wire bonding, solder bump, stud bump, thermosonic bonding, ultrasonic bonding or the like may be used. In some embodiments one or more contacts, for example contacts 1760 and/or 1770 may include stud bumps or solder bumps.

Particularly if LEE 1700 includes or consists essentially of a light-emitting device such as a LED or laser, contacts 1760, 1770 may be reflective to a wavelength of light emitted by LEE 1700) and hence reflect emitted light back toward substrate 1710. In some embodiments, a reflective contact 1760 covers a portion or substantially all of layer 1740, while a reflective contact 1770 covers a portion or substantially all of layer 1720. In addition to or instead of reflective contacts, a reflector (not shown in this figure for clarity) may be disposed between or above portions of contacts 1760, 1770 and over portions or substantially all of layer 1740 and 1720. The reflector is reflective to at least some or all wavelengths of light emitted by LEE 1700 and may include or consist essentially of various materials. In one embodiment, the reflector is non-conductive so as not to electrically connect contacts 1760, 1770. In some embodiments the reflector may be a Bragg reflector. In some embodiments the reflector may include or consist essentially of one or more conductive materials, e.g., metals such as aluminum, silver, gold, platinum, etc. Instead of or in addition to the reflector, exposed surfaces of semiconductor die except for contacts 1760, 1770 may be coated with one or more layers of an insulating material, e.g., a nitride such as silicon nitride or an oxide such as silicon dioxide. In some embodiments, contacts 1760, 1770 include or consist essentially of a bond portion for connection to a circuit board or power supply or the like and a current-spreading portion for providing more uniform current through LEE 1700, and in some embodiments, one or more layers of an insulating material are formed over all or portions of LEE 1700 except for the bond portions of contacts 1760, 1770. Insulating material 1750 may include or consist essentially of, for example, polyimide, silicon nitride, silicon oxide and/or silicon dioxide. Such insulating material 1750 may cover all or portions of the top and sides of LEE 1700 as well as all or portions of the top and sides of layers 1720, 1730 and 1740. Insulating material 1750 may act to prevent shorting between contacts 1760 and 1770 and between conductors to which contacts 1760 and 1770 may be electrically coupled.

Figure 18:
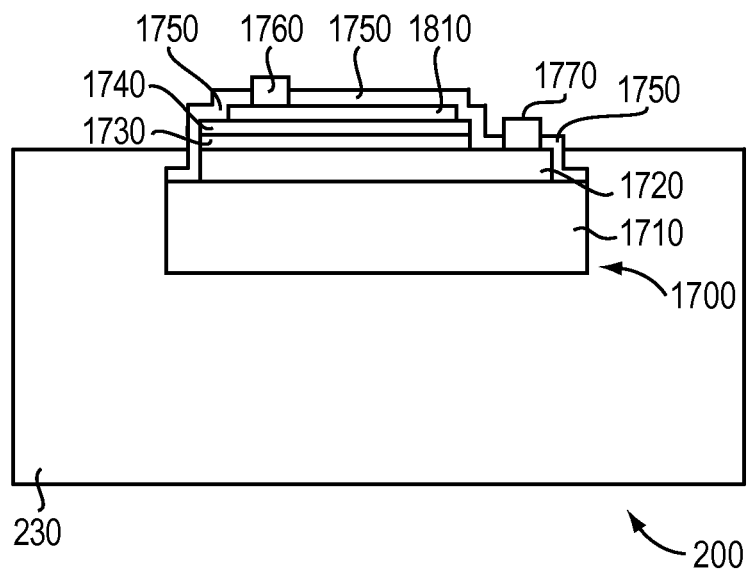
FIG. 18 is a cross-sectional schematic of a white die incorporating the light-emitting element of FIGS. 17A and 17B.

FIG. 18 shows one embodiment of white die 200 comprising an LEE 1700 as described above. White die 200 as shown in FIG. 18 may be manufactured in accordance with any of various embodiments of the present invention. As shown in FIG. 18, LEE 1700 includes an optional reflective layer 1810. In the structure shown in FIG. 18, the die and contact relief values are different for the two different contacts 1760, 1770, but in both cases the contact relief is positive and non-zero.

Figure 19:
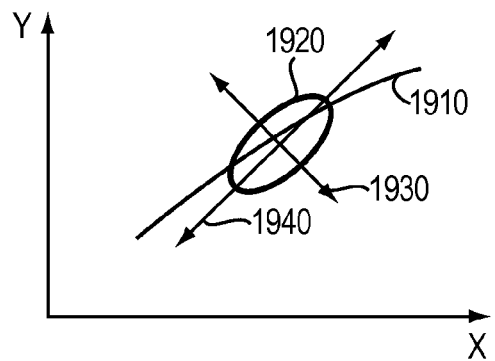
FIG. 19 is a chromaticity diagram in accordance with various embodiments of the invention.

Advantageously, embodiments of the present invention produce white dies 200 having controlled binder thickness, uniformity and distribution of phosphor particles in the binder around LEE 210, for example a uniform or substantially uniform thickness and uniform or substantially uniform distribution of phosphor particles in the binder, or an engineered thickness and distribution of phosphor particles to achieve uniform or otherwise specified optical characteristics. The thickness and distribution, or loading, of the phosphor particles may have a strong impact on the uniformity of the color temperature of the light. In systems with a plurality of LEEs, and in particular arrays with tens to thousands of LEEs, it may be difficult to achieve such phosphor coating over all of the LEEs when utilizing conventional phosphor-integration techniques, resulting in non-uniform optical characteristics. FIG. 19 is a schematic of the CIE chromaticity diagram with the blackbody locus 1910 and an ellipse 1920 representing one or more MacAdam ellipses. The major axis of MacAdam ellipse 1920 is labeled as 1940 while the minor axis is labeled as 1930. A MacAdam ellipse represents a region of colors on the chromaticity chart and a one-step MacAdam ellipse represents the range of colors around the center of the ellipse that are indistinguishable to the average human eye, from the color at the center of the ellipse. The contour of a one-step MacAdam ellipse therefore represents barely noticeable differences of chromaticity.

Multiple-step MacAdam ellipses may be constructed that encompass larger ranges of color around the center point. The black body locus is in general aligned with the major axis of a MacAdam ellipse, meaning that the eye is less sensitive to color differences along the black body line, which equates to red/blue shifts, than to differences perpendicular to the black body line, which equates to a green/magenta shift. Furthermore, with respect to phosphor-converted white light sources, the variation in the minor axis direction 1930 is in large measure determined by the LEE (typically a LED) wavelength variation, while the variation in the major axis direction 1940 may be largely determined by the phosphor concentration and thickness. While there are many recommendations as to how tight the color temperature uniformity should be (as measured by MacAdam ellipses or other units), it is clear that a variation encompassed within a smaller step number of MacAdam ellipses (smaller ellipse) is more uniform than one encompassed within a larger step number of MacAdam ellipses (larger ellipse). For example, a four-step MacAdam ellipse encompasses about a 300K color temperature variation along the black body locus, centered at 3200K, while a two-step MacAdam ellipse encompasses about a 150K color temperature variation along the black body locus, centered at 3200K.

The importance of uniform and/or controlled or engineered thickness and phosphor concentration in white die 200 may be seen in relation to the MacAdam ellipse on the chromaticity chart of FIG. 19. Since the major axis length is largely determined by the phosphor concentration and thickness, variations in these parameters result in an increase in the major axis of the MacAdam ellipse and thus an increase in the variation in color temperature. The aforementioned method for fabrication of uniform thickness and composition phosphor as part of white die 200 results in a reduction in the variation in color temperature and thus a more uniform color temperature light source, both within a lighting system featuring an array of phosphor-converted LEEs, as well as between such lighting systems. The use of the aforementioned LEEs in lighting systems featuring large arrays of LEE permits the manufacture of large numbers of lighting systems having uniform color temperatures. In some embodiments, white dies 200 are manufactured that have a distribution of color temperature less than about 500K, or less than about 250K or less than about 125K or less than about 75K. In some embodiments, white dies 200 are manufactured that have a variation in color temperature or chromaticity of less than about four MacAdam ellipses, or less than about two MacAdam ellipses, or less than about one MacAdam ellipse. In some embodiments, such tight distributions are achieved within one white wafer, or within a batch of white wafers or within the entire manufacturing distribution.

One step in the method of manufacture of some embodiments of the present invention is to dispense, cast, pour or otherwise form a phosphor over LEE on a base. In one embodiment of the present invention, the amount of phosphor formed is controlled manually by controlling the dispensing process. For example, the phosphor may be poured over the LEE and the base. However, this approach may not provide the desired level of control of the amount of phosphor formed. Various methods may be used to improve the control and accuracy of the formation process. For example, in one embodiment a mold or barrier walls are formed around the LEE. This results in a volume defined by the area of the mold and the desired phosphor height. The phosphor may be dispensed by volume, for example from a calibrated syringe, pipette or other volumetric dispensing system, to provide the desired volume of phosphor in the mold area. In another example, the mold may be on a scale and the phosphor may be dispensed until a certain weight of phosphor has been formed. The mold volume along with the phosphor density may be used to calculate the required weight of phosphor to achieve the desired phosphor amount or coverage.

In another embodiment, the mold height is adjusted to match the desired amount of phosphor to be formed, and the phosphor-formation process may be stopped when the phosphor reaches the top of the mold or a certain height of the sidewall of the mold. Such a process may be performed manually or automatically. For example, automatic control may be accomplished using a camera that views the edge of the mold and modulates and/or stops the phosphor-filling process when the phosphor reaches a certain height relative to the mold wall or top surface of the mold.

Figure 20:
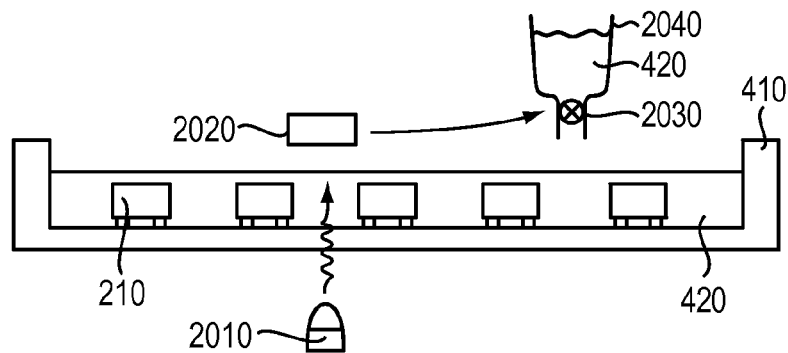
FIG. 20 is a cross-sectional schematic of a feedback-controlled phosphor dispensing system in accordance with various embodiments of the invention.

In one embodiment, the thickness of the phosphor is controlled by feedback during the filling or dispensing process. In one embodiment, the phosphor is excited by an appropriate pump source, for example a LEE such as a LED or laser and the resulting white light color temperature measured (i.e., from the emission from the phosphor or phosphor and LEE). When the target white light color temperature is reached, the fill mechanism is notified to stop the filling or dispensing process. FIG. 20 shows an example of such an embodiment, featuring base or mold 410, a reservoir 2040 of phosphor 420, phosphor 420 also in mold 410, valve 2030, a pump source 2010 and a detector 2020. The target color temperature is compared to that measured by detector 2020, and when the target color temperature is reached, detector 2020 sends a signal to close valve 2030, stopping further dispensing of phosphor 420 into mold 410. In some embodiments, detector 2020 and valve 2030 control in an on-off configuration while in other embodiments a proportional control, for example a metering valve, is used. In some embodiments, an offset in the timing or valve-control signal is included to accommodate hysteresis or delays in the mold-filling process. Mold 410 may be transparent or have a transparent region or window to a wavelength of light emitted by pump source 2010. In one embodiment, phosphor 420 is excited from the top rather than through mold 410. In one embodiment, pump source 2010 has a spectral power distribution the same as, substantially the same as or similar to that of LEE 210. In one embodiment, pump source 2010 includes or consists essentially of one or more LEE 210. In one embodiment, mold 410 consists essentially of base 410. In one embodiment, mold 410 includes or consists essentially of base 410 and sidewalls or barriers 450, as shown in FIG. 4. In one embodiment, reservoir 2040 and valve 2030 are replaced by a pressure-assisted dispense system. FIG. 20 shows one pump source 2010, one detector 2020 and one reservoir 2040 with valve 2030; however, this is not a limitation of the present invention, and in other embodiments a plurality of any one or more of these features may be utilized. The method of dispense and/or control is not a limitation of the present invention. FIG. 20 shows one configuration of such a filling control scheme; however, other configurations may be employed, and the specific configuration is not a limitation of the present invention.

In one embodiment, one or more LEEs 210 are themselves energized to provide the source of pump radiation. After phosphor 420 is deposited or dispensed, it may be cured and the resulting structure processed as described in accordance with any of various embodiments described herein. In some embodiments, a combination of formation techniques is used. For example, in one embodiment a portion of phosphor 420 is formed or dispensed in a manual fashion or without feedback. This first portion may be cured or partially cured. Then, a second portion of phosphor 420 is dispensed or formed under feedback control.

Figure 21:
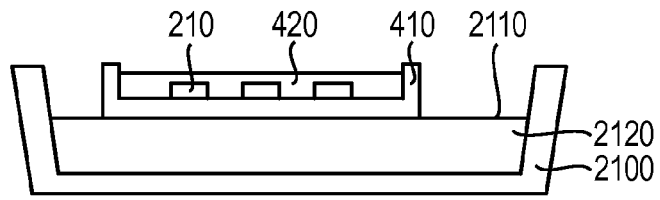
FIGS. 21 and 22 are cross-sectional schematics of leveling systems for the fabrication of planar white dies in accordance with various embodiments of the invention.

In some embodiments, it is desirable to keep phosphor 420 level to ensure a uniform layer of phosphor 420 over LEE 210. In one embodiment, this is done by providing a mechanically level surface on which base or mold 410 or the like is positioned. In one embodiment, the level surface is formed within an oven that is used for curing or partially curing phosphor 420. In one embodiment, base or mold 410 or the like is floated upon a liquid in a larger container. FIG. 21 shows an example of this embodiment featuring a container 2100, mold 410, phosphor 420, LEE 210 and a liquid 2120. Even if container 2100 is not level, the surface 2110 of liquid 2120 will be level due to gravity, resulting in floating mold 410 being level. This will then result in phosphor 420 in mold 410 being level. In one embodiment, phosphor 420 is activated to aid in the leveling process. Such activation may include shaking, vibrating, rocking, agitation, ultrasonic agitation or the like.

Figure 22:
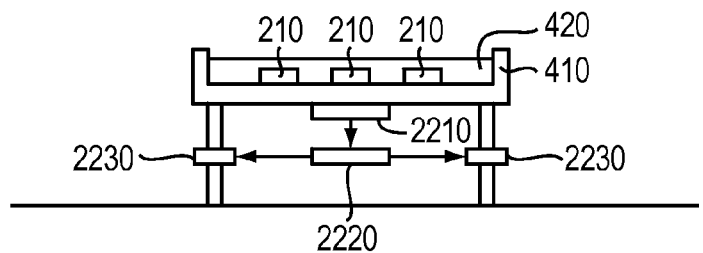

In one embodiment, an active feedback leveling system is used to ensure that base or mold 410 or the like is level. Such a system, in one example, includes one or more level sensors 2210, an optional controller 2220 and one or more actuators 2230 acting to level base or mold 410 or a support on which base or mold 410 is placed, as shown in FIG. 22. Level sensor 2210 senses the orientation of base or mold 410 and sends a signal to controller 2220. Controller 2220 utilizes the signal from the one or more level sensors 2210 to determine and send appropriate actuation signals to actuators 2230 to make base or mold 410 level or substantially level. Level sensor 2210 may be, for example, a physical level sensor or a solid-state or micromachined level sensor or the like. Actuator 2230 may include or consist essentially of a piezoelectric translator, a mechanical translator, an electro-mechanical translator or the like. The type of level sensor and/or actuator and/or controller is not a limitation of the present invention.

In some embodiments, the physical layout of white dies 200 discussed herein makes them amenable to transfer or pick-and-place operations of multiple units at a time. As discussed above, some embodiments of the present invention result in regular periodic arrays of white dies 200 on a base, for example base 410, from which a multiple-tool pick-and-place or stamp operation may be fed with almost 100% utilization of all white dies 200 in the array, where the pick or stamp pitch is an integer multiple of the pitch of white dies 200 in the source array.

Figure 24A:
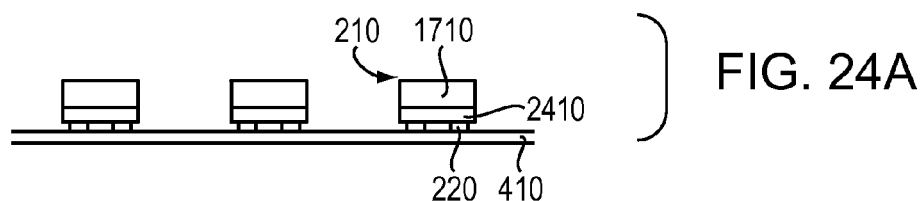
FIGS. 24A-24C are cross-sectional schematics of process steps utilized to fabricate white dies in accordance with various embodiments of the invention.
Figure 24B:
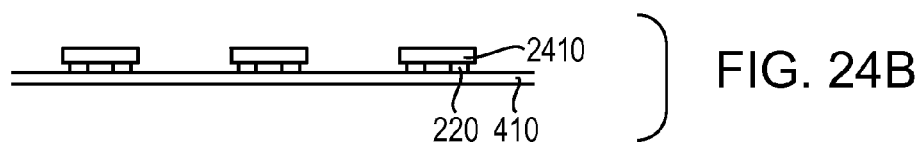
Figure 24C:
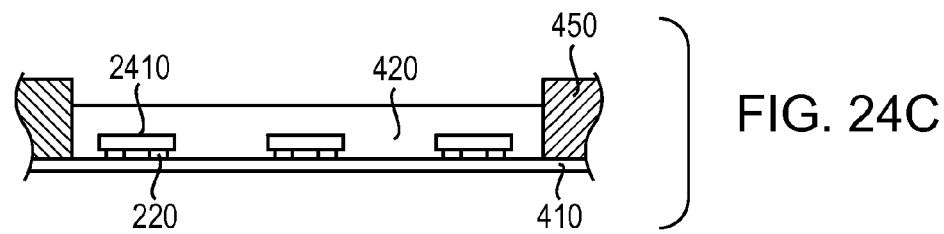
Figure 25:
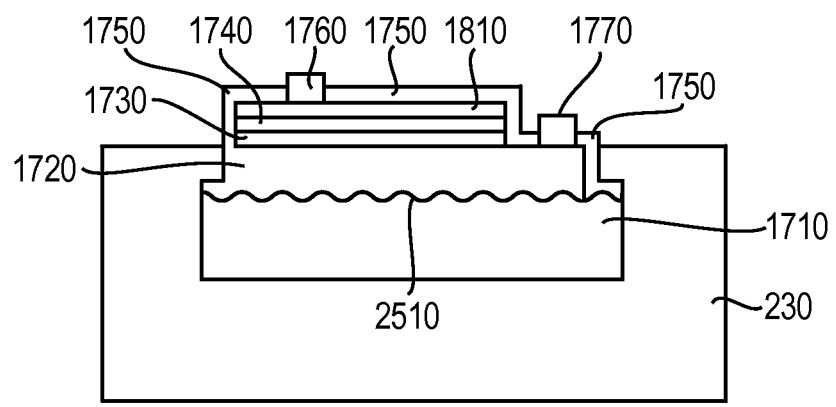
FIGS. 25 and 26 are cross-sectional schematics of white dies in accordance with various embodiments of the invention.

FIGS. 23-25 show additional embodiments of the present invention related to processing and/or removal or partial removal of the substrate associated with LEE 210. As shown in FIG. 17A, LEE 1700 may include a substrate 1710. As discussed above, substrate 1710 may include or consist essentially of sapphire, silicon carbide, silicon, GaAs, or the like.

Figure 23A:
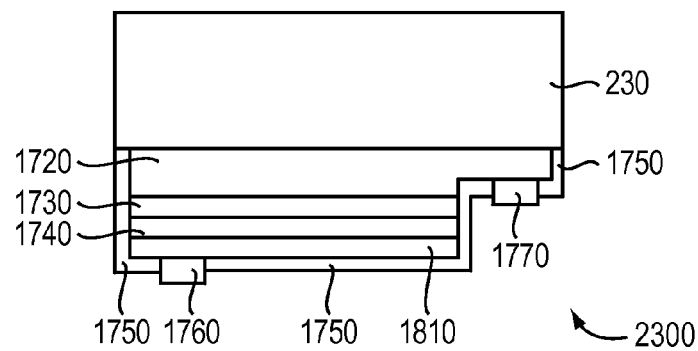
FIGS. 23A and 23B are cross-sectional schematics of white dies in accordance with various embodiments of the invention.
Figure 23B:
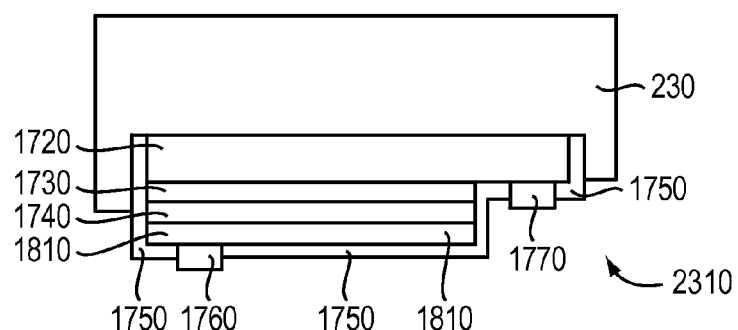

In some embodiments it may be advantageous to remove all or a portion of substrate 1710 from LEE 1700. In some examples substrate 1710 is absorbing or partially absorbing to a wavelength of light emitted by LEE 1700 (for example where substrate 1710 includes silicon, silicon carbide, or GaAs) and removing or partially removing substrate 1710 may result in a larger amount of light being emitted from LEE 1700 because of decreased or no absorption in substrate 1710. In one embodiment LEE 1700 may include a III-nitride based light emitter grown on a silicon substrate. Even in examples where substrate 1710 is transparent or partially transparent to a wavelength of light emitted by LEE 1700 (for example where substrate 1710 includes sapphire or silicon carbide), removal of substrate 1710 may be advantageous. For example, removal or partial removal of substrate 1710 may result in a reduction or elimination of scattering and absorption in substrate 1710, with the result that the light from LEE 1700 is substantially emitted from a plane, rather than a volume (where the volume emission is mainly from substrate 1710). This may also permit a smaller white die 200 because the volume of phosphor 230 may be reduced around the periphery of LEE 1700, as shown in FIG. 23B or substantially eliminated, as shown in FIG. 23A.

Substrate 1710 may be removed using a variety of techniques, for example including lapping, grinding, polishing, exfoliation, ablation, wet chemical etching, dry etching, for example reactive ion etching, laser lift off, radiation-enhanced lift-off or the like. The method of removal of substrate 1710 is not a limitation of the present invention. In one embodiment, substrate 1710 includes or consists essentially of sapphire and layer 1720 includes or consists essentially of GaN, and substrate 1710 is removed using laser lift-off or other techniques. In one embodiment, substrate 1710 includes or consists essentially of silicon and layer 1720 includes or consists essentially of GaN, and substrate 1710 is removed using one or more of exfoliation, grinding, lapping, polishing, wet chemical etching or dry chemical etching or other techniques. In one example the process of substrate removal may be inserted between the steps associated with FIGS. 4A and 4B. FIG. 24A shows the structure of FIG. 4A, but identifying substrate 1710 and device 2410 as part of LEE 210 or LEE 1700 (in one embodiment, with respect to FIG. 17A, device 2410 comprises LEE 1700 less substrate 1710). FIG. 24B shows the structure of FIG. 24A at a later stage of manufacture, but before the step shown in FIG. 4B. FIG. 24B shows the structure of FIG. 24A after removal of substrate 1710, for example by using laser lift-off. Other embodiments may include only partial removal of substrate 1710. FIG. 24C shows the structure of FIG. 24B at a later stage of manufacture, corresponding to the step shown in FIG. 4B, after phosphor 420 has been formed over device 2410 and base 410. At this point the process may continue as discussed above in reference to FIGS. 4B-4E. In some embodiments, a plurality of steps are used to remove substrate 1710. For example, a portion of substrate 1710 may be removed by grinding and/or lapping prior to singulation of LEE 210 and mounting on base 410. The remaining portion of substrate 1710 may then be removed using wet or dry chemical etching. In some embodiments substrate removal may include only removal of a portion of the substrate, while in other embodiments substrate removal includes removal of all or substantially all of the substrate. For clarity purposes, the details of die relief and/or contact relief are not shown in FIGS. 24A-24C.

In some embodiments, light is internally reflected within substrate 1710 and/or layer 1720, in particular in layer 1720 if substrate 1710 has been removed. Such reflection is called total internal reflection (TIR) and may reduce the amount of light exiting LEE. TIR typically occurs because of the index of refraction differences between adjacent layers and/or substrate or between the external layer or substrate and the adjacent material, for example binder, phosphor, air or the like.

Various approaches may be used to reduce TIR and provide increased light extraction from substrate 1710 and/or layer 1720, for example by patterning or roughening the external surface of these layers or patterning or roughening the interface between substrate 1710 and layer 1720 or forming an layer over the outside surface having an index of refraction between those of the two adjacent materials. In one embodiment, substrate 1710 is patterned before formation of layer 1720. In the case where substrate 1710 includes sapphire, this may be called patterned sapphire substrate (PSS). PSS may be formed using etching or a combination of patterning and etching. Etching may be done by wet chemical etching, dry etching, for example RIE, ablation or the like. The method of formation of the PSS is not a limitation of the present invention. FIG. 25 shows an embodiment of a white die 200 featuring a PSS 2510. Patterning of substrate 1710 before formation of layer 1720 typically results in the formation of a mirror image of the pattern in the adjacent surface of layer 1720.

Figure 26:
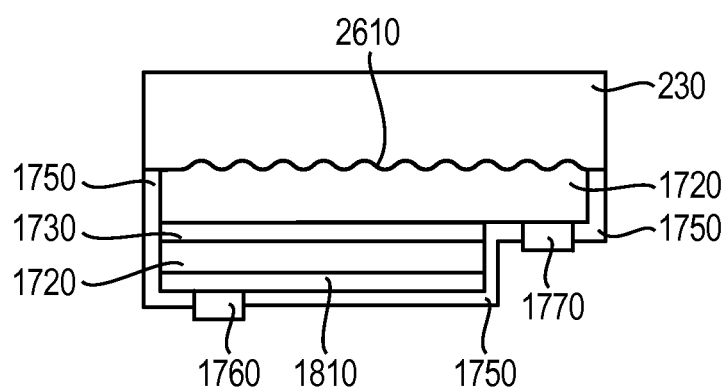

PSS may also be used in combination with laser lift-off to form a structure similar to that shown in FIG. 23A or FIG. 23B, but with a patterned external surface of layer 1720, as shown in FIG. 26. As discussed above, growth of layer 1720 on PSS 1710 typically forms the mirror-image pattern in the adjacent surface of layer 1720. Laser lift-off may then be used to remove PSS 1710, leaving a patterned surface 2610. Such a process may be carried out using the approach described in reference to FIG. 24A-24C, where LEE 210 in FIG. 24A comprises a substrate 1710 featuring PSS, as described above. Substrate 1710 is then removed, as shown in FIG. 24B, and phosphor 230 formed, as described above, resulting in the white die structure shown in FIG. 26.

Patterning or roughening of the external surface of LEE 210 adjacent to phosphor 230 may be accomplished by other techniques, and may be applied to LEE 210 both with and without substrate 1710. In one embodiment, the outside surface of substrate 1710 is patterned or roughened before formation of phosphor 230. Such patterning or roughening may be done at various points in the process, for example when LEEs 210 are in wafer form or after singulation. Such patterning or roughening may also be applied to the layer adjacent to phosphor 230 in the case where substrate 1710 has been removed, for example layer 1720 in FIGS. 23A and 23B. Such patterning or roughening may be done by using for example ablation, wet chemical etching, dry etching, for example reactive ion etching, laser etching or the like, either alone or in combination or in combination with patterning. As discussed above, the external surface of phosphor 230 may also be patterned or roughened to reduce TIR within phosphor 230. Such patterning or roughening may be done during the formation process of phosphor 230, as described above, or after formation of phosphor 230, for example ablation, wet chemical etching, dry etching, for example reactive ion etching, molding, imprinting, indentation, cutting, laser etching or the like, either alone or in combination or in combination with patterning. In some embodiments such patterning and/or roughening may be applied to portions of LEE 210 other than the substrate side, for example to all or portions of the sidewalls and/or top.

In yet another embodiment, substrate 1710 may include a plurality of layers or materials, for example silicon on sapphire, silicon on a ceramic material such as SiC or AlN, GaN on sapphire, GaN on a ceramic material such as SiC or AlN or the like. In this case, one or more of the above processes may be applied to a multilayer substrate 1710, for example to remove one or more portions or layers of substrate 1710, or to increase light extraction by reducing TIR.

Embodiments of the present invention permit the manufacture of very large arrays of white dies 200 in an economical manner with relatively narrow output characteristics. In some embodiments, the spacing between LEEs 210 in the array is determined by the desired amount of phosphor on the sides of LEEs 210 and the kerf of the method used for separating white dies 200. In some embodiments, the amount of phosphor on the sides of LEEs 210 may range from about 10 µm to about 1000 µm, while the kerf may range from about 2 µm to about 200 µm. The size of LEEs 210 may range from about 10 µm to about 2000 µm or more. The size of LEEs 210 are not limitations of the present invention. As an example, in one embodiment an LEE 210 has a size of about 375 µm on a side, the phosphor thickness on the sides of LEE 210 is about 100 µm and the kerf is about 25 µm, resulting in a space between LEEs 210 of about 225 µm. This results in a white die size of about 575 µm and a pitch of about 600 µm. This leads to a density of white dies of about 2.77/mm$^2$ or about 275 white die per square cm. The manufacturing approaches described above may be practiced on any arbitrary size area. In one embodiment, the area is about 10 cm×about 10 cm, or about 1000 cm$^2$ and this leads to the ability to manufacture 275,000 white dies 2610 simultaneously in this area. This is just one example and not meant to be limiting to the invention. In general the density of white dies 200 will vary with the size of LEEs 210, the kerf and the amount of phosphor required on the sides of LEEs 210. In another example white dies 200 may have a size of 975 µm, and a pitch of about 1000 µm or about 1 mm, resulting in a density of about 100 white dies 200 per square cm and the ability to manufacture about 100,000 white dies 200 simultaneously in an area of about 10 cm×about 10 cm. In some embodiments white dies 200 may each comprise a plurality of LEEs 210, for example a 5×5 or 10×10 or 10×20 array associated with one phosphor 230. The number of LEEs or size of the white dies are not limitations to the present invention.

As will be appreciated by those with ordinary skill in the art, white dies 210 may be made using a wide range of processes, while still within the bounds of the present invention. For example, the table below shows a non-exclusive list of process steps that may be selected from and used in various orders to manufacture white dies 200.

| |
| --- |
| Test LEEs |
| Sort and bin LEEs |
| Virtual sort and bin LEEs (generate wafer maps) |
| Singulate LEEs |
| Transfer LEE wafer |
| Transfer singulated LEEs |
| Prepare phosphor |
| Form phosphor over LEEs |
| Cure phosphor |
| Form optic over white die |
| Test white wafer |
| Singulate white wafer |
| Sort and bin white dies |
| Sort and bin white wafers |
| Virtual sort and bin white wafers |
| Test white dies |

Figure 27:
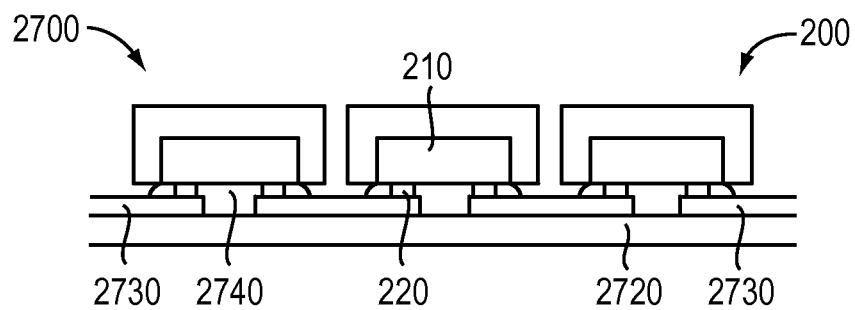
FIG. 27 is a cross-sectional schematic of a lighting system utilizing white dies in accordance with various embodiments of the invention.

FIG. 27 shows one embodiment of a lighting system or portion of a lighting system 2700 featuring white dies 200. Lighting system 2700 includes an LEE substrate 2720 over which conductive traces 2730 have been formed. White dies 200 are then formed or placed over conductive traces 2730 such that contacts 220 on LEE 210 are electrically coupled with conductive traces 2730. In the example in FIG. 27, white dies 200 are electrically coupled to conductive traces 2730 using material 2740, which may include or consist essentially of a conductive adhesive, an anisotropic conductive adhesive (as disclosed in U.S. patent application Ser. No. 13/171,973, filed Jun. 29, 2011, the entire disclosure of which is incorporated by reference herein), a combination of conductive and non-conductive adhesives, conductive epoxy or the like. In one embodiment, the adhesive is reflective to a wavelength of light emitted by either or both of LEE 210 and phosphor 230. However, the method of electrical coupling and attachment of LEE 210 or white die 200 to conductive traces 2730 is not a limitation of the present invention and in other embodiments other methods of electrical coupling and attachment may be used.

LEE substrate 2720 may include or consist essentially of a semicrystalline or amorphous material, e.g., polyethylene naphthalate (PEN), polyethylene terephthalate (PET), acrylic, polycarbonate, polyethersulfone, polyester, polyimide, polyethylene, and/or paper. In one embodiment LEE substrate 2720 includes or consists essentially of PET and has a thickness in the range of about 10 µm to about 150 µm. LEE substrate 2720 may also include or consist essentially of a rigid or flexible circuit board, for example FR4, metal core printed circuit board (MCPCB), polyimide or the like. LEE substrate 2720 may be substantially flexible, substantially rigid or substantially yielding. In some embodiments, the substrate is "flexible" in the sense of being pliant in response to a force and resilient, i.e., tending to elastically resume an original configuration upon removal of the force. A substrate may be "deformable" in the sense of conformally yielding to a force, but the deformation may or may not be permanent; that is, the substrate may not be resilient. Flexible materials used herein may or may not be deformable (i.e., they may elastically respond by, for example, bending without undergoing structural distortion), and deformable substrates may or may not be flexible (i.e., they may undergo permanent structural distortion in response to a force). The term "yielding" is herein used to connote a material that is flexible or deformable or both.

LEE substrate 2720 may include multiple layers, e.g., a deformable layer over a rigid layer, for example, a semicrystalline or amorphous material, e.g., PEN, PET, polycarbonate, polyethersulfone, polyester, polyimide, polyethylene, paint, plastic film and/or paper formed over a rigid or substantially rigid substrate for example including, ceramic such as AlN, fiberglass, such as FR-4, metal core printed circuit board, acrylic, aluminum, steel and the like. In some embodiments, LEE substrate 2720 is rigid or substantially rigid, for example including ceramic such as AlN, fiberglass, such as FR-4, metal core printed circuit board, acrylic, aluminum, steel and the like.

Depending upon the desired application for which embodiments of the invention are utilized, LEE substrate 2720 is substantially optically transparent, translucent, or opaque. For example, LEE substrate 2720 may exhibit a transmittance or a reflectivity greater than about 80% for optical wavelengths ranging between approximately 400 nm and approximately 700 nm. In some embodiments, LEE substrate 2720 exhibits a transmittance or a reflectivity of greater than about 80% for one or more wavelengths emitted by LEE 210 and/or white die 200. In some embodiments a reflective LEE substrate 2720 advantageously aids in directing light in a desired direction, while in some embodiments a transmissive LEE substrate 2720 may provide a relatively transparent appearance or may permit light emission from both sides of LEE substrate 2720.

LEE substrate 2720 may also be substantially insulating, and may have an electrical resistivity greater than approximately 100 ohm-cm, greater than approximately 1×10$^6$ ohm-cm, or even greater than approximately 1×10$^{10}$ ohm-cm.

Conductive traces 2730 may include or consist essentially of any conductive material, for example metals such as gold, silver, aluminum, copper, carbon and the like, conductive oxides, carbon, etc. Conductive traces 2730 may be formed on LEE substrate 2720 by a variety of techniques, for example evaporation, sputtering, physical deposition, chemical vapor deposition, plating, electroplating, printing, lamination, gluing using an adhesive, lamination and patterning or the like. In one embodiment, conductive traces 2730 are formed using printing, for example screen printing, stencil printing, flexo, gravure, ink jet, or the like. Conductive traces 2730 may include or consist essentially of silver, aluminum, copper, gold, carbon inks, or other conductive inks or the like. Conductive traces 2730 may include or consist essentially of a transparent conductor, for example, a transparent conductive oxide such as indium tin oxide (ITO). Conductive traces 2730 may include or consist essentially of a plurality of materials. Conductive traces 2730 may optionally feature stud bumps to aid in electrical coupling of conductive trace 2730 to contacts 220. Conductive traces 2730 may have a thickness in the range of about 0.05 μm to about 100 μm; however, this is not a limitation of the present invention, and in other embodiments conductive traces 2730 may have any thickness. While the thickness of one or more of the conductive traces 2730 may vary, the thickness is generally substantially uniform along the length of the conductive trace 2730 to simplify processing. However, this is not a limitation of the present invention and in other embodiments the conductive trace thickness or material varies. In one embodiment, LEE substrate 2720 includes or consists essentially of PET having a thickness in the range of about 10 μm to about 150 μm, and conductive traces 2730 include or consist essentially of copper and/or aluminum and have a thickness in the range of about 5 μm to about 100 μm.

In one embodiment, one or more white dies 200 are electrically coupled to conductive traces 2730 using a conductive adhesive, e.g., an isotropically conductive adhesive and/or an anisotropically conductive adhesive (ACA). An ACA is a material that permits electrical conduction only in the vertical direction but insulates the conductive trace 2730 from each other. As used here, ACA may be an anisotropic conductive material in any form, for example paste, gel, liquid, film or otherwise. ACAs may be utilized with or without stud bumps.

Figure 28:
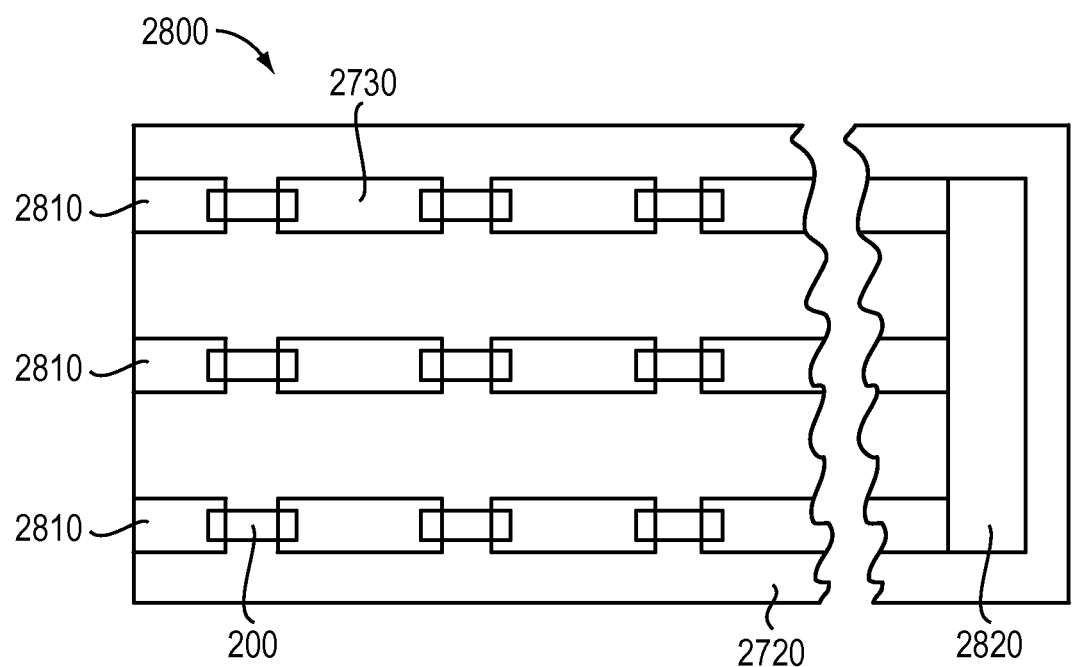
FIG. 28 is a plan-view schematic of a lighting system utilizing white dies in accordance with various embodiments of the invention.

The systems described above may be combined with additional electronics to form an electronic device 2800 as shown in FIG. 28. In one embodiment, the device includes a plurality of white dies 200 that are electrically coupled to traces 2730. As shown, electronic device 2800 includes three serially-connected strings 2810 of white dies 200. Electronic device 2800 also includes circuitry 2820 electrically connected to one or more of strings 2810. Circuitry 2820 may include or consist essentially of portions or substantially all of the drive circuitry, sensors, control circuitry, dimming circuitry, and or power-supply circuitry or the like, and may also be adhered (e.g., via an adhesive) or otherwise attached to substrate 2720. In one embodiment, the power supply and driver are distributed, e.g., the device 2800 may have a centralized power supply and all or a portion of the drive circuitry distributed in different locations. Circuitry 2820 may even be disposed on a circuit board (e.g., a printed circuit board) that itself may be mechanically and/or electrically attached to substrate 2730. In other embodiments, circuitry 2820 is separate from substrate 2730. In some embodiments circuitry 2820 is formed on substrate 2730. While FIG. 28 depicts white dies 200 electrically coupled in serially connected in strings 2810, and strings 2810 connected or connectable in parallel, other die-interconnection schemes are possible and within the scope of embodiments of the invention.

As shown in FIG. 28, the lighting system 2800 may feature multiple strings, each string 2810 including or consisting essentially of a combination of one or more white dies 200 electrically connected in series, in parallel, or in a series-parallel combination with optional fuses, antifuses, current-limiting resistors, zener diodes, transistors, and other electronic components to protect white die 200 from electrical fault conditions and limit or control the current flow through individual white dies 200. In general, such combinations feature an electrical string that has at least two electrical connections for the application of DC or AC power. A string may also include a combination of one or more white dies 200 electrically connected in series, in parallel, or in a series-parallel combination of white dies 200 without additional electronic components. FIG. 28 shows three strings of white dies 200, each string having three white dies 200 in series; however, this is not a limitation of the present invention, and in other embodiments the number of strings is less than or greater than three and the number of white dies 200 in a string is greater or less than three. In one embodiment, a string includes at least ten white dies 200. In one embodiment, a string includes at least 45 white dies 200. In one embodiment, system 2800 includes at least ten strings. In one embodiment, system 2800 includes at least 50 strings.

Figure 29:
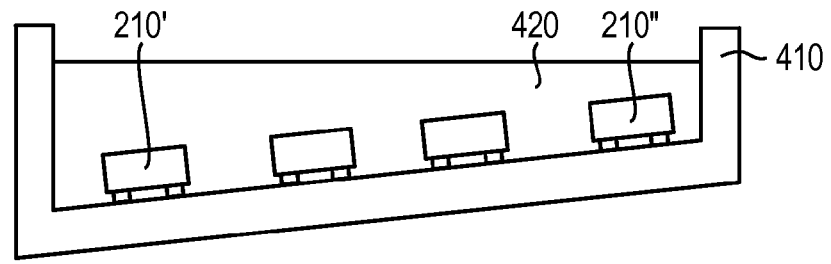
FIG. 29 is a cross-sectional schematic of a tilted mold utilized to fabricated white dies in accordance with various embodiments of the invention.

In some embodiments, variations in optical characteristics of LEEs 210 are accommodated during the fabrication of white dies 200. In one embodiment, where the variation in the optical characteristic, for example wavelength, is relatively monotonic or known or predictable across the physical layout of LEEs 210, mold 3110 may be tilted or terraced or sloped to provide a variation in thickness of phosphor 420 over LEE 210, as shown generically in FIG. 29 before curing of phosphor 420. A feedback system similar to that shown in FIG. 20 may be used to determine the optimum tilt value. In another embodiment, the tilt is determined from a map of the characteristics of the array of LEEs 210. In another embodiment, the tilt is introduced manually. In another embodiment, the bottom surface is terraced, for example by conforming it to a terraced chuck, e.g., a terraced vacuum chuck. In FIG. 29, LEE 210' receives a thicker phosphor layer thereover than does LEE 210". After the proper tilt is achieved, phosphor 420 is cured and the resulting structure may be processed as described elsewhere in this description. The example shown in FIG. 29 shows a tilted mold 410, however in other embodiments mold 410 is terraced.

In one embodiment of this aspect of the invention, the spacing between LEEs 210, and thus the amount of phosphor 230 surrounding the sides of an LEE 210, is substantially constant. In one embodiment, the spacing between LEEs 210, and thus the amount of phosphor 230 surrounding the sides of LEEs 210, is chosen to be the maximum required for the array of LEEs 210 under fabrication. In one embodiment, the cutting or separation process produces phosphor 230 of different sizes, in relation to a feedback system or a prior input, for example a map of one or more optical characteristics. For example a laser-based cutting system may be directed to cut different size phosphors 230 around different LEEs 210, based on some form of input, for example, feedback, a map, etc.

Figure 30:
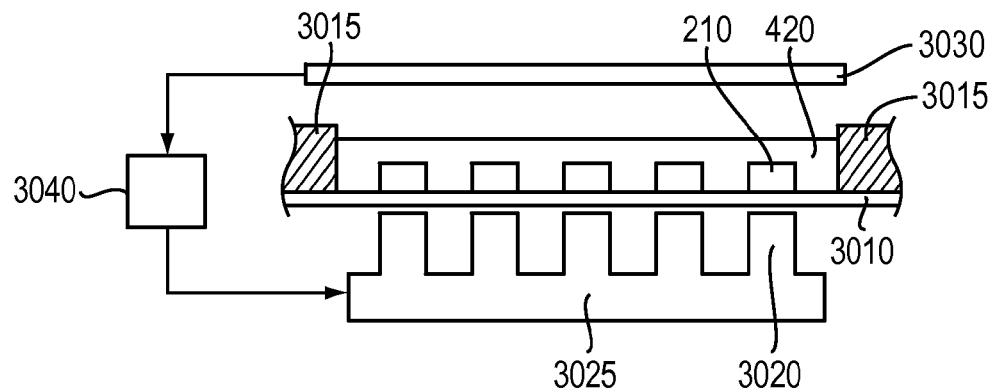
FIG. 30 is a cross-sectional schematic of a system for fabricating white dies with different thicknesses of phosphor with feedback-based control in accordance with various embodiments of the invention.

FIG. 30 shows another embodiment of a system to optimize the phosphor and LEE combination. LEEs 210 may be placed on a film or base 3010. A barrier 3015 is optionally present to contain phosphor 420. LEEs 210 are energized to provide a signal to a detector 3030. The signal is then sent to a controller 3040 that controls a series of actuator pins 3020 on an actuator base 3025. If more phosphor is desired above a particular LEE 210, the associated actuator pin 3020 may move down or remain in place. For LEEs 210 that require less phosphor above them, the associated actuator pin 3020 may move up or remain in place. In one embodiment, all LEEs 210 are actuated simultaneously and detector 3030 simultaneously detects the light from each LEE 210 and its surrounding phosphor 420. In one embodiment, each LEE 210 is energized separately. Thus, detector 3030 may be a fixed or moveable detector, or a stage upon which actuator base 3010 is positioned may be moved relative to detector 3030. After all actuator pins 3020 are in their correct position, phosphor 420 may be cured and the resulting structure processed as described elsewhere in this description. In one embodiment actuator pins 3020 are controlled in response to a map of the characteristics of LEEs 210.

Structures such as those discussed in relation to FIG. 12 or that utilize shaped or textured phosphor may also be manufactured by an additive or subtractive process, carried out during or after the formation of white dies 200. For example, in some embodiments a white die 200 having any shape is subsequently shaped by addition of more phosphor either uniformly or selectively over portions of white die 200. In some embodiments, a white die 200 having any shape is subsequently shaped by removal of one or more portions of phosphor either uniformly or selectively over portions of white die 200.

Figure 31A:
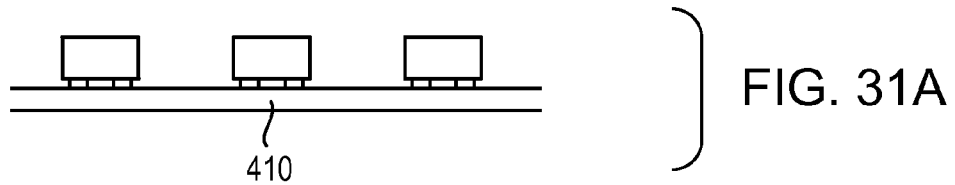
FIGS. 31A-31C are cross-sectional schematics of process steps utilized to treat portions of a substrate for reduced adhesion to phosphor in accordance with various embodiments of the invention.
Figure 31B:
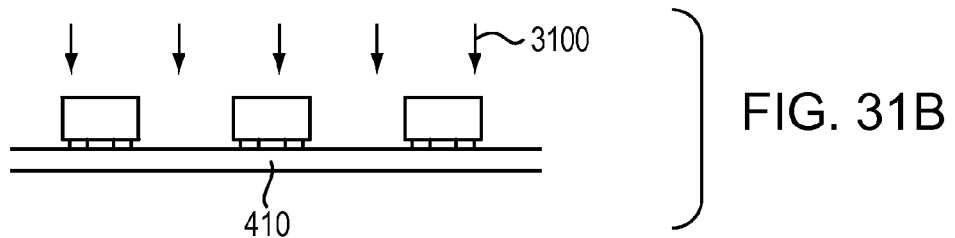
Figure 31C:
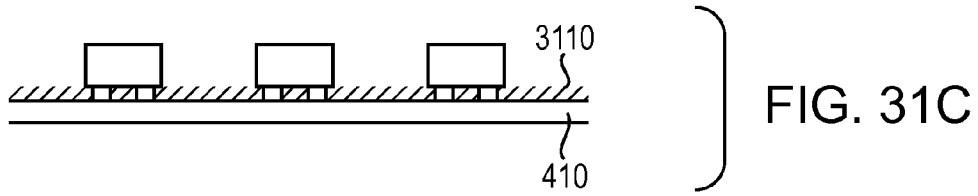

In some embodiments of the present invention it may be desirable to facilitate removal of the white dies or white die wafer from mold substrate 410. For example in some cases the adhesion of phosphor to mold substrate 410 may be relatively high and reduction of the adhesion may facilitate the manufacturing process. In some embodiments mold substrate 410 may be formulated or treated to have difference levels of adhesion to facilitate various aspects of the process. For example, mold substrate 410 may have regions of relatively higher adhesion under LEEs 210 and regions of relatively lower adhesion in the areas between LEEs 210. In some embodiments this may facilitate adhesion of LEEs 210 to mold substrate 410 during the initial steps in the process, while also facilitating removal of the white dies or white die wafer from mold substrate 410 after the phosphor is cured or partially cured. FIGS. 31A-31C show one embodiment of such an approach, starting with FIG. 31A, in which LEEs 210 are formed over mold substrate 410. FIG. 31B shows the structure of FIG. 31A at a later stage of manufacture, in which the structure is treated using treatment 3100 to reduce the adhesion level of mold substrate 410 in general or to phosphor 230 in particular. FIG. 31C shows the structure of FIG. 31B after treatment 3100, with regions 3110 having relatively reduced adhesion after treatment 3100. In some embodiments, treatment 3100 may be a plasma treatment, a wet chemical treatment, exposure to radiation or the like. In some embodiments treatment 3100 may include formation of a material, for example a mold release compound on mold substrate 410, to facilitate removal of the white dies or white die wafer after the phosphor is cured. In some examples of this embodiment, the material that was formed on the top of LEEs 210 during treatment 310 (if any) may be left in place, while in others the material formed on the top of LEEs 210 may be removed before formation of phosphor 230. The specific treatment 3100 is not a limitation of the present invention.

FIGS. 31A-31C show one embodiment using LEEs 210 as the mask for treatment 3100; however, this is not a limitation of the present invention, and in other embodiments other approaches may be used. For example a stencil or mask may be applied to or over mold substrate 410 to provide the pattern for application of treatment 3100. In one embodiment treatment 3100 is applied selectively, without the need for a stencil or mask. For example treatment 3100 may be applied by an applicator on an x-y stage that is moved over mold substrate 410, or mold substrate 410 may be moved under a fixed applicator. In one embodiment the adhesion may be reduced by removal of all or a portion of the adhesive layer or component on mold substrate 410. In different embodiments this may be done by spraying, dispensing, scraping or the like. In some embodiments, treatment 3100 may include or consist essentially of, for example, one or more of: application of a primer, application of a mold release material, plasma treatment, ozone treatment, and/or application of particles.

Figure 32A:
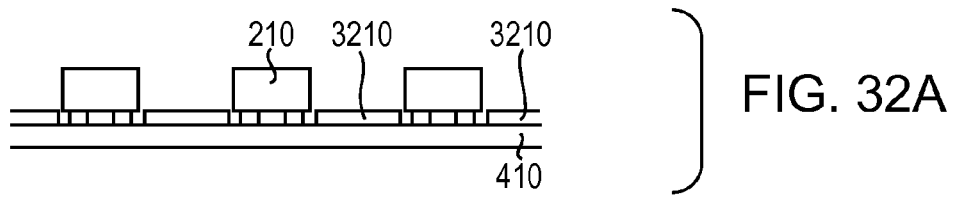
FIGS. 32A and 32B are cross-sectional schematics of process steps utilized to fabricate white dies in accordance with various embodiments of the invention.
Figure 32B:
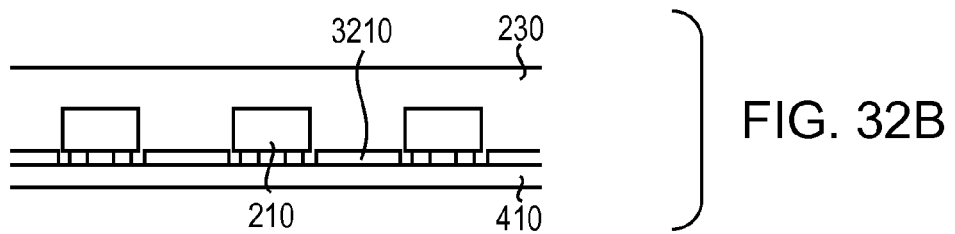

In another embodiment a film may be selectively applied to mold substrate 410 that has reduced adhesion to cured phosphor 230. FIGS. 32A and 32B show one embodiment of such an approach. FIG. 32A shows LEEs 210 on mold substrate 410. A film 3210, for example a mold release film, has been selectively applied to this structure. Application may be done before or after provision of LEEs 210 on mold substrate 410. In some embodiments film 3210 includes a cut-out or hole which leaves an open area for positioning of LEEs 210 directly on mold substrate 410 while in other cases the cut-out permits overlaying film 3210 on mold substrate 410 after LEEs 210 are formed on mold substrate 410. FIG. 32B shows the structure of FIG. 32A after application and curing of phosphor 320. As may be seen, this structure may facilitate the removal of white dies (after singulation) or the white die wafer because the regions including film 3210 have reduced adhesion to phosphor 230.

Figures 33A, 33B:
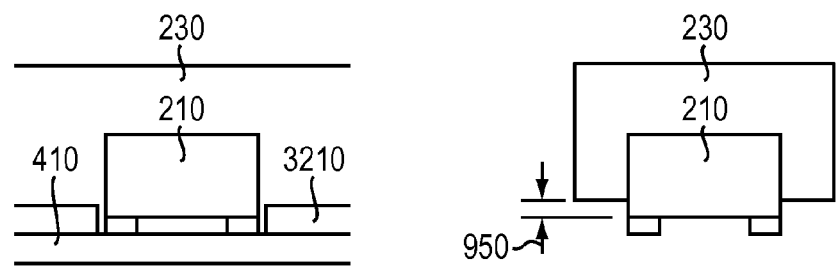

In one embodiment film 3210 may be used as a method to control die and/or contact relief, as shown schematically in FIGS. 33A and 33B. FIG. 33A shows a close-up view of one die from FIG. 32B showing the thickness of film 3210 relative to the edge of LEE 210. The thickness of film 3210 may be adjusted to achieve a certain die relief 950, as shown in FIG. 33B for the white die of FIG. 33A after singulation and removal from mold substrate 410. In one embodiment film 3210 may be spaced apart from the edge of LEE 210, as shown in FIG. 33C to produce a white die with a stepped die relief 950, as shown in FIG. 33D.

In some embodiments mold substrate 410 may be composed of more than one material, where each of the materials is optimized for a specific purpose. For example FIG. 34 shows mold substrate 410 having portions 3410 and 3420. In one embodiment portion 3410 is optimized to have an adhesive level appropriate to hold LEEs 210 in place during the process, while portion 3420 is optimized to have an adhesive level low enough to permit facile removal of cured phosphor 230.

In yet another embodiment mold substrate 410 includes or consists essentially of a compressible or deformable material, into which all or a portion of the contacts and/or a portion of LEE 210 may be embedded, as shown in FIGS. 35A and 35B. FIG. 35A shows all or portions of the contacts embedded into mold substrate 410, while FIG. 35B shows the contacts and a portion of the sidewall of the die embedded into mold substrate 410. In some embodiments this may be used as a way to control die and/or contact relief. In some embodiments the deformable layer may comprise an adhesive layer on mold substrate 410, while in other embodiments the deformable layer may not have substantial adhesion to LEEs 210. In one embodiment the mold substrate is patterned or structured to control the die relief; for example, the mold substrate may have an indentation into which a portion of LEE 210 is inserted, as shown in FIG. 36.

While the discussion above has focused on reduction of adhesion in the regions adjacent to LEEs 210, other approaches may be utilized, for example to increase the adhesion in the region under LEEs 210. For example, mold substrate 410 may have a relatively low adhesion, in particular to phosphor 230, but then may not have sufficient adhesion to hold LEEs 210 in place during the process. In some embodiments, such a mold substrate 410 may be treated to increase the adhesion level in the region under LEEs 210. For example, in one embodiment an adhesive may be selectively deposited on a "non-stick" mold substrate 410. In some embodiments selective application of an adhesive may be done by screen printing, stencil printing, selective spraying, application of adhesive tape or the like.

In one embodiment mold substrate 410 includes a plurality of holes to which are applied a vacuum. LEEs 210 are placed over the holes and held in place by vacuum applied to the holes as shown in FIG. 37. FIG. 37 shows mold substrate 410 with holes 3710 that are connected by way of connection 3720 to a source of vacuum or a vacuum pump. LEEs 210 are held in place by the application of vacuum and then after formation of the white dies or white die wafer the vacuum is removed, facilitating removal of the white dies or white die wafer. While the schematic of FIG. 37 shows one vacuum hole 3710 for each LEE 210, this is not a limitation of the present invention, and in other embodiments each LEE 210 may be associated with more than one vacuum hole 3710. In some embodiments an optional material may be positioned on mold substrate 410 between vacuum holes 3710. The optional material may include a mold release compound, mold release film or other material or film that prevents phosphor 230 from sticking to mold substrate 410.

In some embodiments it may be advantageous to position a second material, for example a pliable or deformable material, between mold substrate 410 and all or a portion of each LEE 210. In one embodiment the pliable or deformable material may facilitate the vacuum seal to LEE 210, improving the adhesion of LEE 210 to mold substrate 410. In one embodiment the pliable or deformable material facilitates removal of the cured white die or white die wafer from mold substrate 410.

In one embodiment mold substrate 410 combines the vacuum holes and a stepped structure, as shown in FIG. 38. FIG. 38 also shows optional second material 3810. In one embodiment the structure of FIG. 38 may be used to control the die and/or contact relief. In some embodiments various elements of the approaches described in relation to the mold substrate may be used in combination or in an order different from that discussed herein.

In the structures discussed above LEE 210 is shown as including a substrate, for example substrate 1710 of FIG. 17A; however, this is not a limitation of the present invention, and in other embodiments the substrate may be partially or completely removed. FIGS. 39A and 39B show schematics of two possible embodiments of white die 3900, 3901, where LEE 3910 has the substrate partially or completely removed. In FIG. 39A, phosphor 230 covers all or substantially all of the top surface but very little or none of the sides of LEE 3910, while in FIG. 39B phosphor 230 covers all or substantially all of the top surface and at least portions of the sides of LEE 3910. In some embodiments, removal of the substrate results in no or very little side emission from LEE 3910, and thus all of the light is emitted from the top surface of LEE 3910. In this case, as shown in FIG. 39A, it may be possible to achieve the desired optical characteristics by covering only all or a portion of the top surface of LEE 3910 with phosphor 230. In an embodiment where side emission still occurs, phosphor may be formed on all or a portion of the sidewall of LEE 3910, as shown in FIG. 39B.

In some embodiments substrate 1710 may include or consist essentially of, e.g., silicon or sapphire or gallium arsenide. In one embodiment the starting structure comprises a III-nitride based LED on a silicon substrate. In one embodiment the starting structure comprises a III-arsenide/phosphide based LED on a gallium arsenide substrate.

FIGS. 40A-40C show one method for manufacture of structures like those shown in FIGS. 39A and 39B. FIG. 40A shows a wafer of LEEs that includes substrate 1710 and device layers 4010 formed over mold substrate 410. In some embodiments device layers 4010 may comprise layers 1720, 1730 and 1740 from FIG. 17A. In FIG. 40A, LEE 3910 is identified by an encircling dashed line and in some embodiments comprises all of structure 1700 from FIG. 17A with the exception of all or a part of substrate 1710. FIG. 40B shows the structure of FIG. 40A at a later stage of manufacture, after substrate 1710 has been removed. In other embodiments the structure of FIG. 40B may include a portion of substrate 1710. FIG. 40C shows the structure of FIG. 40B at a later stage of manufacture, after formation and curing of phosphor 230 and singulation into white die 3900.

Substrate 1710 may be removed by a variety of means, for example using chemical etching, dry etching, reactive ion etching, laser lift-off, lapping, polishing, exfoliation or the like—the method of removal of substrate 1710 is not a limitation of the present invention. In some embodiments a combination of methods may be used to remove substrate 1710. In some embodiments a selective removal process, for example a selective etch, or an etch stop layer, may be used to facilitate removal of substrate 1710.

FIG. 40D shows a portion of one embodiment of a method to make white die 3901 of FIG. 39B. In this embodiment, all or a portion of layers 4010 are removed between adjacent LEEs. In some embodiments a portion of substrate 1710 may also be removed. In this embodiment removal of all or a portion of layers 4010 occurs before formation over mold substrate 410. As may be seen, after substrate 1710 is completely or partially removed, phosphor 230 is formed and cured and singulated, the resulting structure is that of white die 3901, as shown in FIG. 39B. In another embodiment the substrate 1710 with the LEEs 210 thereon is singulated before transfer to mold substrate 410 (similar to the structure shown in FIG. 4A) and then substrate 1710 is completely or partially removed while the LEEs are on the mold substrate 410. The method and order of removing substrate 1710 relative to formation of phosphor 230 is not a limitation of the present invention.

While the structures shown in FIGS. 39A and 39B each include one LEE 3910, this is not a limitation of the present invention, and in other embodiments white die 3900 and 3901 may each include a plurality of LEEs 3901, as shown in FIGS. 40E and 40F. Furthermore, any or all of the techniques and approaches described herein for white dies 210 with substrate 1710 may be applied to white dies without all or a portion of substrate 1710.

In some embodiments the white die wafer may be singulated in a batch or semi-batch mode. In one embodiment white dies are singulated using a rotary cutter, for example a circular blade similar to that of a pizza-cutting tool. In one embodiment multiple blades may be ganged together on a common shaft to make multiple cuts simultaneously, reducing singulation time. In some embodiments a custom one-piece blade having multiple cutting surfaces may be utilized. Such parallelism may be used for other approaches, for example dicing or sawing or laser cutting or water jet cutting. Die cutting, in which a die is manufactured that singulates all or a group of white die simultaneously is another batch singulation technique that may be utilized in embodiments of the present invention.

In some embodiments the blade used for singulation may be angled to form a sloped sidewall of the white die. In some embodiments a shaped blade may be used to impart a shape to the white die, as shown in FIGS. 41A and 41B, where blade 4100 is shown to have two exemplary shapes, resulting in complementary shapes in phosphor 230.

In some embodiments the phosphor may be shaped to provide a surface or a portion of a surface to facilitate a transfer operation, for example a pick-and-place operation. For example, a structure with a curved phosphor surface may have a flat portion to facilitate pick-up using a vacuum tool. In some embodiments one or more features may be formed in the phosphor to act as identifying marks or fiducial marks that may be recognized by semi-automated or automated equipment. For example, in some embodiments such alignment of fiducial marks may be used by an automated pick-and-place tool to identify and orient the white dies for pick-up as well as for placement on a wiring board. Such orientation may include locating the center of the white die, the position of the contacts, or the polarity of the white die (i.e., which contact is the p-contact and which is the n-contact). FIGS. 42A-42D depict some examples of such fiducial marks, including chamfers (FIG. 42A), grooves (FIG. 42B), raised regions (FIG. 42C), and sloped surfaces (FIG. 42D). These examples are meant to demonstrate the concept but not be limiting to the invention. Such features may be designed to be visible by cameras or vision systems, or to reflect light differently from the rest of the surface of white die 210 and thus facilitate identification of the white die as well as its orientation and position. Such alignment of fiducial features may be formed as part of the white die formation process. For example, such features may be part of the mold, or they may be formed after curing or partial curing of phosphor 230, e.g., by laser cutting, indentation, ablation or the like. The method of formation of the fiducial marks is not a limitation of the present invention.

Figure 43B:
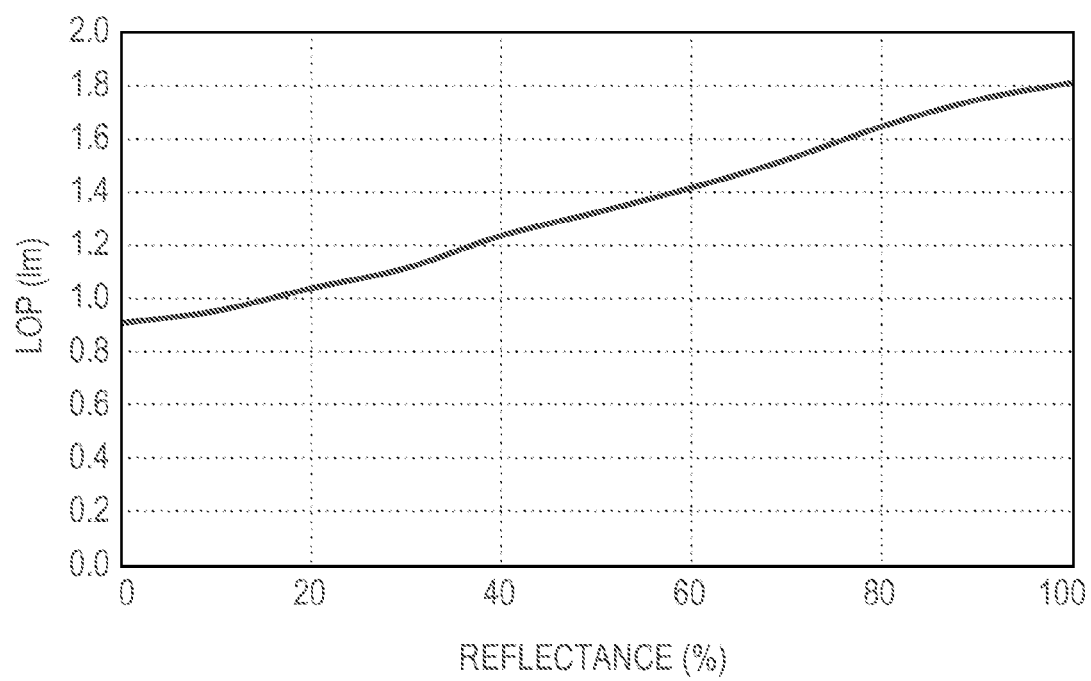
FIG. 43B is a graph showing light output power as a function of reflectance in accordance with various embodiments of the invention.

In one embodiment of the present invention a reflecting layer is formed on all or a portion of the surface of white die 200 to reflect light back in a direction away from the contacts. In some embodiments, a portion of the light may be partially absorbed by one or more materials under white die 200, and it may be advantageous to reflect the light rather than allowing it to be absorbed. FIG. 43A shows a white die 4300 that includes reflecting layer 4310. Reflecting layer 4310 may be reflective to a wavelength of light emitted by phosphor 230 and/or LEE 210. In some embodiments reflecting layer 4310 has a reflectivity greater than 25% to a wavelength of light emitted by phosphor 230 and/or LEE 210. In some embodiments reflecting layer 4310 has a reflectivity greater than 50% to a wavelength of light emitted by phosphor 230 and/or LEE 210. In some embodiments reflecting layer 4310 has a reflectivity greater than 75% to a wavelength of light emitted by phosphor 230 and/or LEE 210. FIG. 43B shows a simulation of a white die in which the reflectance of reflecting layer 4310 is varied from 0 to 100%. As shown, in some embodiments, increasing the reflectance results in a substantial increase in light output power (LOP). For this example, if reflecting layer 4310 has almost no reflectivity, the light output power is about 0.9 lm, while if reflecting layer 4310 has about 100% reflectivity, the light output power is about 1.8 lm, which is an increase by a factor of about two.

There are a number of ways in which a reflecting layer may be formed. In one embodiment a powder of a material that is reflective to a wavelength of light emitted by phosphor 230 and/or LEE 210 is dispersed over mold substrate 410 after formation of LEE 210 on mold substrate 410, as shown in FIG. 44A. As seen in FIG. 44A, this may result in a portion 4410 of the powder on top of LEE 210 and a portion 4420 of the powder directly on mold substrate 410. In some embodiments powder 4420 may adhere to mold substrate 410 but not adhere well to the top of LEE 210, and the structure shown in FIG. 44 may be tilted, inverted, exposed to a jet of gas, shaken or otherwise processed to remove powder 4410 on top of LEEs 210. The white die formation process may then be applied to the structure shown in FIG. 44A, resulting in white die 4300 (FIG. 43A) where reflecting layer 4310 is composed of the reflecting powder. In some embodiments the reflective powder may include at least one of polystyrene, polyester, glass, barium titanate glass, gold, silver, aluminum, mica, silica, PMMA, fumed silica, fumed alumina, $TiO_2$ or the like; however, the composition of the reflective powder is not a limitation of the present invention. In some embodiments, powder 4410, 4420 is formed of particles that have a dimension in the range of about 0.01 μm to about 100 μm, or preferably in the range of about 1 μm to about 50 μm. In some embodiments, the layer of phosphor into which powder 4420 is adhered, embedded or infused has a thickness in the range of about 0.1 μm to about 30 μm. In some embodiments, it is advantageous for the thickness of the layer of phosphor into which powder 4420 is adhered, embedded or infused to be less than the thickness of LEE 210, such that it does not occlude the light emitted from the side of LEE 210. In some embodiments, the phosphor layer into which is adhered, embedded or infused powder 4420 has a thickness less than about 50% of the thickness of LEE 210, or less than about 25% of the thickness of LEE 210, or less than about 10% of the thickness of LEE 210.

In some embodiments, material 4310 includes or consists essentially of reflective or partially reflective beads, for example having a spherical or substantially spherical shape. In some embodiments, the particles or beads may be solid, while in other embodiments the particles or beads may be hollow. In some embodiments, beads 4310 may have diameters in the range of about 0.1 μm to about 150 μm, while in other embodiments they may have diameters in the range of about 1 μm to about 75 μm. In some embodiments, the beads may be white and have a reflectivity to a wavelength of light emitted by LEE 210 and/or phosphor 230 greater than about 70%. In some embodiments, the beads or particles may have a refractive index of at least 1.35, or at least 1.5, or at least 1.9. In some embodiments, the beads or particles have a refractive index that is at least 10% larger than the refractive index of the phosphor or binder or at least 25% larger than the refractive index of the phosphor or binder. In some embodiments, the particles may include or consist of more than one material. For example, in some embodiments, the particles may include or consist essentially of a core, which may be solid or hollow, and one or more coatings. For example, in some embodiments, the particle may include or consist of a glass or polymer bead or sphere that is coated with aluminum, gold, silver or the like. In some embodiments, the particle or sphere may be coated with multiple coatings, for example to form a Bragg mirror. In one embodiment, the beads may act as retro-reflectors that substantially redirect the light back in the direction in which it was incident on the bead.

In some embodiments a portion of the bead or particle may protrude from phosphor 230, as shown in FIGS. 44B and 44C. In some embodiments, particles 4430 or 4440 may protrude or extend from phosphor 230. In some embodiments, at least 5% of the particle may protrude from phosphor 230. In some embodiments, at least 20% of the particle may protrude from phosphor 230. In some embodiments, at least 40% of the particle may protrude from phosphor 230. In some embodiments, the protruding portion of the particle may be covered or partially covered by a relatively thin layer of phosphor or binder material. In some embodiments, the protruding portion of the particle may be in contact with an adhesive or an ACA.

Another aspect of this approach is that it may be used to modify the adhesion of cured phosphor 230 to mold substrate 410, similar to what has been described elsewhere herein. For example, if the reflective layer is formed from a powder, the powder may also reduce the adhesion of cured phosphor 230 to mold substrate 410. If the reflective layer is a film, as discussed subsequently, it may act to or be engineered to reduce the adhesion of cured phosphor 230 to mold substrate 410, similar to the discussion related to the mold release film.

Figure 45A:
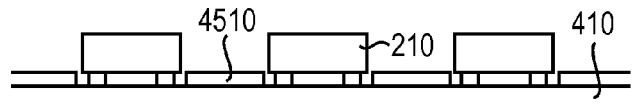
FIGS. 45A-45C are cross-sectional schematics of process steps utilized to fabricate white dies with reflecting films in accordance with various embodiments of the invention.
Figure 45B:
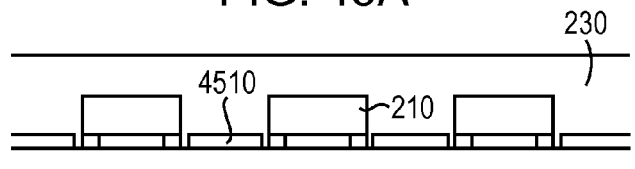
Figure 45C:
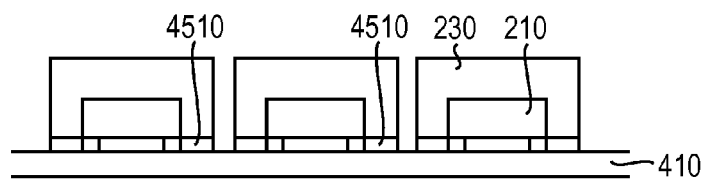

In another embodiment of this approach, the reflecting layer is formed using a reflective film. For example, a reflecting film 4510, similar to a mold release film, may be positioned over a portion of mold substrate 410, as shown in FIG. 45A. After formation and curing of phosphor 230 (FIG. 45B) and singulation (FIG. 45C), reflecting film 4510 adheres to and/or is embedded into cured phosphor 230 of the white die instead of acting to reduce adhesion between cured phosphor 230 and mold substrate 410, as is the case with the mold release film. As discussed herein, the film may, by itself or in combination with other approaches, be used to control die and contact relief. In some embodiments reflective film 4510 includes or consists essentially of metal films or foils such as Cr, Al, Au, Ag, Cu, Ti, or the like. In some embodiments reflective layer 4510 may include or consist essentially of more than one layer. In some embodiments reflective layer 4510 may include or consist essentially of multiple layers of metal. In one embodiment reflective film 4510 may have a thickness in the range of about 0.25 µm to about 50 µm, or preferably in the range of about 5 µm to about 35 µm. In some embodiments the thickness of reflective film 4510 is chosen such that it is not thick enough to occlude a substantial portion of light emitted from the side(s) of LEE 210. In one embodiment reflective film 4510 is a foil that has been patterned with holes corresponding to the position of LEEs 210 on mold substrate 410. In some embodiments, the thickness of the reflective film or particles is advantageously less than the thickness of LEE 210, for example less than about 50% of the thickness of LEE 210, or less than about 25% of the thickness of LEE 210, or less than about 10% of the thickness of LEE 210.

In one embodiment reflective layer 4510 may be deposited on mold substrate 410 and patterned to permit positioning of LEEs 210 directly on mold substrate 410. In one embodiment reflective layer 4510 may be applied selectively to mold substrate 410, for example through a shadow mask or selectively applied by evaporation, sputtering, spraying, or the like. In one embodiment a reflecting layer may be formed by printing, for example screen, stencil, ink jet, gravure, flexo printing or the like. In one embodiment reflective layer 4510 may be composed of more than one layer of materials, for example a carrier and a reflective layer. For example, in some embodiments, reflecting layer 4510 may include or consist essentially of a support substrate that includes or consists essentially of a semicrystalline or amorphous material, e.g., polyethylene naphthalate (PEN), polyethylene terephthalate (PET), acrylic, polycarbonate, polyethersulfone, polyester, polyimide, polyethylene, and/or paper, and the reflecting film may include or consist essentially of aluminum, gold, silver, copper, ink or the like. In another embodiment reflective layer 4510 may be applied to the white wafer after it is formed. For example reflective layer 4510 could be formed by selective deposition of a reflecting layer on the bottom of the white wafer, where the reflective material is formed such that it does not come in electrical contact with any portion of the electrical contacts of LEEs 210. In some embodiments this may be done by deposition of a metal layer, for example, Cr, Al, Au, Ag, Cu, Ti or the like, for example by evaporation, physical vapor deposition, sputtering, chemical vapor deposition, plating or the like. In some embodiments it may be accomplished by lamination of a patterned foil.

Figure 45D:
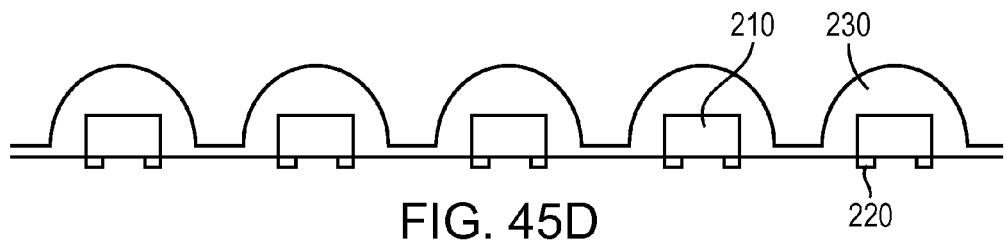
FIGS. 45D, 45E, 45G, and 45H are cross-sectional schematics of white dies in accordance with various embodiments of the invention.
Figure 45E:
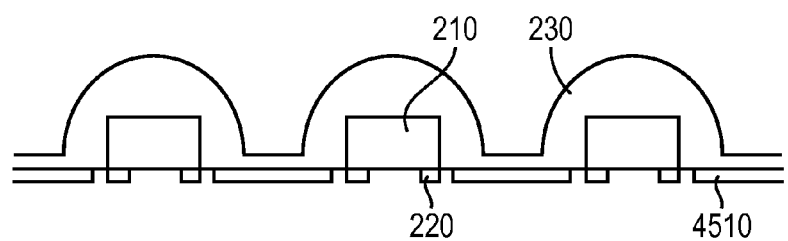
Figure 45F:
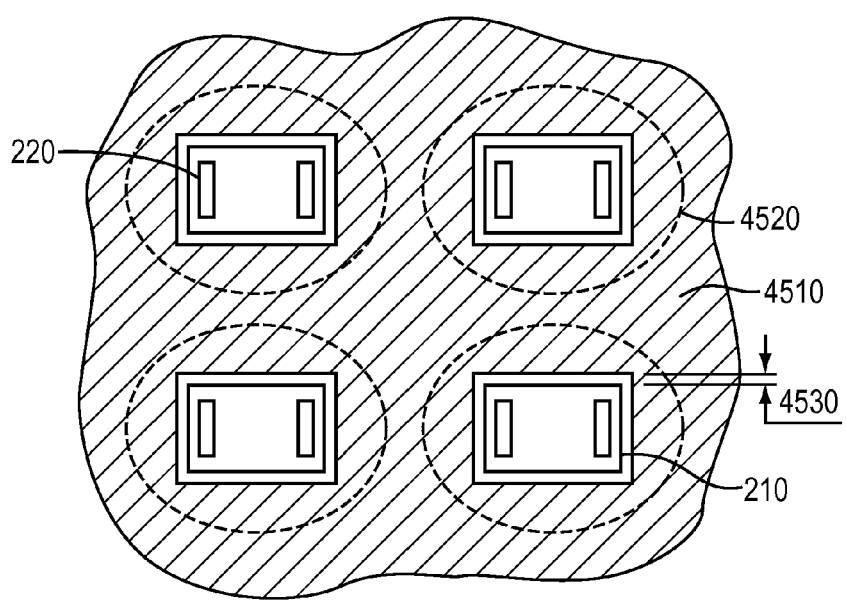
FIG. 45F is a plan-view schematic of white dies in accordance with various embodiments of the invention.
Figure 45G:
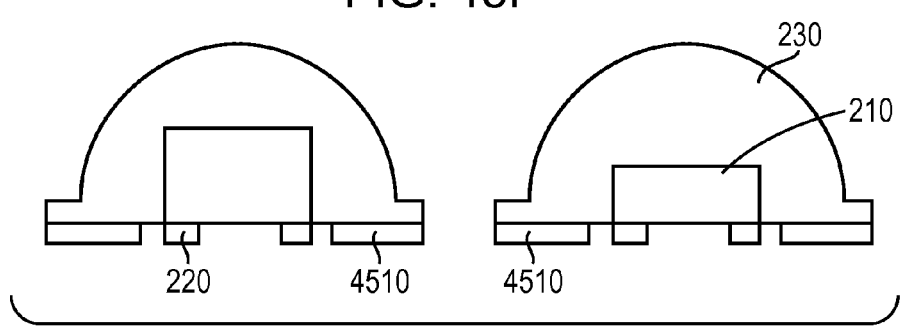

FIG. 45D shows an example of one embodiment of a white wafer including or consisting essentially of LEEs 210 and phosphor 230. In this example, phosphor 230 has a dome-like shape; however, this is not a limitation of the present invention, and in other embodiments phosphor 230 may have any shape. FIG. 45E shows the structure of FIG. 45D at a later stage of manufacture, where reflecting layer 4510 has been formed over a portion of phosphor 230. In the example shown in FIG. 45E, reflecting layer 4510 is formed over substantially all of the face of phosphor 230 containing contacts 220 of LEEs 230. FIG. 45F shows a plan view of the structure of FIG. 45E, from the side facing reflecting layer 4510. In this example, reflecting layer 4510 covers substantially all of the phosphor on this face, except for regions around LEEs 210. In FIG. 45F reflecting layer 4510 is identified as the cross-hatched region and the edge of the dome of phosphor 230 is identified as 4520. In subsequent steps, the structure is singulated, and FIG. 45G shows an example of the structure after singulation. In this example, reflecting layer 4510 and a portion of phosphor 230 are separated to form the individual white dies.

The gap between LEE 210 and reflecting layer 4510, identified in FIG. 45F as 4530 is shown as being the same or substantially the same around the entire periphery of LEE 210; however, this is not a limitation of the present invention, and in other embodiments the gap may vary. In some embodiments, the gap may have a value in the range of about 0 µm to about 300 µm, while in other embodiments the gap may have a value in the range of about 25 µm to about 100 µm. However, in some embodiments the gap is preferably kept as small as possible to increase the amount of light reflected by reflecting layer 4510. In some embodiments, the gap may be negative, that is reflecting layer 4510 may cover a portion of LEE 210. As will be discussed herein, in some embodiments reflecting layer 4510 may cover all or a portion of contacts 220.

Figure 45H:
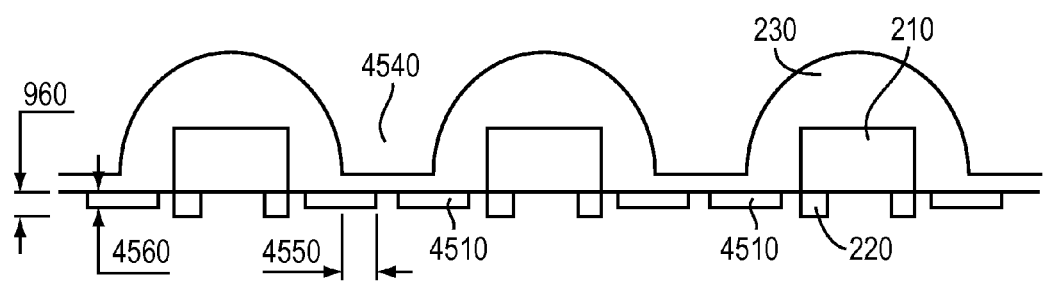

In some embodiments, it may be advantageous to form separate regions of reflecting layer 4510 before singulation of the white die wafer. For example, the singulation technique and process parameters may be relatively difficult to optimize for multiple sets of materials, for example in the case where reflecting layer 4510 includes or consists essentially of a metal and phosphor 230 includes or consists essentially of a polymer. FIG. 45H shows an example of a structure similar to that of FIG. 45E, with the exception that reflecting layer 4510 is absent from the region between white dies, identified as 4540 in FIG. 45H, also known as the street region, where singulation of the white die wafer occurs. In the example shown in FIG. 45H, reflecting layer 4510 extends into street region 4540 by an amount 4550. In some embodiments, the extension amount 4550 may be positive, as shown in FIG. 45H, where reflecting layer 4510 extends into street region 4540, while in other embodiments extension amount 4550 may be negative, that is there is a gap between reflecting layer 4510 and street region 4540. In some embodiments, a positive extension 4550 may have a value in the range of about 0 to about 25% of the width of street region 4540; however, this is not a limitation of the present invention, and in other embodiments extension 2420 may have any value. In some embodiments, a negative extension 4550 may have a value in the range of about 0 to about 25% of the width of the white die; however, this is not a limitation of the present invention, and in other embodiments extension 4550 may have any value. A negative extension 4550, however, will decrease the reflecting area, and in some embodiments a negative extension 2420 is preferably minimized or eliminated. In some embodiments, street region 4540 is advantageously minimized to increase the number of devices manufactured per unit area and to minimize cost. While the discussion in reference to FIGS. 45D-45H has been with respect to dome-shaped phosphor 230, this is not a limitation of the present invention, and in other embodiments phosphor 230 may have any shape.

FIG. 45H shows reflecting layer 4510 having a thickness 4560 less than contact relief 960 in order to aid in making low-contact resistance, robust connection to contacts 220. However, as discussed herein, in other embodiments, particularly where reflecting layer 4510 is in electrical contact with contacts 220, reflecting layer 4510 may have a thickness greater than contact relief 960.

In some embodiments, reflective layer 4310 may be insulating or relatively insulating. For example, reflective layer 4310 may include a dielectric mirror or Bragg reflector, composed of alternating layers of materials with different indices of refraction. Examples of such materials include silicon dioxide, silicon nitride, or mixtures of these materials. In some embodiments reflecting layer 4510 may include or consist essentially of a conductive reflecting metal film formed over an insulating film.

In some embodiments reflective layer 4510 may include or consist essentially of a specular or diffuse reflector. For example a reflective layer 4510 made from powder may provide a more diffuse reflector while a reflective layer 4510 made from a metal foil or film may provide a more specular reflector. Reflective layer 4510 may also include or consist essentially of a diffuse reflective film, such as a white film, for example white PET, other white plastic films, White97 manufactured by WhiteOptics LLC, or MCPET manufactured by Furukawa. In some embodiments, a white ink or paint may be applied selectively to the back of the white wafer to form reflective layer 4510. In some embodiments, reflective layer 4510 may include or consist essentially of a polymer or plastic, such as polyethylene, silicone or epoxy or the like, with a relatively high reflectivity, for example a white diffuse reflector such as Dow Corning MS-2002. In some embodiments the silicone or epoxy may have a reflectivity greater than about 95% or greater than about 95% or greater than about 97%. In some embodiments reflective layer 4510 may include or consist essentially of a white epoxy. In some embodiments reflective layer 4510 may include or consist essentially of a thin layer of reflective epoxy or silicone, over which is subsequently formed phosphor 230. While this discussion has focused on the formation of reflective materials or layer(s) to the white wafer, such approaches may also be applied to singulated white dies.

In some embodiments material 2740 (FIG. 27) may be reflective to a wavelength of light emitted by LEE 210 and/or phosphor 230. For example, material 2740 may include or consist essentially of a conductive adhesive or an anisotropic conductive adhesive that is reflective to a wavelength of light emitted by LEE 210 and/or phosphor 230. In some embodiments material 2740 may have a reflectivity of greater than about 50% or greater than about 70% or greater than about 85% to a wavelength of light emitted by LEE 210 and/or phosphor 230. In one embodiment material 2740 may include or consist essentially of a reflective ACA.

Figure 46A:
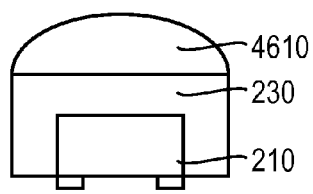
FIGS. 46A-46C are cross-sectional schematics of white dies incorporating optical elements in accordance with various embodiments of the invention.
Figure 46B:
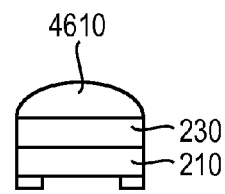
Figure 46C:
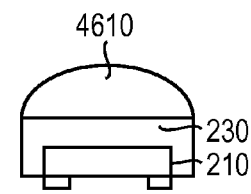

In some embodiments the molding of the phosphor to the die may be combined with one or more other processes. For example, in one embodiment an optical element (e.g., a lens) may be co-molded or molded simultaneously to the white die. Such structures are shown in FIGS. 46A-46C. FIG. 46A shows an example of a white die incorporating optical element 4610, while FIGS. 46B and 46C show examples of white dies with an optical element 4610 in which the substrates of the light-emitting elements have been partially or completely removed.

Figure 47A:
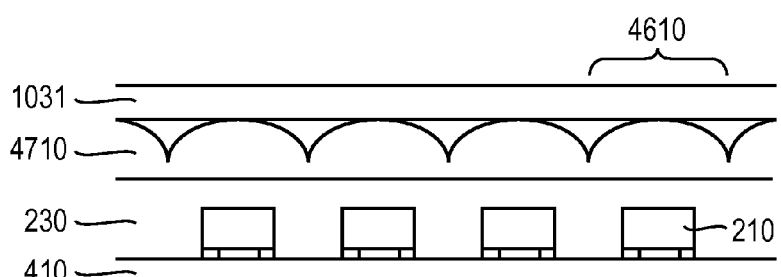
FIGS. 47A and 47B are cross-sectional schematics of process steps utilized to fabricate the white die for FIG. 46A in accordance with various embodiments of the invention.
Figure 47B:
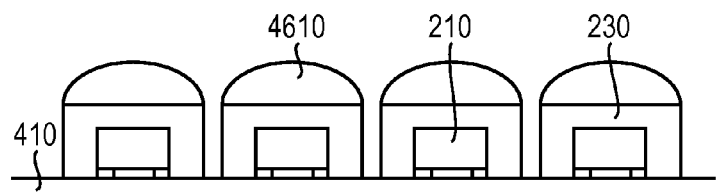

In one embodiment structures like those shown in FIGS. 46A-46C may be formed by adding an array of optical elements to the mold top 1031 during the process for white die fabrication. FIG. 47A shows an optical array 4710 of optical elements between mold top 1031 and phosphor 230. FIG. 47B shows white dies on mold substrate 410 incorporating optical elements 4610 after curing of the phosphor 230 and singulation. In some embodiments, optical element 4610 may be a Fresnel lens or a refractive lens. In some embodiments optical element 4610 may initially be part of an array of optical elements such as optical array 4710 as discussed above, while in other embodiments one or more optical elements 4610 may be positioned individually in the formation process. In one embodiment optical array 4710 may be all or a portion of the mold top 1031.

Figure 48:
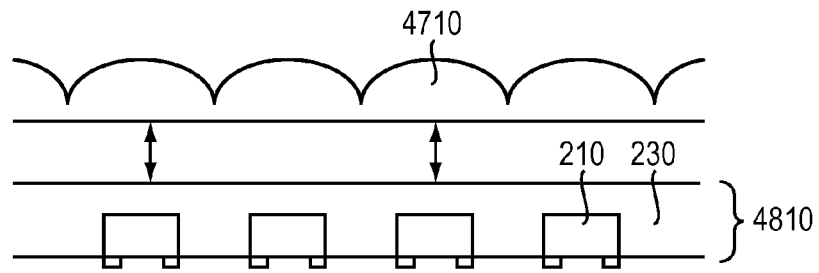
FIG. 48 is a cross-sectional schematic of a processing step utilized to couple optical elements to a white wafer of white dies in accordance with various embodiments of the invention.

In another embodiment optical array 4710 may be joined to a white die wafer 4810 after fabrication of white die wafer 4810, as shown in FIG. 48. In one embodiment phosphor 230 of white die wafer 4810 may be partially cured, mated to optical array 4710, and then be subjected to additional curing to physically attach optical array 4710 to white die wafer 4810. In one embodiment an adhesive may be used to attach optical array 4710 to white die wafer 4810. Examples of adhesives include optical adhesives, spray adhesives, adhesive tape, polyurethane, the same material used as the binder for phosphor 230, or the like. The method of attachment of optical array 4710 to white die wafer 4810 is not a limitation of the present invention. In some embodiments the adhesive has an index of refraction that provides index matching between phosphor 230 and optical array 4710. In some embodiments, after attachment of optical array 4710 to white die wafer 4810, singulation takes place to separate the structure into smaller elements, each containing at least one LEE 210 and one optical element 4610.

Figure 50:
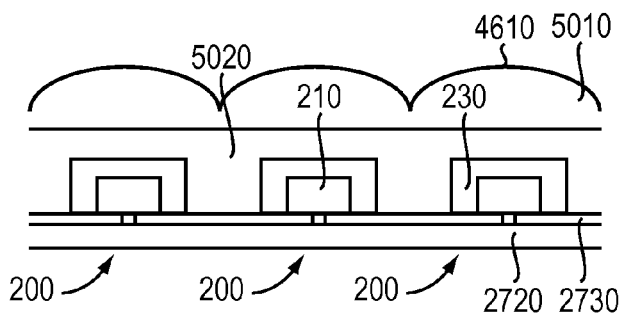
FIGS. 50 and 51 are cross-sectional schematics of lighting devices incorporating white dies and optical elements in accordance with various embodiments of the invention.

As shown, optical array 4710 includes or consists essentially of one or more optical elements 4610, which in FIGS. 47A and 50 are aligned or substantially aligned with white dies 200. Optical array 4710 typically features an array of optical elements 4610; in some embodiments, one optical element 4610 is associated with each white die 200, while in other embodiments multiple white dies 200 are associated with one optical element 4610, or multiple optical elements 4610 are associated with a single white die 200, or no engineered optical element is associated with any white die 200, for example all or portions of optical array 4710 may be a plate with a flat or roughened surface. In one embodiment, optical array 4710 includes elements or features to scatter, diffuse and/or spread out light generated by white dies 200.

Optical array 4710 may be substantially optically transparent or translucent. For example, optical array 4710 may exhibit a transmittance greater than 80% for optical wavelengths ranging between approximately 400 nm and approximately 600 nm. In one embodiment, optical array 4710 includes or consists essentially of a material that is transparent to a wavelength of light emitted by white dies 200. Optical array 4710 may be substantially flexible or rigid. In some embodiments, optical array 4710 includes multiple materials and/or layers. Optical elements 4610 may be formed in or on optical array 4710. Optical array 4710 may include or consist essentially of, for example, acrylic, polycarbonate, polyethylene naphthalate (PEN), polyethylene terephthalate (PET), polycarbonate, polyethersulfone, polyester, polyimide, polyethylene, silicone, polyurethane, glass, or the like. Optical elements 4610 may be formed by etching, polishing, grinding, machining, molding, embossing, extruding, casting, or the like. The method of formation of optical elements 4610 is not a limitation of embodiments of the present invention.

Optical elements 4610 associated with optical array 4710 may all be the same or may be different from each other. Optical elements 4610 may include or consist essentially of, e.g., a refractive optic, a diffractive optic, a total internal reflection (TIR) optic, a Fresnel optic, or the like, or combinations of different types of optical elements. Optical elements 4610 may be shaped or engineered to achieve a specific light distribution pattern from the array of light emitters, phosphors and optical elements.

As used herein, "alignment" and "aligned" may mean that the center of one structure, for example a white die 200, is aligned with the center of another structure, for example an optical element 4610; however, this is not a limitation of the present invention, and in other embodiments, alignment refers to a specified relationship between the geometry of multiple structures.

Figure 49A:
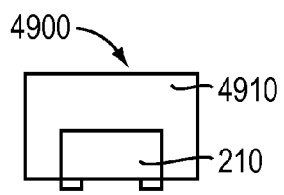
FIGS. 49A-49E are cross-sectional schematics of clear dies in accordance with various embodiments of the invention.
Figure 49B:
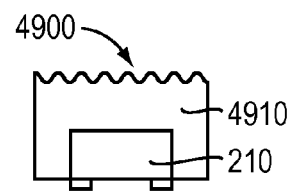
Figure 49C:
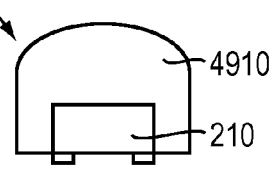
Figure 49D:
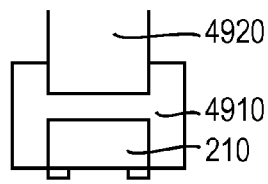
Figure 49E:
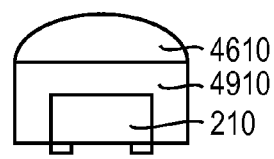

While the discussion above has mainly focused on light-emitting devices that include a phosphor, this approach may be used as an approach to economically make light-emitting devices without the phosphor, where the material surrounding the LEE is a transparent material 4910 with no light-conversion material, as shown in FIGS. 49A-49E. This may be called a "clear die" 4900. In this case the transparent material may be called a binder or an encapsulant. In this case the structure would appear similar to the examples discussed above, with the difference being that there is no light-conversion material present and the light emitted by such device is that emitted by the LEE. In some embodiments other materials may be present in the binder, for example material to scatter the light. FIGS. 49A-49E show examples of clear dies 4900 that include LEEs 210 and binder or encapsulant 4910. Any or all of the variations discussed with respect to this invention may be used to produce clear dies. This approach permits the low-cost manufacture of clear dies in very large volumes. In some embodiments LEE 210 may include or consist essentially of an LED. In some embodiments LEE 210 may emit light in any visible color range, for example, red, orange, yellow, green, amber, blue, etc., or in wavelengths outside of the visible range, e.g., infrared and ultraviolet. FIGS. 49A-49C show examples of clear dies 4900 with various shapes of binder 4910, while FIG. 49D shows an example of a clear die with a co-molded optical fiber 4920. Optical fiber 4920 may be used for example, for out-coupling of light or monitoring of LEE 210 optical characteristics. Such optical fiber coupling may also be used with white dies. FIG. 49E shows clear die 4900 integrated with an optical element 4610, as discussed above with respect to white dies.

FIGS. 50-58 present different embodiments of the present invention that feature one or more optical elements. FIG. 50 shows the structure of FIGS. 27 and 28 with integrated optical elements. In FIG. 50, each white die 200 has associated therewith an optical element 4610.

As shown, an optic 5010 includes or consists essentially of one or more optical elements 4610, which in FIG. 50 are aligned or substantially aligned with white dies 200. Optic 5010 typically features an array of optical elements 4610; in some embodiments, one optical element 4610 is associated with each white die 200, while in other embodiments multiple white dies 200 are associated with one optical element 4610, or multiple optical elements 4610 are associated with a single white die 200, or no engineered optical element is associated with any white die 200, for example optic 5010 may be a plate with a flat or roughened surface. In one embodiment, optic 5010 includes elements or features to scatter, diffuse and/or spread out light generated by white dies 200.

Optic 5010 may be substantially optically transparent or translucent. For example, optic 5010 may exhibit a transmittance greater than 80% for optical wavelengths ranging between approximately 400 nm and approximately 600 nm. In one embodiment, optic 5010 includes or consists essentially of a material that is transparent to a wavelength of light emitted by white dies 200. Optic 5010 may be substantially flexible or rigid. In some embodiments, optic 5010 is composed of multiple materials and/or layers. Optical elements 4610 may be formed in or on optic 5010. Optic 5010 may include or consist essentially of, for example, acrylic, polycarbonate, polyethylene naphthalate (PEN), polyethylene terephthalate (PET), polycarbonate, polyethersulfone, polyester, polyimide, polyethylene, silicone, glass or the like. Optical elements 4610 may be formed by etching, polishing, grinding, machining, molding, embossing, extruding, casting, or the like. The method of formation of optical elements 4610 is not a limitation of embodiments of the present invention.

Optical elements 4610 associated with optic 5010 may all be the same or may be different from each other. Optical elements 4610 may include or consist essentially of, e.g., a refractive optic, a diffractive optic, a total internal reflection (TIR) optic, a Fresnel optic, or the like, or combinations of different types of optical elements. Optical elements 4610 may be shaped or engineered to achieve a specific light distribution pattern from the array of light emitters, phosphors and optical elements.

The space 5020 between the back side of optic 5010 and white die 200, shown in FIG. 50, may be a partial vacuum or be filled with air, filled with a fluid or other gas or filled or partially filled with one or more other materials. In one embodiment, region 5020 is filled or partially filled with a transparent material, similar or identical to the material that is used as the binder for phosphor 230, to reduce TIR losses in white dies 200 and to provide enhanced optical coupling between white dies 200 and optics 4610. In some embodiments, region 5020 is filled with a material providing an index of refraction match between white die 200 and optic 5010.

Figure 51:
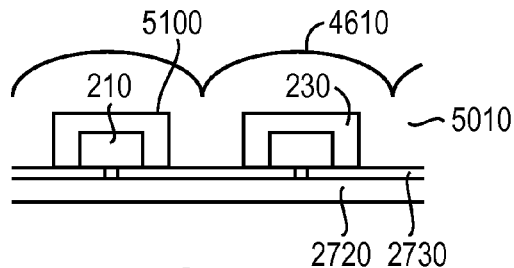
Figure 52:
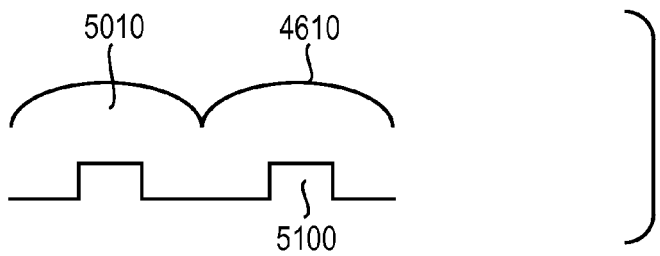
FIGS. 52 and 53 are cross-sectional schematics of components of the lighting device of FIG. 51.
Figure 53:
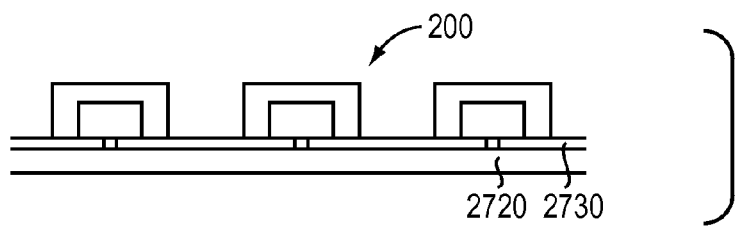

The structure shown in FIG. 51 is similar to that shown in FIG. 50; however, in FIG. 51, depressions 5100 are formed in optic 5010, to accommodate or partially accommodate white dies 200. White dies 200 may be formed or inserted into depressions 5100, for example in a batch process or using a pick-and-place tool. White dies 200 may be held in depressions 5100 mechanically, or with an adhesive or glue. In one embodiment, white dies 200 are held in place by a transparent material similar or identical to the binder or matrix used with phosphor 230. In one embodiment, depression 5100 is larger than white die 200. In one embodiment, depression 5100 is sized to just accommodate white die 200. FIGS. 52 and 53 show components of the structure of FIG. 51 at an early stage of manufacture. FIG. 52 shows optic 5010 with depressions 5100. FIG. 53 shows LEE substrate 2720, conductive traces 2730 and white dies 200. These two structures shown in FIGS. 52 and 53 are mated together to form the structure in FIG. 51.

Figure 54:
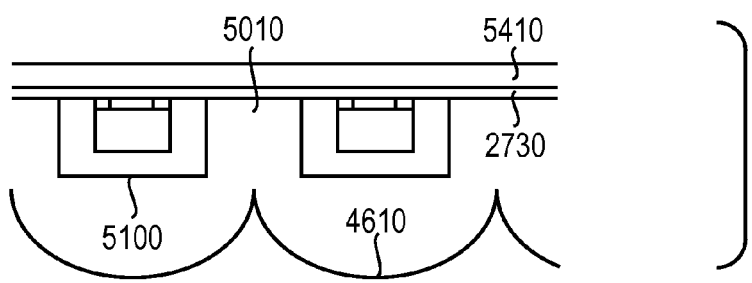
FIG. 54 is a cross-sectional schematic of a lighting device incorporating white dies and optical elements in accordance with various embodiments of the invention.
Figure 55:
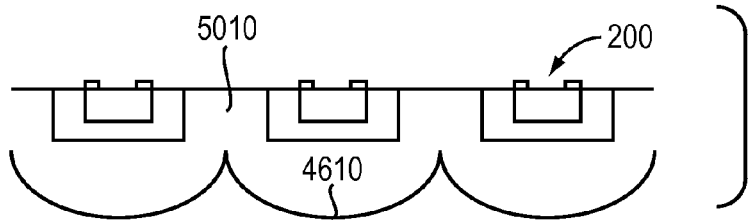
FIG. 55 is a cross-sectional schematic of a component of the lighting device of FIG. 54.

The structure shown in FIG. 54 is similar to that shown in FIG. 51; however, in the case of the structure of FIG. 54, white dies 200 are formed or placed into depressions 5100 in optic 5010 with the contacts facing out, and conductive traces 2730 are formed over optic 5010 and contacts 220, electrically coupling white dies 200. In this embodiment, LEE substrate 2720 is eliminated. Conductive traces 2730 may be formed using a variety of methods, for example physical vapor deposition, evaporation, sputtering, chemical vapor deposition, lamination, lamination and patterning, plating, printing, ink jet printing, screen printing, gravure printing, flexo printing or the like. In one embodiment, a reflective surface 5410 is formed over the back of optic 5010 so that all or a substantial or controlled portion of light emitted from the back side of white dies 200 is reflected back toward optics 4610. The reflective surface 5410 may include a metal such as gold, silver, aluminum, copper or the like and may be deposited by evaporation, sputtering, chemical vapor deposition, plating, electroplating or the like, or may include a reflective coating such as paint, ink or the like, for example white ink or white paint. If the reflective coating is electrically conductive, it may be isolated from conductive traces 2730 or may be isolated from (e.g., removed in) the regions occupied by conductive traces 2730. The reflective coating may be non-conductive. The reflective coating may be formed either over or under conductive traces 2730. The reflective coating may cover all or portions of white dies 200 and/or conductive traces 2730. The reflective coating may also include other materials, e.g., a Bragg reflector, or one or more layers of a specular or diffuse reflective material. In one embodiment, optic 5010 is backed with a reflective material, e.g., White97 manufactured by WhiteOptics LLC or MCPET manufactured by Furukawa, or any other reflective material. In one embodiment, conductive traces 2730 include or are formed of a material reflective to a wavelength of light emitted by white dies 200 and are patterned to provide a region of reflective material surrounding white dies 200. The use of such reflective materials, or a reflective LEE substrate 2720, may be applied to any configuration of light system, for example those shown in FIGS. 50-57. FIG. 55 shows the structure of FIG. 54 at an early stage of manufacture, prior to formation of conductive traces 2730 and optional reflective layer 5410.

Figure 56:
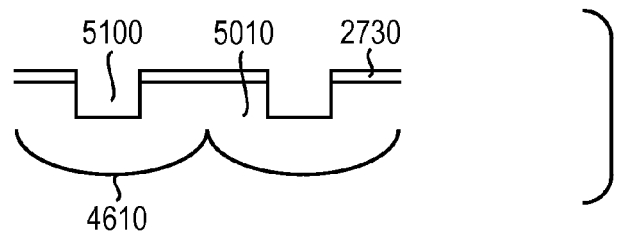
FIG. 56 is a cross-sectional schematic of an optic utilized in lighting devices in accordance with various embodiments of the invention.
Figure 57:
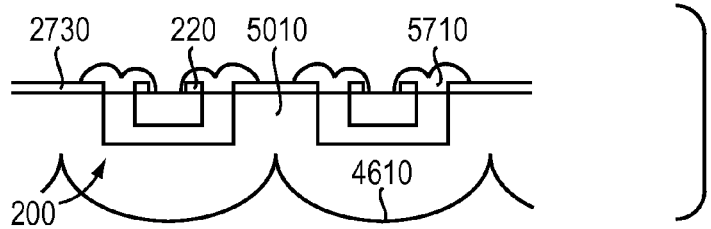
FIG. 57 is a cross-sectional schematic of a lighting device incorporating the optic of FIG. 56 in accordance with various embodiments of the invention.

The structures shown in FIGS. 56 and 57 are similar to that shown in FIG. 54; however, in this case conductive traces 2730 are formed over optic 5010 before formation or placement of white dies 200, as shown in FIG. 56. After formation or placement of white dies 200 in depressions 5100, contacts 220 on white dies 200 are electrically coupled to conductive traces 2730 using jumpers (i.e., discrete conductors) 5710. Jumpers 5710 may be formed by a variety of different techniques. In one embodiment, conductive material is formed and patterned over the surface of optic 5010, for example by evaporation, sputtering, lamination, plating, or the like, and patterning may be performed using photolithography, shadow mask, stencil mask, or the like. In one embodiment, jumpers 5710 are formed by printing, for example by screen printing, stencil printing, ink jet printing, or the like. In one embodiment jumpers 5710 are formed by wire bonding. Jumpers 5710 may have a rectangular shape, but this is not a limitation of the present invention and in other embodiments jumpers 5710 have trapezoidal, square or any arbitrary shape. Jumpers 5710 may include one or more conductive materials, for example aluminum, gold, silver, platinum, copper, carbon, conductive oxides or the like. Jumper 5710 may have a thickness in the range of about 50 nm to about 100 μm. In one embodiment, jumper 5710 has a thickness in the range of about 5 μm to about 30 μm. In one embodiment, jumpers 5710 include materials used for conductive traces 2730 and/or are formed using methods used for forming conductive traces 2730. The method of formation and composition of jumper 5710 are not limitations of the present invention.

The examples discussed above for white die 200 show one LEE 210 in each white die 200. However, this is not a limitation of the present invention and in other embodiments each white die 200 includes a plurality of LEE 210.

The examples discussed above for white dies 200 show white dies 200 as being square and having sidewalls perpendicular to the contact face of LEE 210. However, this is not a limitation of the present invention and in other embodiments white die 200 is rectangular, hexagonal, circular, triangular, or has any arbitrary shape, and/or has sidewalls forming any angle with respect to the surface of LEE 210 including contacts 220. While the term white die, for example related to white die 200, has been used to describe a structure producing white light, this is not a limitation of the present invention, and in other embodiments, different color LEEs 210 and different phosphors (one or more) may be used to produce other colors, for example amber, green or any arbitrary color or spectral power distribution. In other embodiments, a white die 200 includes a plurality of LEEs 210. In some embodiments, the LEEs 210 are all the same, while in other embodiments the LEEs 210 include two or more groups of different LEEs 210, for example emitting at different wavelengths. In some embodiments LEE 210 may include or consist essentially of an organic light emitter.

Figure 58A:
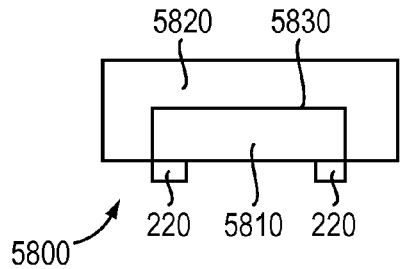
FIGS. 58A-58C are cross-sectional schematics of light-detecting devices in accordance with various embodiments of the invention.

While the discussion above has mainly focused on light-emitting devices, embodiments of the present invention may also be used for devices that absorb light, for example detectors or photovoltaic devices. FIG. 58A shows an exemplary device 5800 that includes a light-absorbing element (LAE) 5810 and binder 5820. In one embodiment LAE 5810 is configured with a flip-chip geometry, in which contacts 220 are positioned on a face opposite a detecting face 5830. In one embodiment LAE 5810 has a structure similar to that for LEE 1700 shown in FIG. 17A. In one embodiment the substrate for LAE 5810 is partially or completely removed. LAE 5810 may be configured to detect one or more wavelengths over a wide range of wavelength ranges, both within and/or outside the visible light spectrum. In various embodiments LAE 5810 may be configured to detect UV light, IR light, x-rays, visible light or any portion of the electromagnetic spectrum for which a detector is available. In some embodiments LAE 5810 may include GaAs, InAs, AlAs, GaN, InN, AlN, GaP, InP, AlP, InGaP, InAlP, InGaAlP, ZnO, II-VI materials or the like or various combinations of two or more of these materials. The material from which LAE 5810 is composed is not a limitation of the present invention.

In some embodiments LAE 5810 may be a Schottky detector, a p-n junction detector, a photoelectric detector, a photocell, a photoresistor, a photodiode, a phototransistor, a charge-coupled device, a CMOS imager or the like. The type of LAE 5810 and method by which LAE 5810 operates are not limitations of the present invention.

In one embodiment binder 5820 is transparent to a wavelength of light to be detected by LAE 5810. In one embodiment binder 5820 may be partially absorbing and the absorption band of binder 5820 may be used to select one or more wavelength ranges to be detected by LAE 5810 from the range of incident wavelength ranges. For example binder 5820 may effectively act as a low-pass filter, a high-pass filter, a bandpass filter or various combinations of these.

In some embodiments binder 5820 may further include other materials to enhance one or more aspects of the performance of device 5800. For example in one embodiment binder 5820 may include materials to absorb one or more wavelengths of light, to act as a filter. In one embodiment binder 5820 includes a wavelength-conversion material, similar to that described above. In one embodiment this may be used to shift an incident wavelength to a different wavelength to be detected by LAE 5810. For example a phosphor may be added to binder 5820 to shift one or more wavelengths of incident light (e.g., blue light) to one or more different wavelengths (e.g., yellow light) that impinge on LAE 5810. In this way one or a small number of LAEs 5810 may be used in combination with a number of wavelength-conversion materials to produce a family of detectors spanning a wide wavelength range, without the need to have a relatively large number of different LAEs 5810.

Figure 58B:
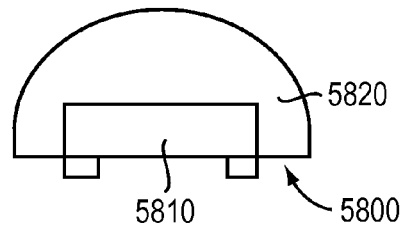
Figure 58C:
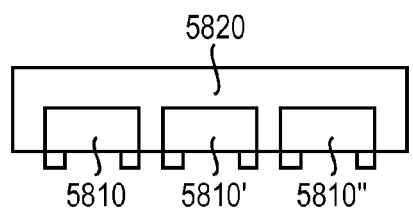

As discussed herein with respect to white dies, binder 5820 may be shaped. In some embodiments binder 5820 is shaped to increase the collection of light by LAE 5810. FIG. 58B shows an example of device 5800 having shaped binder 5820 having a dome-like shape. In some embodiments shaped binder 5820 is combined with one or more additives to binder 5820, for example a wavelength-conversion material.

In some embodiments device 5800 may include more than one LAE 5810. In one embodiment device 5800 includes three LAEs 5810, identified as LAEs 5810, 5810', and 5810" in FIG. 58C. In one embodiment LAE 5810 detects red wavelengths, LAE 5810' detects green wavelengths, and LAE 5810" detects blue wavelengths, and the combination may be used as a color sensor by evaluating the relative output signals from the three different LAEs.

In some embodiments LAE 5810 is a photovoltaic device or solar cell, and is designed to produce power from incident radiation (typically, but not necessarily, in the visible range). Such a photovoltaic device may be made of a wide variety of materials. In some embodiments LAE 5810 may include GaAs, InAs, AlAs, GaN, InN, AlN, GaP, InP, AlP, InGaP, InAlP, InGaAlP, ZnO, II-VI materials or the like or various combinations of two or more of these materials. The material from which LAE 5810 is made is not a limitation of the present invention. In some embodiments LAE 5810 is a single-junction solar cell, while in other embodiments LAE 5810 is a multi-junction solar cell. As discussed herein with respect to light-emitting elements and detectors, photovoltaic devices produced using embodiments of the present invention may include in various embodiments a transparent binder, additives to the binder, wavelength-conversion materials, shaped binder, optics, multiple LAEs 5810 per device, and the like.

Figure 59A:
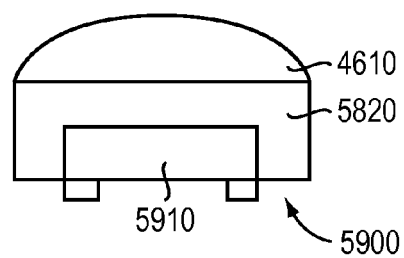
FIGS. 59A and 59B are cross-sectional schematics of photovoltaic devices in accordance with various embodiments of the invention.
Figure 59B:
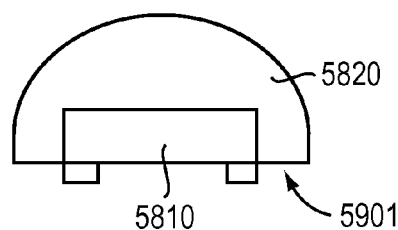

In some embodiments a photovoltaic device made using this invention may additionally include one or more optics to increase collection or to act as concentrators, for example as shown in FIG. 59A. FIG. 59A shows a device 5900 that includes a solar cell 5910, a binder 5820, and an optic 4610. In one embodiment the optical function for collection or concentration is carried out using a shaped binder 5820, as shown in FIG. 59B for device 5901.

In some embodiments binder 5820 may further include other materials to enhance one or more aspects of the performance of devices 5900, 5901. For example in one embodiment binder 5820 may include materials to absorb one or more wavelengths of light, to act as a filter. In one embodiment binder 5820 includes a wavelength-conversion material, similar to that described above with respect to white dies. In one embodiment this may be used to shift an incident wavelength to a different wavelength to be absorbed by solar cell 5910. For example a phosphor may be added to binder 5820 to shift one or more wavelengths of incident light to one or more different wavelengths of light that impinge on solar cell 5910. In this way a larger portion of the solar spectrum may be usefully absorbed by solar cell 5910. In some embodiments this may permit the use of a lower cost solar cell 5910, for example one with fewer junctions. In one embodiment more than one different solar cell, each absorbing light in a different wavelength range, may be incorporated into one packaged device, similar to the structure shown in FIG. 58C.

Embodiments of the present invention may be applied to devices that neither emit nor detect light, identified as electronic-only devices, where the purpose of application of this invention is, in some embodiments, reduction in cost. In various embodiments, a relatively large number of electronic devices, specifically chips or discrete devices or integrated circuits may be packaged in a polymer-based material (like the binder detailed above) using a high-volume, low-cost, base process. In some embodiments of this approach, binder 5820 need not be transparent but may be translucent or opaque. As discussed herein with respect to light-emitting elements, detectors, and photovoltaic devices, electronic-only devices produced in accordance with embodiments of the present invention may include additives to the binder, shaped binder, multiple devices, and the like.

Figure 60A:
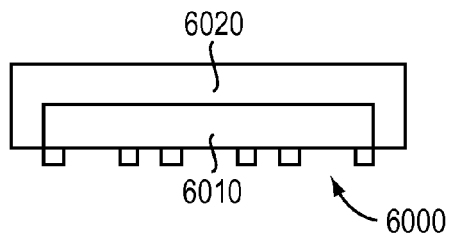
FIGS. 60A-60E are cross-sectional schematics of electronic devices in accordance with various embodiments of the invention.

In one embodiment an electronic-only device of the present invention is a packaged electronic only device, such as that shown in FIG. 60A, in which device 6000 includes electronic-only device 6010 and binder 6020. In some embodiments electronic only device 6010 may have a larger number of contacts than would a light emitter or a detector. For example electronic-only device 6010 may include more than ten contacts or more than 100 contacts or even larger number of contacts.

Figure 60B:
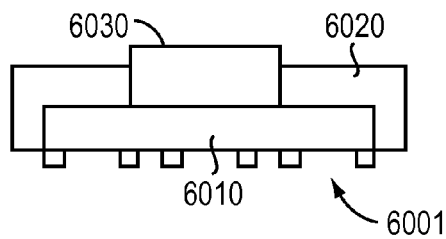
Figures 60C, 60D:
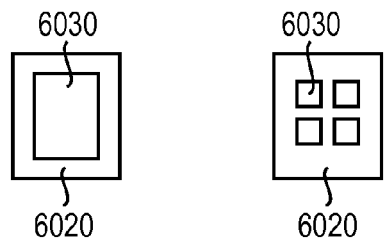

FIG. 60B shows another example, device 6001, incorporating a heat spreader 6030. A heat spreader, as utilized herein, is a volume of material with a relatively high thermal conductivity, in particular higher than that of binder 6020, which may be used to transfer heat from electronic-only device 6010 to ambient or to an additional thermal-management system. In some embodiments heat spreader 6030 is a metal, for example Al, Cu, Au, Ag, Cr, or the like. In some embodiments heat spreader 6030 is a ceramic, for example AlN, SiC, polycrystalline SiC, polycrystalline AlN, or the like. In some embodiments heat spreader 6030 is a monolithic component, but this is not a limitation of the present invention, and in other embodiments heat spreader 6030 may comprise multiple discrete and separate portions, as shown in FIGS. 60C and 60D respectively. While heat spreader 6030 is shown as a square or rectangle in FIGS. 60C and 60D, this is not a limitation of the present invention, and in other embodiments heat spreader 6030 may have any shape or size. In one embodiment heat spreader 6030 is a heat pipe.

Figure 60E:
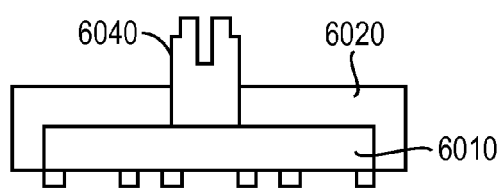

In another embodiment a connector may be added to a device, for example an electronic-only device. In one embodiment a connector 6040 is added on top of electronic-only device 6010 and held in place at least in part by the presence of binder 6020, as shown in FIG. 60E.

Figure 61:
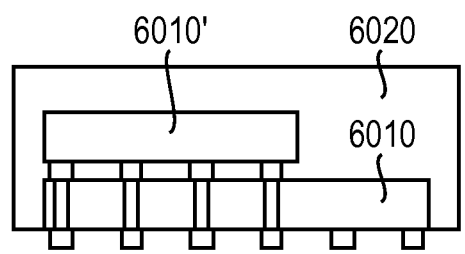
FIGS. 61 and 62 are cross-sectional schematics of packaged systems incorporating multiple devices in accordance with various embodiments of the invention.

In another embodiment one or more devices may be stacked on top of each other, as shown in FIG. 61. FIG. 61 shows electronic-only device 6010' formed over electronic-only device 6010. FIG. 61 also shows optional vias 6100 through electronic-only device 6010, permitting electrical coupling between electronic-only devices 6010' and 6010. Other methods may be used to electrically couple devices, for example wire bonding, solder, conductive adhesives, etc. While FIG. 61 shows electronic-only device 6010 and 6010' having different sizes, this is not a limitation of the present invention and in other embodiments electronic-only device 6010 and electronic-only device 6010' may have the same or substantially the same size.

Figure 62:
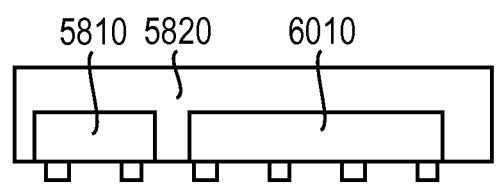

In another embodiment electronic-only and other (for example light-detecting and/or light-emitting) devices may be packaged in the same binder, as shown in FIG. 62. FIG. 62 shows electronic-only device 6010 adjacent to light-detection device 5810. This approach may be used to provide some additional capability, for example signal conditioning, communications, memory or the like. In one embodiment electronic-only device 6010 and light-detection device 5810 communicate through each of their respective contacts by way of connections on the circuit board to which they are ultimately mounted. In one embodiment internal connection is used, for example similar to vias 6100 shown in FIG. 61 or wire bonds, etc.

Figure 63A:
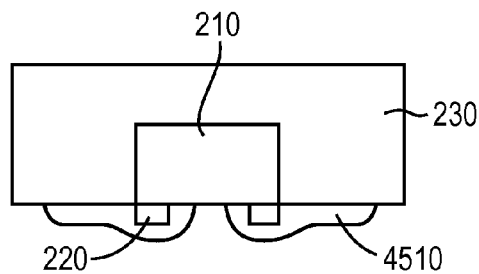
FIG. 63A is a cross-sectional schematic of a white die in accordance with various embodiments of the invention.
Figure 63B:
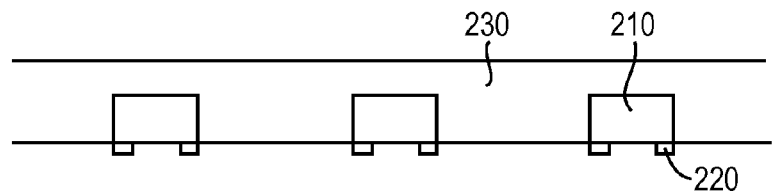
FIG. 63B-63E are cross-sectional schematics of a process for fabricating white dies in accordance with embodiments of the invention.
Figure 63C:
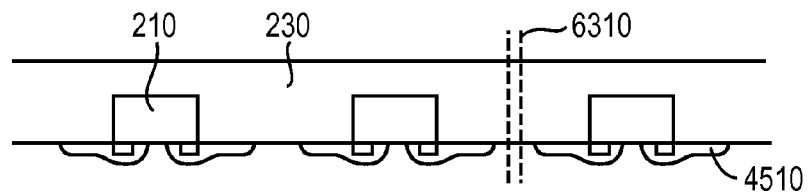

In some embodiments, all or portions of contacts 220 may be covered by a reflecting layer 4510, as shown in FIG. 63A. In such embodiments, it is preferable that reflecting layer 4510 is conductive, such that current may flow from contacts 220 through reflecting layer 4510 to, for example, an underlying conductive trace or substrate. Examples of conductive reflecting materials may include, for example, Cr, Al, Au, Ag, Cu, Ti or the like, conductive inks such as silver ink, carbon ink, copper ink, or the like. FIG. 63A shows an example of a white die in which contacts 220 are covered by reflecting layer 4510. While the structure of FIG. 63A shows contacts 220 being completely covered by reflecting layer 4510 this is not a limitation of the present invention, and in other embodiments only a portion of contacts 220 may be covered by reflecting layer 4510. FIG. 63B shows one embodiment of the structure of FIG. 63A at an early stage of manufacture. FIG. 63B shows a white wafer including or consisting essentially of LEEs 210 and phosphor 230. FIG. 63C shows the structure of FIG. 63B at a later stage of manufacture, where reflecting layer 4510 has been formed over portions of phosphor 230 and LEEs 210 such that contacts 220 of LEEs 210 are covered by reflecting layer 4510. In some embodiments, reflecting layer 4510 may be formed over the entire surface of the white wafer containing contacts 220, and subsequently removing portions of reflecting layer 4510 to produce the structure of FIG. 63C. For example, reflecting layer 4510 may be formed by physical vapor deposition, chemical vapor deposition, evaporation, sputtering, plating, lamination, spraying, printing, screen printing, or the like. This layer may then be patterned, for example by lithography, and portions removed, for example by etching, wet chemical etching, dry etching, RIE, ablation or the like. In another embodiment, reflecting layer may be deposited selectively. For example, reflecting layer 4510 may be deposited through a physical or shadow mask using evaporation, sputtering or the like, or may be deposited using a selective deposition process that results in reflecting layer 4510 only forming in specific regions, or may be accomplished by lamination or formation of a patterned film or foil of reflecting layer 4510 on phosphor 230.

Figure 63D:
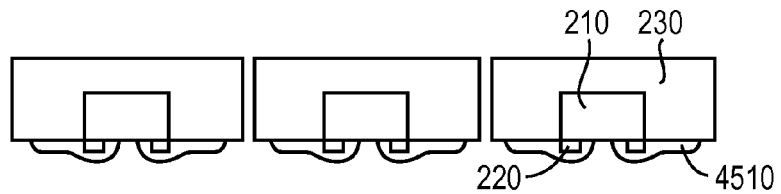

In the example shown in FIG. 63C, reflecting layer 4510 is not formed in the street or singulation region, identified as 6310; however, this is not a limitation of the present invention, and in other embodiments reflecting layer 4510 may be formed in street or singulation region 6310. In some embodiments, it may be advantageous to not form reflecting layer 4510 in the street or singulation region, as this may simplify the singulation process. As may be seen in FIG. 63C, the portions of reflecting layer 4510 that are coupled to each contact 220 are not electrically coupled to each other, to avoid shorting LEE 210. FIG. 63D shows the structure of FIG. 63C at a later stage of manufacture, after singulation, resulting in the structure of FIG. 63A.

Figure 63E:
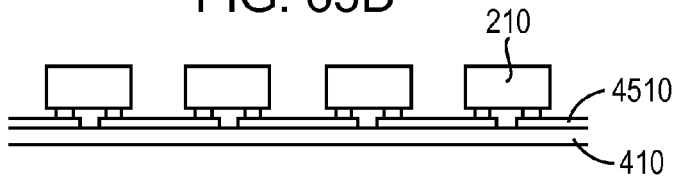
Figure 63F:
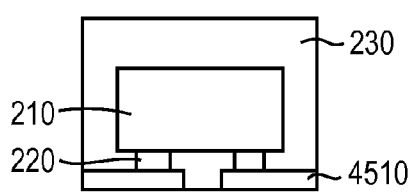
FIGS. 63F and 63G are cross-sectional schematics of white dies in accordance with various embodiments of the invention.
Figure 63G:
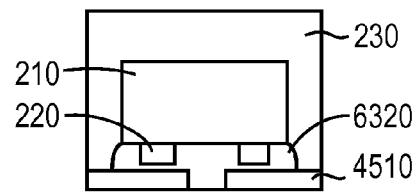

In some embodiments, a patterned conductive film or foil of reflecting material 4510 may be formed on mold substrate 410 or another base, in a fashion similar to that shown in FIG. 45A, but where the conductive foil is under all or a portion of contacts 220, as shown in FIG. 63E such that current flows to LEE 210 through conductive foil 4510 and contacts 220. Portions of conductive foil may be electrically coupled to contacts 220, for example using solder, low temperature solder, conductive epoxy, ACA, ACF, physical mating or the like. FIG. 63F shows an example of the structure of FIG. 63E at a later stage of manufacture, after formation of phosphor 230 and singulation. FIG. 63G shows an example of an embodiment where contacts 220 are electrically coupled to conductive foil 4510 using ACA or ACF 6320. In some embodiments, the conductive film may include or consist essentially of aluminum, gold, silver, titanium, copper, or the like. In one embodiment, conductive film 4510 includes or consists essentially of aluminum or copper and has a thickness in the range of about 1 µm to about 250 µm, or more preferably in the range of about 5 µm to about 40 µm.

In some embodiments, reflective layer 4510 may be a specular reflector while in other embodiments it may be a diffuse reflector. In some embodiments, reflective layer 4510 may include or consist essentially of a conductive ink, for example a white conductive ink.

In another embodiment, the use of materials similar to those described herein with respect to reflecting materials may be used for other purposes, for example to modify other characteristics such as adhesion of cured phosphor 230 to mold substrate 410 or cured phosphor 230 to underlying conductive traces, using, e.g., ACA as shown in FIG. 27. In some embodiments, modification of other properties may be combined with reflectivity; however, this is not a limitation of the present invention, and in other embodiments it may be a material that is not substantially reflective. For example, a material formed on mold substrate 410 before formation of uncured phosphor 420 (FIG. 4B) may result in a layer at or near the phosphor/mold substrate interface that reduces the adhesion of cured phosphor 230 to mold substrate 410. In some embodiments, this may be a reflective material; however, this is not a limitation of the present invention, and in other embodiments it may be a material that is not substantially reflective. In some embodiments, this may be a powder, as discussed herein, while in other embodiments this may be a film. In some embodiments, this may act like a mold release material or film, discussed herein, except that in some embodiments the material is incorporated into phosphor cured phosphor.

In some embodiments, reflective layer 4510 may include or consist of more than one material or layer, where each layer serves a different purpose. For example, in one embodiment, reflective layer 4510 may include or consist essentially of a first reflective layer adjacent to white die 200, and a second adhesion layer, adjacent to the first reflective layer, to provide improved adhesion of the reflective layer to the underlying substrate or contacts.

As discussed herein, in some embodiments all or a portion of the surface of phosphor 230 may be roughened or textured, for example to reduce TIR and increase the light output or to increase adhesion between phosphor 230 and an adjacent material, for example to increase adhesion to ACA 6320 or ACA 2740. In some embodiments, roughening or texturing may take place during the molding process. In some embodiments, all or a portion of the mold substrate surface in contact with phosphor 420 may be roughened or textured to impart such roughened or textured features to cured phosphor 230. In some embodiments, such roughening or texturing may be accomplished after molding, for example by ablation, laser ablation, etching or chemical ablation, imprinting, indenting or the like. The method of roughening or texturing is not a limitation of the present invention.

In one embodiment, the textured features may have a size in the range of about 0.1 µm to about 50 µm and more preferably in the range of about 0.5 µm to about 25 µm. In one embodiment, the texture may be hemispherical or pyramidal in shape; however, this is not a limitation of the present invention, and in other embodiments the texture may have any shape. In one embodiment, the texture includes or consists essentially of a regular or substantially regular pattern, while in other embodiments the texture includes or consists essentially of random or substantially random features. In some embodiments, the scale of the texture is advantageously less than about 10% of the height of LEE 210, or less than 5% of the height of LEE 210 or less than 2% of the height of LEE 210, in order to reduce occlusion or absorption of light emitted by LEE 210.

FIGS. 64A and 64B show two examples of embodiments incorporating textured phosphor. In FIG. 64A, the texture identified as 6410 has a regular periodic structure, while texture 6410 in the embodiment shown in FIG. 64B has an irregular or substantially random structure. The structure of FIG. 64B also includes reflective layer 4510. While FIG. 64B shows the side of reflective layer 4510 opposite phosphor 230 as flat, this is not a limitation of the present invention, and in other embodiments the side of reflective layer 4510 opposite phosphor 230 may not be flat, or reflective layer 4510 may be textured by conforming or substantially conforming to the textured surface of phosphor 230. For example, FIG. 64C shows an embodiment including or consisting essentially of reflective layer 4510 with a textured exterior surface, while FIG. 64D shows an embodiment including or consisting essentially of reflective layer 4510 with a textured surface adjacent phosphor 230 and a textured exterior surface. In some embodiments, all of the individual features making up the texture have the same or substantially the same shape, while in other embodiments the individual features making up the texture have different shapes. While the structures shown in FIGS. 64A and 64B show all or substantially all of the face of phosphor 230 containing contacts 220 as being textured, this is not a limitation of the present invention, and in other embodiments only a portion of the surface or face of phosphor 230 may be textured.

In the case of the embodiment shown in FIG. 64A, the texture may be formed using a mold having a regular periodic structure formed in the mold that is then transferred to the phosphor. In some embodiments, each individual feature may have substantially the same shape, but the features do not form a periodic array. In some embodiments, such a structure may be formed by molding using a mold having those characteristics, or by formation of particles or beads on mold substrate 410, where each particle or bead has substantially the same shape, but the positions of the beads do not form a regular periodic array, and molding over the beads.

In the case of the embodiment shown in FIG. 64B, the texture may be formed using a mold having an irregular or substantially random structure of different shapes formed in the mold that is then transferred to the phosphor. In some embodiments, such a structure may be formed by formation of particles or beads on mold substrate 410, where each particle or bead does not have the same shape, for example a powder, flake or fleck and where the position of the particles does not form a regular periodic array.

In some embodiments, a texture may be imparted to cured or partially cured phosphor by indentation or impression of a textured plate onto the phosphor.

In some embodiments, a material may be formed on mold substrate 410 before or as part of the formation of uncured phosphor 420 and after curing of the phosphor all or portions of this material may be removed, leaving voids, pits or indentations in portions of cured phosphor 230. FIGS. 65A-65C show an example of one embodiment of a process to produce texture by removal of material after curing of the phosphor. FIG. 65A shows mold substrate 410 over which has been formed LEEs 210 and particles 6510. FIG. 65B shows the structure of FIG. 65A at a later stage of manufacture. In FIG. 65B, uncured phosphor 420 has been formed over mold substrate 410, LEEs 210 and particles 6510 and cured and mold substrate 410 has been removed, leaving a structure in which particles 6510 are embedded or partially embedded in phosphor 230. FIG. 65C shows the structure of FIG. 65B at a later stage of manufacture. In FIG. 65C, all or some of particles 6510 have been removed from cured phosphor 230, leaving texture 6410. In some embodiments, particles 6510 may be removed by etching or dissolving in a solution that does not or that does not substantially affect phosphor 230 and LEE 210. For example, in one embodiment particles 6510 may include or consist essentially of one or more water-soluble materials such as polyvinyl alcohol (PVA), ammonium chloride, sodium chloride, flour, corn starch, sucrose, or the like. In one embodiment, particles 6510 may include or consist essentially of one or more alcohol-soluble materials such as sodium chloride, ammonium chloride, camphor, castor oil, lithium chloride, lithium iodide, or the like. In one embodiment, particles 6510 may include or consist essentially of a metal and be removed by etching in a suitable wet or dry etchant. For example, in one embodiment particles 6510 may include or consist essentially of aluminum and may be removed by etching in hydrochloric acid. The composition of particles 6510 and the technique for removing them from phosphor 230 are not limitations of the present invention.

In some embodiments, phosphor 230 may be textured by etching or removal of portions of the phosphor. In one embodiment, phosphor 230 may be free etched, that is treated without a mask, while in other embodiments a mask may be used as part of the texturing process. Silicone material may be etched using a variety of techniques, for example using dimethylacetamide-based chemicals or other organic solvents, for example Dynasolve manufactured by Dynaloy. In some embodiments, the phosphor may be masked prior to etching, to promote formation of a particular scale of texture. As discussed herein, such texture may be regular or irregular. Formation of texture may be accomplished, for example by patterning and etching, for example using lithography combined with a mask. Mask materials may include photoresist, metals or other suitable materials. In some embodiments, formation may be accomplished by etching through a physical mask or stencil. In some embodiments, a mask may be formed by agglomeration, for example by formation of a relatively thin layer of metal on the phosphor, for example gold, and then heating to induce coalescence in the metal to form a relatively random mask that may then be used for texture formation.

As discussed herein, in some embodiments white dies may include a portion of the phosphor having a texture, or a portion of the phosphor covered or overlaid with a reflecting layer, or both. In some embodiments, the reflecting layer itself may be textured, while in other embodiments the texture is separate from the reflecting layer.

While the discussion herein mainly focuses on down-conversion, that is the use of a wavelength-conversion material or phosphor to shift a short wavelength to a longer wavelength, that is not a limitation of the present invention and in other embodiments up-conversion or a combination of up-conversion and down-conversion may be used.

Other embodiments of this invention may have additional or fewer steps or components or may be modified or carried out in a different order. In general in the above discussion the arrays of light emitters, wells, optics and the like have been shown as square or rectangular arrays; however, this is not a limitation of the present invention and in other embodiments these elements are formed in other types of arrays, for example hexagonal, triangular or any arbitrary array. In some embodiments, these elements are grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An electronic device comprising:
a solid shaped volume of a polymeric binder;
suspended within the polymeric binder, a semiconductor die having a first face, a second face opposite the first face, and at least one sidewall spanning the first and second faces, the semiconductor die being a bare-die light-emitting element comprising a plurality of active semiconductor layers that cooperatively emit light;
a reflecting layer disposed between the polymeric binder and the semiconductor die; and
disposed over the first face of the semiconductor die, at least two spaced-apart contacts each (i) having a free terminal end not covered by the polymeric binder, (ii) being available for electrical connection, and (iii) contacting a different active semiconductor layer of the semiconductor die,
wherein (i) at least a portion of the polymeric binder is transparent to a wavelength of light emitted by the light-emitting element and (ii) the reflecting layer has a reflectivity of at least 50% to a wavelength of light emitted by the light-emitting element within the polymeric binder.

2. The electronic device of claim 1, wherein the reflecting layer is disposed over a surface of the semiconductor die.

3. The electronic device of claim 1, wherein the reflecting layer is disposed over at least a portion of the first face of the semiconductor die.

4. The electronic device of claim 3, wherein the reflecting layer is disposed over at least a portion of at least one of the spaced-apart contacts.

5. The electronic device of claim 1, wherein the reflecting layer is at least a portion of at least one of the two spaced-apart contacts.

6. The electronic device of claim 1, wherein (i) the reflecting layer comprises first and second electrically insulated portions, (ii) the first portion of the reflecting layer comprises at least a portion of a first one of the at least two contacts, and (iii) the second portion of the reflecting layer comprises at least a portion of a second one of the at least two contacts.

7. The electronic device of claim 1, wherein at least a portion of the reflecting layer is electrically conductive.

8. The electronic device of claim 7, wherein the reflecting layer is disposed over a portion of at least one of the spaced-apart contacts.

9. The electronic device of claim 8, wherein (i) the reflecting layer comprises first and second electrically insulated portions, (ii) the first portion of the reflecting layer is disposed over at least a portion of a first one of the at least two contacts, and (iii) the second portion of the reflecting layer is disposed over at least a portion of the second one of the at least two contacts.

10. The electronic device of claim 1, wherein (i) the reflecting layer comprises first and second electrically insulated portions, (ii) the first portion of the reflecting layer is disposed over at least a portion of a first one of the at least two contacts, and (iii) the second portion of the reflecting layer is disposed over at least a portion of the second one of the at least two contacts.

11. The electronic device of claim 1, further comprising:
a second reflecting layer (i) having a reflectivity of at least 50% to light emitted by the light-emitting element, (ii) disposed over a portion of the polymeric binder, and (iii) disposed over and electrically coupled to a first one of the at least two contacts; and
a third reflecting layer (i) having a reflectivity of at least 50% to light emitted by the light-emitting element, (ii) disposed over a portion of the polymeric binder, (iii) disposed over and electrically coupled to a second one of the at least two contacts, and (iv) electrically insulated from the second reflecting layer.

12. The electronic device of claim 1, further comprising:
a first electrically conductive layer (i) having a reflectivity of at least 50% to light emitted by the light-emitting element, (ii) disposed over a portion of the polymeric binder, and (iii) disposed over and electrically coupled to a first one of the at least two contacts; and
a second electrically conductive layer (i) having a reflectivity of at least 50% to light emitted by the light-emitting element, (ii) disposed over a portion of the polymeric binder, (iii) disposed over and electrically coupled to a second one of the at least two contacts, and (iv) electrically insulated from the second reflecting layer.

13. The electronic device of claim 1, further comprising a second reflecting layer, wherein the second reflecting layer is disposed on a surface of the polymeric binder or disposed within at least a portion of the polymeric binder proximate the semiconductor die.

14. The electronic device of claim 13, wherein the polymeric binder contains therein a wavelength-conversion material for absorption of at least a portion of light emitted from the semiconductor die and emission of converted light having a different wavelength, converted light and unconverted light emitted by the light-emitting element combining to form mixed light.

15. The electronic device of claim 14, wherein the second reflecting layer has a reflectivity of at least 50% to light emitted by at least one of the light-emitting element or the wavelength-conversion material.

16. The electronic device of claim 1, wherein the polymeric binder contains therein a wavelength-conversion material for absorption of at least a portion of light emitted from the semiconductor die and emission of converted light having a different wavelength, converted light and unconverted light emitted by the light-emitting element combining to form mixed light.

17. The electronic device of claim 16, wherein the reflecting layer has a reflectivity of at least 50% to a wavelength of light emitted by the wavelength-conversion material.

18. The electronic device of claim 16, comprising
   a second reflecting layer (i) having a reflectivity of at least 50% to light emitted by at least one of the light-emitting element or the wavelength-conversion material, (ii) disposed over a portion of the polymeric binder, and (iii) disposed over and electrically coupled to a first one of the at least two contacts; and
   a third reflecting layer (i) having a reflectivity of at least 50% to light emitted by at least one of the light-emitting element or the wavelength-conversion material, (ii) disposed over a portion of the polymeric binder, (iii) disposed over and electrically coupled to a second one of the at least two contacts, and (iv) electrically insulated from the second reflecting layer.

19. The electronic device of claim 16, wherein the wavelength-conversion material comprises at least one of a phosphor or quantum dots.

20. The electronic device of claim 16, wherein the mixed light is substantially white light.

21. The electronic device of claim 20, wherein the substantially white light has a correlated color temperature in the range of 2000 K to 10,000 K.

22. The electronic device of claim 16, further comprising an optical element positioned to receive at least a portion of the mixed light.

23. The electronic device of claim 22, wherein the optical element is configured to distribute the mixed light in a specific light distribution pattern.

24. The electronic device of claim 22, wherein the optical element comprises at least one of a reflector, a refractive optic, a diffractive optic, a total internal reflection optic, or a Fresnel optic.

25. The electronic device of claim 1, further comprising an optical element positioned to receive at least a portion of light from the semiconductor die.

26. The electronic device of claim 1, wherein the active semiconductor layers of the semiconductor die are not disposed on a semiconductor substrate.

27. The electronic device of claim 1, wherein at least a portion of the reflecting layer is substantially parallel to the first face of the semiconductor die.

28. The electronic device of claim 1, wherein the reflecting layer has a reflectivity of at least 75% to a wavelength of light emitted by the light-emitting element.

29. The electronic device of claim 1, wherein at least portions of the contacts protrude from the polymeric binder.

30. The electronic device of claim 1, wherein the polymeric binder and the semiconductor die collectively define an approximately rectangular solid having approximately 90° corners between adjacent faces thereof.

31. The electronic device of claim 1, wherein the polymeric binder comprises at least one of silicone or epoxy.

32. The electronic device of claim 1, further comprising one or more additional semiconductor dies suspended within the polymeric binder.

33. The electronic device of claim 1, wherein the light-emitting element comprises a semiconductor material comprising at least one of GaAs, AlAs, InAs, GaP, AlP, InP, ZnO, CdSe, CdTe, ZnTe, GaN, AlN, InN, silicon, or an alloy or mixture thereof.

34. The electronic device of claim 1, wherein the polymeric binder has a thickness between 5 μm and 4000 μm.

35. The electronic device of claim 1, wherein the polymeric binder coats the second face of the semiconductor die, the at least one sidewall, and at least a portion of the first face of the semiconductor die.

36. The electronic device of claim 1, wherein the light-emitting element comprises a light-emitting diode.

37. The electronic device of claim 1, wherein the first face of the semiconductor die comprises at least two non-coplanar portions each having at least one said contact thereon.

38. The electronic device of claim 1, wherein at least a portion of a top surface of the polymeric binder is curved.

39. The electronic device of claim 1, further comprising, at least partially suspended within the polymeric binder, at least one additional semiconductor die having a first face, a second face opposite the first face, and at least one sidewall spanning the first and second faces, each additional semiconductor die being a bare-die light-emitting element comprising a plurality of active semiconductor layers that cooperatively emit light.

40. The electronic device of claim 16, wherein the polymeric binder comprises a plurality of discrete regions, at least one of which comprises the polymeric binder without wavelength-conversion material therein.

41. The electronic device of claim 18, wherein the reflecting layer has a reflectivity of at least 75% to a wavelength of light emitted by at least one of the light-emitting element or the wavelength-conversion material.

42. The electronic device of claim 18, wherein the reflecting layer is a substantially diffuse reflector.

43. The electronic device of claim 18, wherein the reflecting layer is a substantially specular reflector.

* * * * *